(12) United States Patent
Lee et al.

(10) Patent No.: US 12,648,145 B2
(45) Date of Patent: Jun. 2, 2026

(54) SEMICONDUCTOR DEVICES

(71) Applicant: Samsung Electronics Co., Ltd., Suwon-si (KR)

(72) Inventors: Kyunghwan Lee, Suwon-si (KR); Yongseok Kim, Suwon-si (KR); Jeon Il Lee, Suwon-Si (KR); Daewon Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 459 days.

(21) Appl. No.: 18/243,726

(22) Filed: Sep. 8, 2023

(65) Prior Publication Data

US 2024/0244847 A1 Jul. 18, 2024

(30) Foreign Application Priority Data

Jan. 16, 2023 (KR) ........................ 10-2023-0006369

(51) Int. Cl.
| | |
|---|---|
| *H10B 51/20* | (2023.01) |
| *H10B 51/10* | (2023.01) |
| *H10D 30/69* | (2025.01) |
| *H10D 64/01* | (2025.01) |
| *H10D 64/68* | (2025.01) |
| *H10W 20/41* | (2026.01) |

(52) U.S. Cl.
CPC ............. *H10B 51/20* (2023.02); *H10B 51/10* (2023.02); *H10D 30/701* (2025.01); *H10D 64/033* (2025.01); *H10D 64/689* (2025.01); *H10W 20/435* (2026.01)

(58) Field of Classification Search
CPC ........ H10B 51/20; H10B 51/10; H10B 51/30; H10B 51/50; H10D 30/701; H10D 64/033; H10D 64/689; H10W 20/435
See application file for complete search history.

(56) References Cited

U.S. PATENT DOCUMENTS

| | | | |
|---|---|---|---|
| 9,281,044 B2 | 3/2016 | Ramaswamy et al. | |
| 10,777,578 B2 | 9/2020 | Liu | |
| 10,825,834 B1 | 11/2020 | Chen | |
| 11,469,251 B2 * | 10/2022 | Zhang | ..................... H10B 51/30 |
| 2017/0338238 A1 * | 11/2017 | Zhang | ..................... H10B 43/50 |
| 2021/0375934 A1 | 12/2021 | Lu et al. | |
| 2021/0384221 A1 | 12/2021 | Song et al. | |
| 2021/0398568 A1 | 12/2021 | Lin et al. | |
| 2021/0399013 A1 * | 12/2021 | Wu | ......................... H10B 51/10 |
| 2023/0011675 A1 * | 1/2023 | Lee | ......................... H10B 51/10 |

* cited by examiner

*Primary Examiner* — Mamadou L Diallo
(74) *Attorney, Agent, or Firm* — Muir Patent Law, PLLC

(57) ABSTRACT

A semiconductor device may include first stacks and second stacks, which are alternately disposed on a substrate in a first direction parallel to a top surface of the substrate, and first pads and second pads connecting the first stacks to the second stacks. Each of the first and second stacks may include a gate electrode, channel patterns, which enclose a side surface of the gate electrode and are spaced apart from each other, and first and second conductive lines connected to a corresponding channel pattern. The first and second conductive lines of the second stack may be disposed to be adjacent to the first and second conductive lines, respectively, of the first stack. The first and second pads may be connected to the first and second conductive lines, respectively, of the first and second stacks.

20 Claims, 45 Drawing Sheets

FIG. 37

SEMICONDUCTOR DEVICES

CROSS-REFERENCE TO RELATED APPLICATIONS

This U.S. non-provisional patent application claims priority under 35 U.S.C. § 119 to Korean Patent Application No. 10-2023-0006369, filed on Jan. 16, 2023, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor memory device including a ferroelectric field effect transistor and a method of fabricating the same.

Semiconductor memory devices are generally classified into volatile memory devices and nonvolatile memory devices. The volatile memory devices lose their stored data when their power supplies are interrupted, and for example, include a dynamic random access memory (DRAM) device and a static random access memory (SRAM) device. The nonvolatile memory devices maintain their stored data even when their power supplies are interrupted and, for example, include a programmable read only memory (PROM), an erasable PROM (EPROM), an electrically EPROM (EE-PROM), and a flash memory device. In addition, to meet an increasing demand for a semiconductor memory device with high performance and low power consumption, next-generation nonvolatile semiconductor memory devices, such as magnetic random access memory (MRAM), phase-change random access memory (PRAM), and ferroelectric random access memory (FeRAM) devices, are being developed. As there is a demand for semiconductor devices with high integration density and high performance, various research efforts are being conducted to develop semiconductor devices with different properties.

SUMMARY

An embodiment of the inventive concept provides a highly-integrated semiconductor device and a method of fabricating the same.

An embodiment of the inventive concept provides a semiconductor device with improved operational and reliability characteristics and a method of fabricating the same.

According to an embodiment of the inventive concept, a semiconductor device may include first stacks and second stacks, which are alternately disposed on a substrate in a first direction parallel to a top surface of the substrate, and first pads and second pads connecting the first stacks to the second stacks. Each of the first and second stacks may include a gate electrode extended in a second direction perpendicular to the top surface of the substrate, channel patterns provided to enclose a side surface of the gate electrode and spaced apart from each other in the second direction, and a first conductive line and a second conductive line connected to a corresponding one of the channel patterns. The first conductive line of each of the second stacks may be disposed to be adjacent to the first conductive line of each of the first stacks, and the second conductive line of each of the second stacks may be disposed to be adjacent to the second conductive line of each of the first stacks. Each of the first pads may be connected to the first conductive line of each of the first stacks and the first conductive line of each of the second stacks, and each of the second pads may be connected to the second conductive line of each of the first stacks and the second conductive line of each of the second stacks.

According to an embodiment of the inventive concept, a semiconductor device may include a substrate including a cell array region and a pad region, which are adjacent to each other in a first direction parallel to a top surface of the substrate, cell arrays provided on the cell array region of the substrate and spaced apart from each other in a second direction, which is parallel to a top surface of the substrate and is non-parallel to the first direction, and first pads provided on the pad region of the substrate and spaced apart from each other in a third direction perpendicular to the top surface of the substrate. Each of the cell arrays may include a gate electrode extended in the third direction, channel patterns, which are provided to enclose a side surface of the gate electrode and are spaced apart from each other in the third direction, and first conductive lines, which are connected to the channel patterns, respectively, and are spaced apart from each other in the third direction. The first conductive lines may extend to the pad region in the first direction and may be connected to the first pads, respectively. The first pads may be connected in common to the first conductive lines of one of the cell arrays and the first conductive lines of another one of the cell arrays.

According to an embodiment of the inventive concept, a semiconductor device may include first stacks and second stacks alternately disposed on a substrate in a first direction parallel to a top surface of the substrate, pads including first pads and second pads connecting the first stacks to the second stacks, gate lines on the first and second stacks, and a cell insulating pattern between the first pads and the second pads. Each of the first and second stacks may include a gate electrode extended in a second direction perpendicular to the top surface of the substrate, channel patterns provided to enclose a side surface of the gate electrode and spaced apart from each other in the second direction, a ferroelectric pattern between each of the channel patterns and the gate electrode, a gate insulating pattern between each of the channel patterns and the ferroelectric pattern, a first conductive line and a second conductive line connected to a corresponding one of the channel patterns and spaced apart from each other with the corresponding channel pattern interposed therebetween, and a first insulating pattern, which is interposed between the channel patterns to enclose the side surface of the gate electrode. The first conductive line of each of the second stacks may be disposed to be adjacent to the first conductive line of each of the first stacks. Each of the first pads may be connected to the first conductive line of each of the first stacks and the first conductive line of each of the second stacks, and each of the second pads may be connected to the second conductive line of each of the first stacks and the second conductive line of each of the second stacks. The cell insulating pattern may be in contact with a side surface of a corresponding one of the first and second stacks and may extend in the first direction. The gate electrode may be overlapped with at least two of third conductive lines, when viewed in a plan view.

BRIEF DESCRIPTION OF THE DRAWINGS

FIG. 37 is a plan view illustrating a semiconductor device according to an example embodiment of the inventive concept.

DETAILED DESCRIPTION

Example embodiments of the inventive concepts will now be described more fully with reference to the accompanying drawings, in which example embodiments are shown. Like numbers refer to like elements throughout the specification and drawings.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Figure 1:
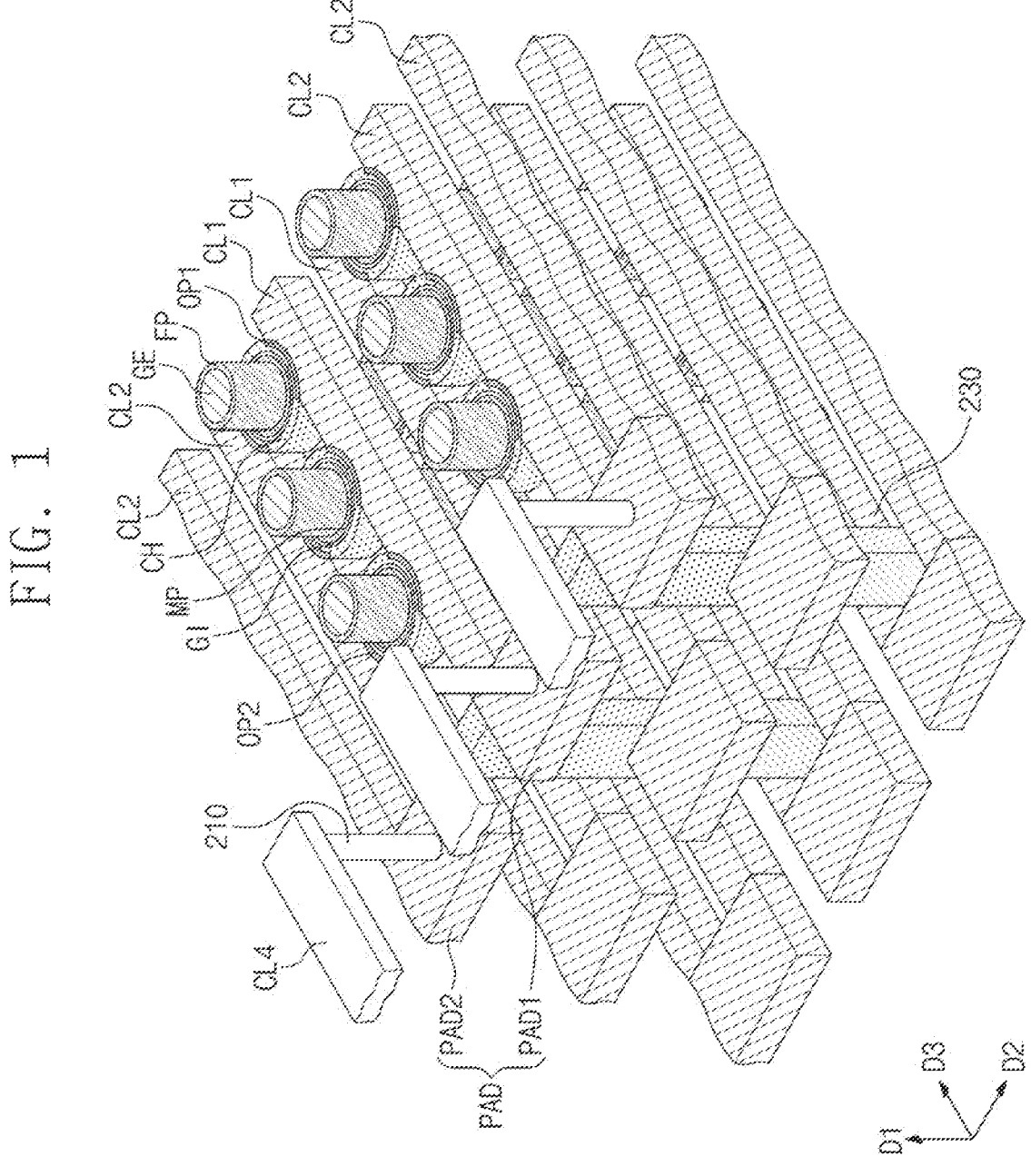
FIG. 1 is a perspective view schematically illustrating a semiconductor device according to an example embodiment of the inventive concept.
Figure 2:
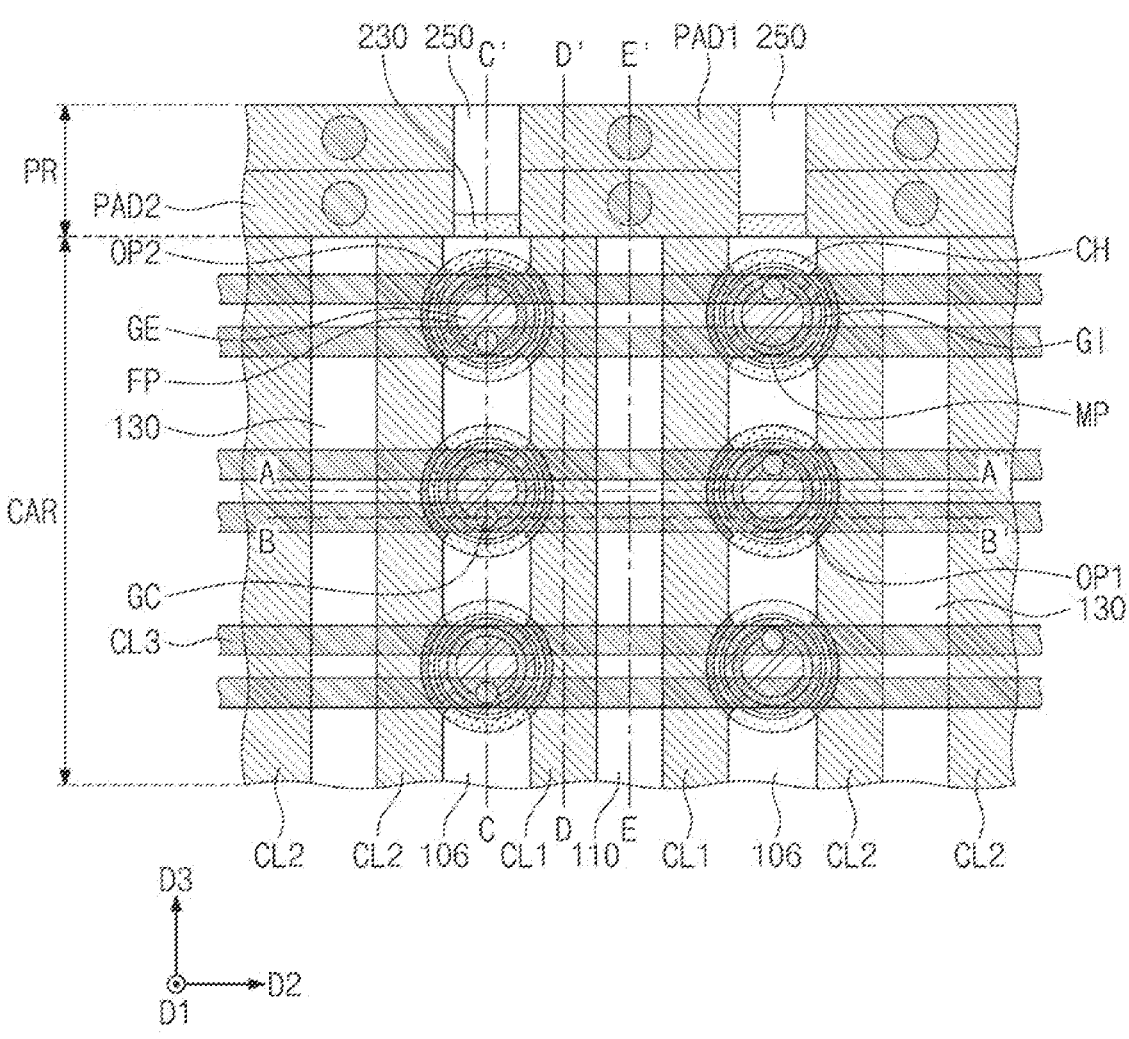
FIGS. 2 and 3 are plan views illustrating a semiconductor device according to an example embodiment of the inventive concept.
Figure 3:
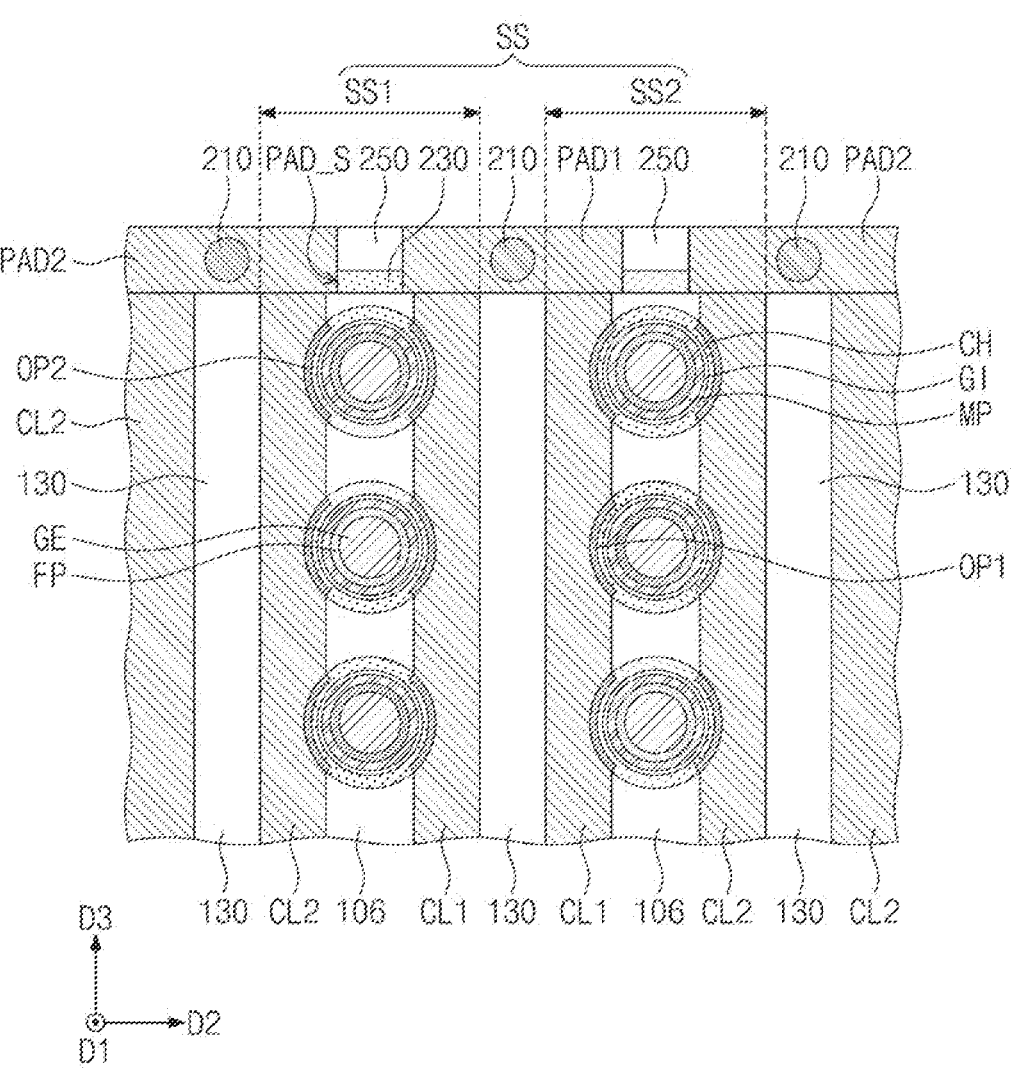

FIG. 1 is a perspective view schematically illustrating a semiconductor device according to an example embodiment of the inventive concept. FIGS. 2 and 3 are plan views illustrating a semiconductor device according to an example embodiment of the inventive concept. FIGS. 4 to 8 are sectional views, which are respectively taken along lines A-A', B-B', C-C', D-D', and E-E' of FIG. 2 to illustrate a semiconductor device according to an example embodiment of the inventive concept.

Referring to FIGS. 1 to 4, an interlayer insulating layer 102 and an etch stop layer 104 may be sequentially disposed on a substrate 100. The interlayer insulating layer 102 may be disposed between the substrate 100 and the etch stop layer 104. The substrate 100 may include a semiconductor substrate (e.g., a silicon substrate, a germanium substrate, a silicon-germanium substrate, and so forth). The interlayer insulating layer 102 may be formed of or include at least one of silicon oxide, silicon nitride, and/or silicon oxynitride, and the etch stop layer 104 may be formed of or include at least one of metal oxides (e.g., aluminum oxide). The substrate 100 may include a cell array region CAR and a pad region PR. The cell array region CAR and the pad region PR may be adjacent to each other in a third direction D3 parallel to a top surface 100U of the substrate 100.

A stack SS may be provided on the cell array region CAR of the substrate 100. The stack SS may be a cell array. The stack SS may be disposed on the etch stop layer 104. The stack SS may include first conductive lines CL1, which are spaced apart from each other in a first direction D1 perpendicular to a top surface 100U of the substrate 100, second conductive lines CL2, which are spaced apart from the first conductive lines CL1 in a second direction D2 parallel to the top surface 100U of the substrate 100, and gate electrodes GE, which are disposed between the first and second conductive lines CL1 and CL2. The first conductive lines CL1 may extend lengthwise in a third direction D3, and the third direction D3 may not be parallel to the second direction D2. The second conductive lines CL2 may be spaced apart from each other in the first direction D1 and may extend lengthwise in the third direction D3. The second conductive lines CL2 may extend lengthwise in the third direction D3 and be parallel to the first conductive lines CL1. The gate electrodes GE may be provided to cross the first and second conductive lines CL1 and CL2. The gate electrodes GE may be spaced apart from each other in the third direction D3, between the first and second conductive lines CL1 and CL2, and may extend lengthwise in the first direction D1.

The first and second conductive lines CL1 and CL2 may be formed of or include at least one of conductive materials (e.g., doped polysilicon, metal, conductive metal nitride, conductive metal silicide, conductive metal oxide, or combination thereof). The first and second conductive lines CL1 and CL2 may be formed of or include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concept is not limited to this example. The first and second conductive lines CL1 and CL2 may be formed of or include at least one of two-dimensional semiconductor materials (e.g., graphene, carbon nanotube, or combinations thereof). The gate electrodes GE may be formed of or include at least one of doped polysilicon, metal, conductive metal nitride, conductive metal silicide, conductive metal oxide, or combinations thereof. The gate electrodes GE may be formed of or include at least one of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concept is not limited to this example.

The stack SS may further include a plurality of channel patterns CH, which are provided to enclose a side surface GE_S of each of the gate electrodes GE. The channel patterns CH may be provided to enclose a side surface GE_S of a corresponding one of the gate electrodes GE and may be spaced apart from each other in the first direction D1. The channel patterns CH may be disposed between the first and second conductive lines CL1 and CL2. The first conductive lines CL1 may be connected to the channel patterns CH, respectively, and the second conductive lines CL2 may be connected to the channel patterns CH, respectively. Each of the channel patterns CH may be connected to a corresponding one of the first conductive lines CL1 and a corresponding one of the second conductive lines CL2. Each of the channel patterns CH may be disposed between the corresponding first conductive line CL1 and the corresponding second conductive line CL2. When viewed in a sectional view, the corresponding first conductive line CL1, each of the channel patterns CH, and the corresponding second conductive line CL2 may be overlapped with each other horizontally (e.g., in the second direction D2).

Each of the first conductive lines CL1 may extend lengthwise in the third direction D3 and may be connected to adjacent ones of the channel patterns CH enclosing each of the side surfaces GE_S of the gate electrodes GE. Each of the second conductive lines CL2 may extend lengthwise in the third direction D3 and may be connected to the adjacent ones of the channel patterns CH. The channel patterns CH may be formed of or include at least one of silicon (e.g., poly silicon, doped silicon, or single crystalline silicon), germanium, silicon-germanium, or oxide semiconductor materials. The oxide semiconductor materials may include InGaZnO (IGZO), Sn—InGaZnO, InWO (IWO), CuS2, CuSe2, WSe2, InGaSiO, InSnZnO, InZnO (IZO), ZnO, ZnTiO (ZTO), YZnO (YZO), ZnSnO, ZnON, ZrZnSnO, SnO, HfIn-ZnO, GaZnSnO, AlZnSnO, YbGaZnO, InGaO, or combinations thereof. The channel patterns CH may be formed of or include at least one of two-dimensional semiconductor materials (e.g., MoS2, MoSe2, WS2, graphene, carbon nanotube, or combinations thereof).

The stack SS may further include a ferroelectric pattern FP between each of the channel patterns CH and the corresponding gate electrode GE, a metal pattern MP between each of the channel patterns CH and the ferroelectric pattern FP, and a gate insulating pattern GI between each of the channel patterns CH and the metal pattern MP. The ferroelectric pattern FP may be provided to enclose or cover the side surface GE_S of the corresponding gate electrode GE. In example embodiments, a top surface of the ferroelectric pattern FP may be coplanar with a top surface of the corresponding gate electrode GE. The metal pattern MP may be provided to enclose the side surface GE_S of the corresponding gate electrode GE and may be spaced apart from the side surface GE_S of the corresponding gate electrode GE with the ferroelectric pattern FP interposed therebetween. The gate insulating pattern GI may be provided to enclose the side surface GE_S of the corresponding gate electrode GE and may be spaced apart from the side surface GE_S of the corresponding gate electrode GE with the ferroelectric pattern FP and the metal pattern MP interposed therebetween. In example embodiments, the ferroelectric pattern FP may contact a bottom surface and the side surface GE_S of the gate electrode GE, the metal pattern MP may contact a side surface of the ferroelectric pattern FP, the gate insulating pattern GI may contact a side surface of the ferroelectric pattern FP, and the channel pattern CH may contact a side surface of the gate insulating pattern GI.

The ferroelectric pattern FP may be formed of or include hafnium oxide with a ferroelectric property. The ferroelectric pattern FP may further include dopants, and in an embodiment, the dopants may be at least one of Zr, Si, Al, Y, Gd, La, Sc, or Sr. The ferroelectric pattern FP may be formed of or include at least one of HfO2, HfZnO, HfSiO, HfSiON, HfTaO, HfTiO, HfZrO, or combinations thereof. The ferroelectric pattern FP may have an orthorhombic phase. The metal pattern MP may be formed of or include at least one of metallic materials (e.g., Pt) and/or metal oxides (e.g., RuO2, IrO2, and LaSrCoO3). The metal pattern MP may be used to easily maintain polarization of the ferroelectric pattern FP. The gate insulating pattern GI may be formed of or include at least one of silicon oxide, silicon oxynitride, high-k dielectric materials having a higher dielectric constant than silicon oxide, or combinations thereof. The high-k dielectric materials may be formed of or include metal oxide or metal oxynitride.

The stack SS may further include first impurity patterns OP1, which are provided between the first conductive lines CL1 and the channel patterns CH, and second impurity patterns OP2, which are provided between the second conductive lines CL2 and the channel patterns CH. The first impurity patterns OP1 may be spaced apart from each other in the first direction D1 and may be respectively interposed between the first conductive lines CL1 and the channel patterns CH. The second impurity patterns OP2 may be spaced apart from each other in the first direction D1 and may be respectively interposed between the second conductive lines CL2 and the channel patterns CH. The second impurity patterns OP2 may be spaced apart from the first impurity patterns OP1 in the second direction D2 with the channel patterns CH, the gate insulating pattern GI, the metal pattern MP, the ferroelectric pattern FP, and the corresponding gate electrode GE interposed therebetween. The first conductive lines CL1 may be electrically and respectively connected to the channel patterns CH through the first impurity patterns OP1, and the second conductive lines CL2 may be electrically and respectively connected to the channel patterns CH through the second impurity patterns OP2.

Each of the first conductive lines CL1 may be connected to the adjacent ones of the channel patterns CH, which are spaced apart from each other in the third direction D3. Adjacent ones of the first impurity patterns OP1, which are adjacent to each other in the third direction D3, may be disposed between each of the first conductive lines CL1 and the adjacent ones of the channel patterns CH. Each of the first conductive lines CL1 may be electrically connected to the adjacent ones of the channel patterns CH through the adjacent ones of the first impurity patterns OP1. Each of the second conductive lines CL2 may be connected to the adjacent ones of the channel patterns CH. Adjacent ones of the second impurity patterns OP2, which are adjacent to each other in the third direction D3, may be disposed between each of the second conductive lines CL2 and the adjacent ones of the channel patterns CH. Each of the second conductive lines CL2 may be electrically connected to the adjacent ones of the channel patterns CH through the adjacent ones of the second impurity patterns OP2.

The first and second impurity patterns OP1 and OP2 may include impurities of the same conductivity type. The first and second impurity patterns OP1 and OP2 may include n-type impurities or p-type impurities.

The corresponding gate electrode GE, each of the channel patterns CH, which are provided to enclose the side surface GE_S of the corresponding gate electrode GE, the ferroelectric pattern FP, the metal pattern MP, and the gate insulating pattern GI, which are interposed between each of the channel patterns CH and the corresponding gate electrode GE, and corresponding first and second impurity patterns OP1 and OP2, which are disposed at both sides of each of the channel patterns CH, may constitute a ferroelectric field effect transistor (Fe FET). As an example, the first conductive lines CL1 may serve as bit lines, and the second conductive lines CL2 may serve as source lines. As another example, the first conductive lines CL1 may serve as source lines, and the second conductive lines CL2 may serve as bit lines. A current flowing between the first and second conductive lines CL1 and CL2 may be conducted through the corresponding one of the channel patterns CH.

The stack SS may further include first insulating patterns 106, which are spaced apart from each other in the first direction D1 and are interposed between the channel patterns CH. The first insulating patterns 106 and the channel patterns CH may be alternately stacked in the first direction D1. The channel patterns CH may be electrically separated or disconnected from each other by the first insulating patterns 106. Each of the first insulating patterns 106 may be provided to enclose the side surface GE_S of the corresponding gate electrode GE. The first insulating patterns 106 may extend to regions between the first impurity patterns OP1, between the first conductive lines CL1, between the second impurity patterns OP2, and between the second conductive lines CL2.

The first insulating patterns 106 may extend into regions between gate insulating patterns GI, which are adjacent to each other in the first direction D1 and between metal patterns MP, which are adjacent to each other in the first direction D1. In other words, the gate insulating pattern GI and the metal pattern MP may be interposed between adjacent ones of the first insulating patterns 106, which are adjacent to each other in the first direction D1. The ferroelectric pattern FP may extend into a region between each of the first insulating patterns 106 and the corresponding gate electrode GE. The first insulating patterns 106 may be in contact with a side surface of the ferroelectric pattern FP. In an embodiment, the first insulating patterns 106 may be formed of or include silicon oxide.

Sidewall insulating patterns 130 may be disposed on the etch stop layer 104 and at both sides of the stack SS. The sidewall insulating patterns 130 may be spaced apart from each other in the second direction D2 with the stack SS interposed therebetween. The sidewall insulating patterns 130 may extend in the first direction D1 and the third direction D3. One of the sidewall insulating patterns 130 may extend in the first direction D1 to cover the side surfaces of the first conductive lines CL1 and the first insulating patterns 106 and may extend along the side surfaces of the first conductive lines CL1 and in the third direction D3. Another of the sidewall insulating patterns 130 may extend in the first direction D1 to cover the side surfaces of the second conductive lines CL2 and the first insulating patterns 106 and may extend along the side surfaces of the second conductive lines CL2 and in the third direction D3. The sidewall insulating patterns 130 may be formed of or include at least one of, for example, silicon oxide, silicon nitride, and/or silicon oxynitride.

In an embodiment, a plurality of stacks SS may be provided. For example, the stacks SS may include first stacks SS1 and second stacks SS2. The first stacks SS1 and the second stacks SS2 may be alternately disposed in the second direction D2 on the substrate. The first and second stacks SS1 and SS2 may be spaced apart from each other in the second direction D2 with the sidewall insulating pattern 130 interposed therebetween. The first conductive lines CL1 of each of the second stacks SS2 may be disposed to be adjacent to the first conductive lines CL1 of each of the first stacks SS1. The second conductive lines CL2 of each of the second stacks SS2 may be disposed to be adjacent to the second conductive lines CL2 of each of the first stacks SS1. For example, the first and second stacks SS1 and SS2, which are adjacent to each other, may be disposed symmetrically with respect to the sidewall insulating pattern 130 located between them.

An upper insulating layer 135 may be disposed on the stacks SS. The upper insulating layer 135 may cover top surfaces of the gate electrodes GE, the ferroelectric pattern FP, and the sidewall insulating pattern 130. For example, the upper insulating layer 135 may contact the top surfaces of the gate electrodes GE, the ferroelectric pattern FP, and the sidewall insulating pattern 130.

Figure 5:
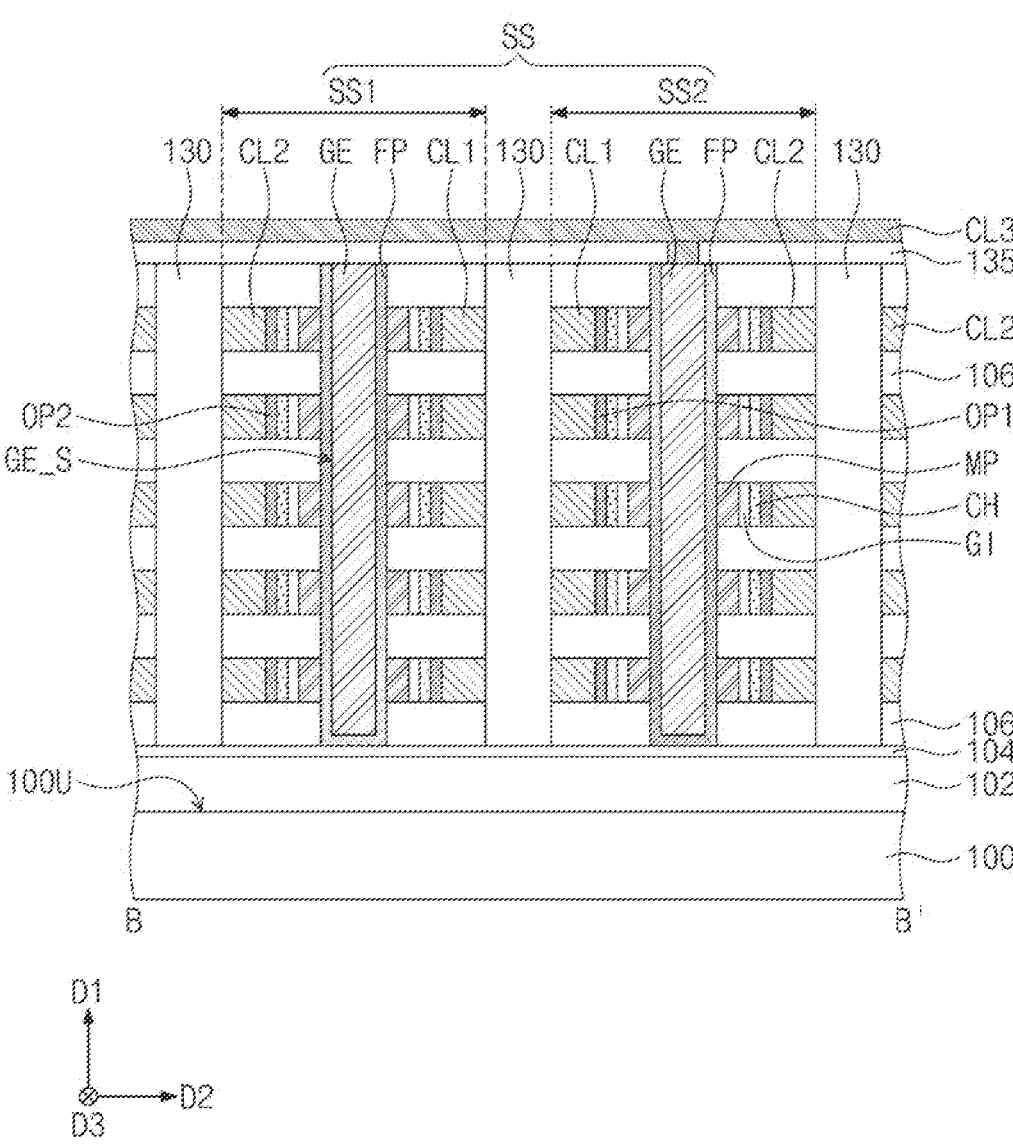
Figure 6:
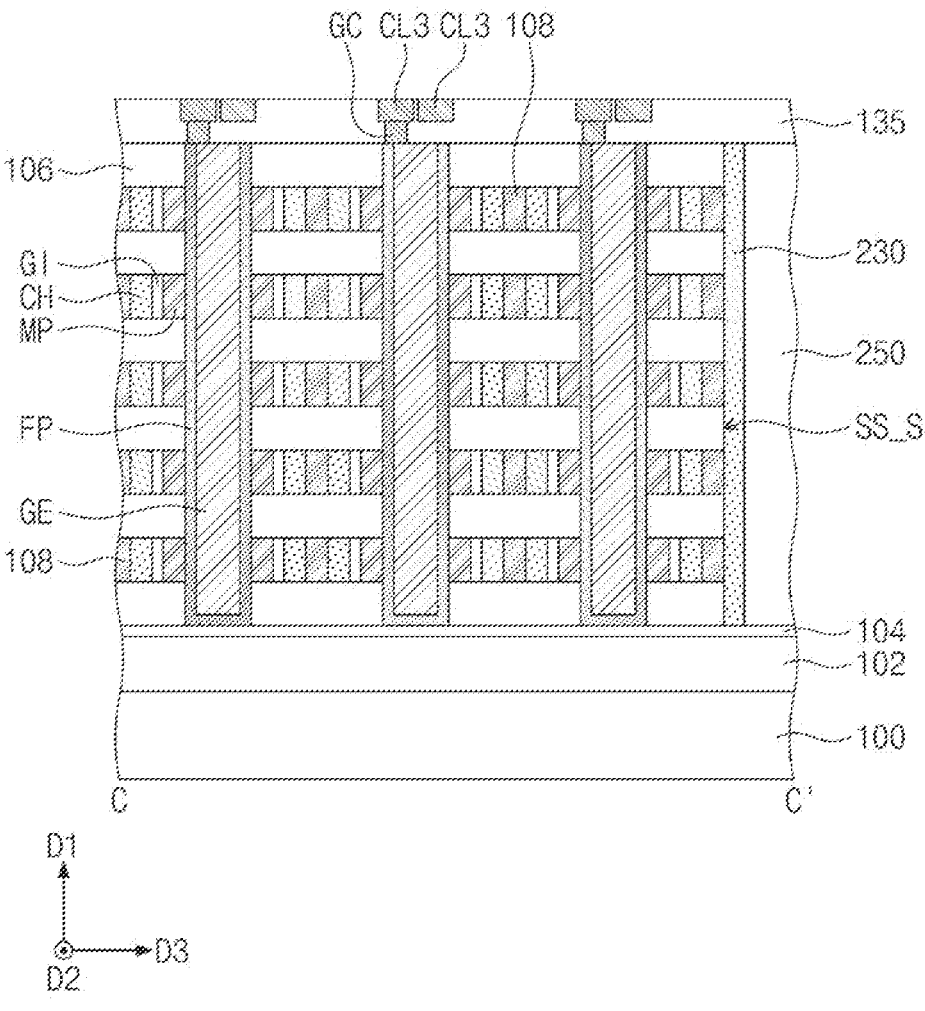
Figure 7:
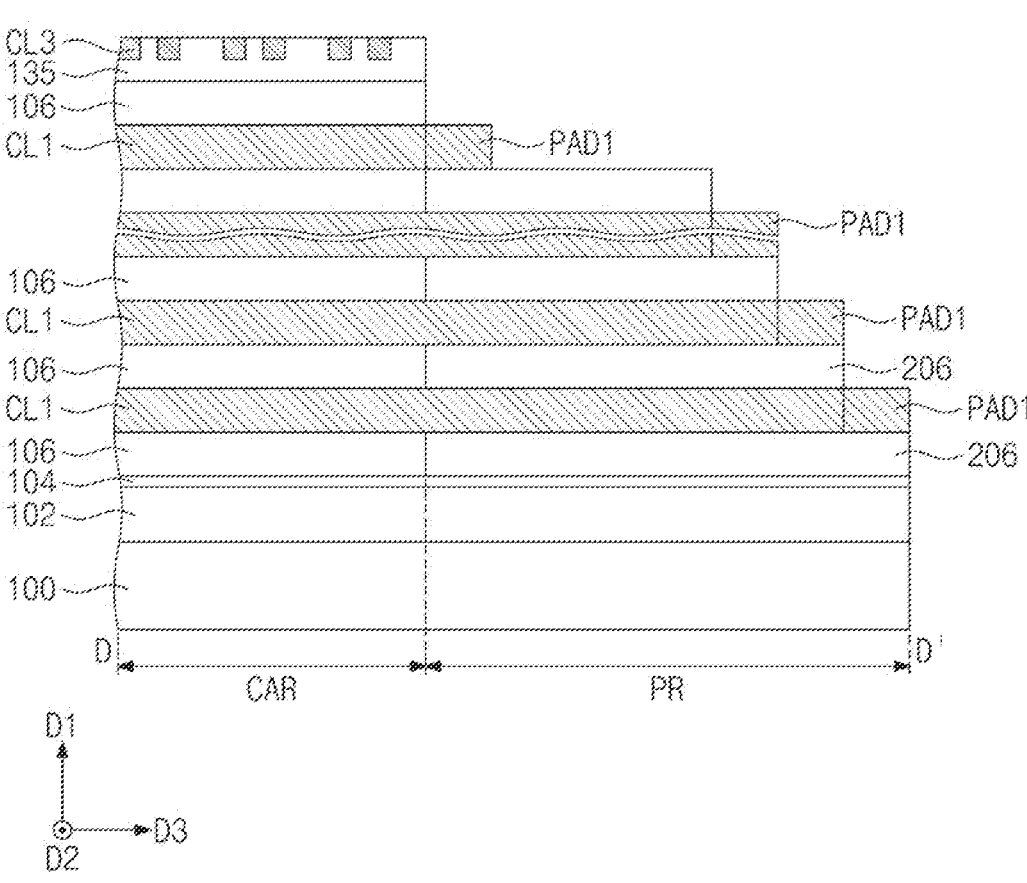
Figure 8:
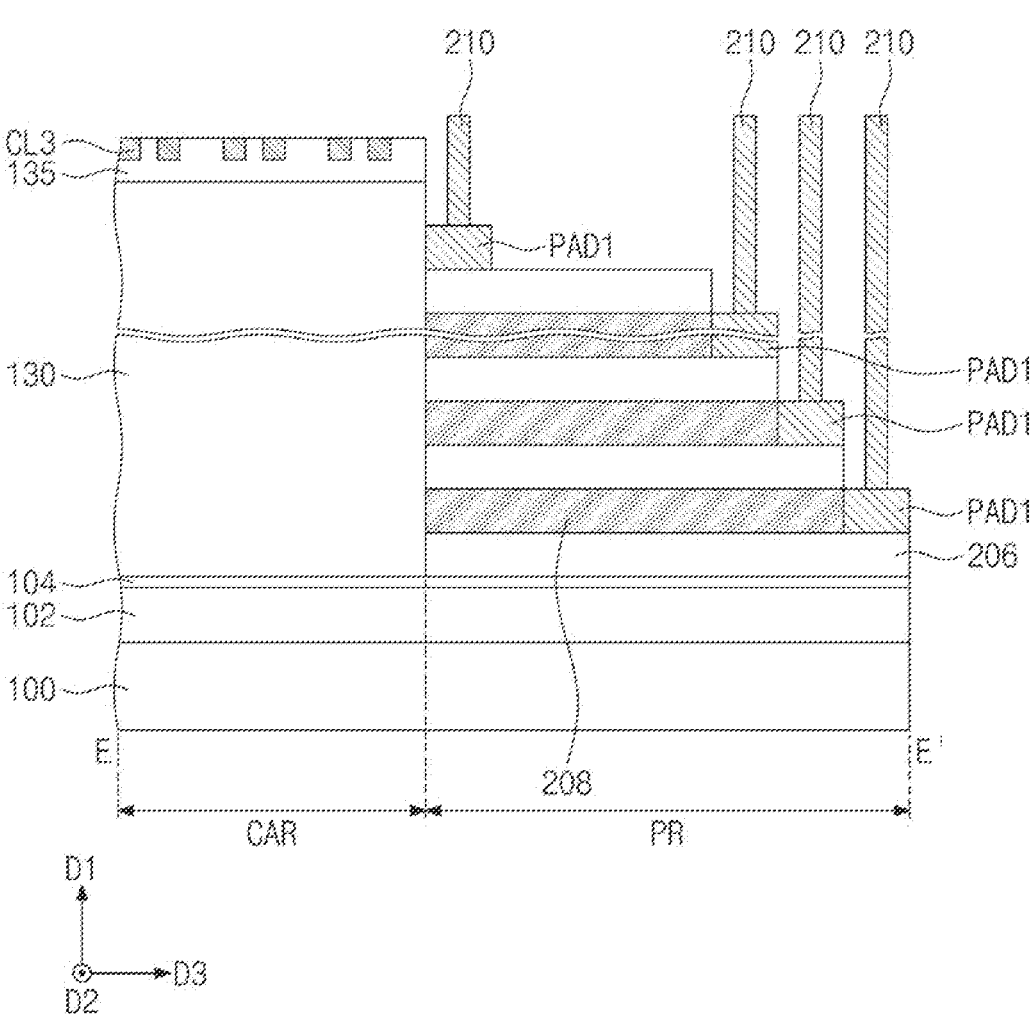

Referring to FIGS. 2, 5, and 6, third conductive lines CL3 may be disposed on the stacks SS. The third conductive lines CL3 may be spaced apart from the stacks SS2 in the first direction D1. The third conductive lines CL3 may be spaced apart from each other in the third direction D3. The third conductive lines CL3 may extend lengthwise in the second direction D2.

Gate contacts GC may be provided on the stacks SS. The gate contacts GC may be disposed on the gate electrodes GE. Each of the gate electrodes GE may be connected to a corresponding one of the gate contacts GC. Each of the gate contacts GC may electrically connect a corresponding one of the gate electrodes GE of the stacks SS to a corresponding one of the third conductive lines CL3. In example embodiments, the gate contacts GC may contact a top surface of a corresponding one of the gate electrodes GE and a bottom surface of a corresponding one of the third conductive lines CL3.

When viewed in a plan view, each of the gate electrodes GE may be overlapped with at least two third conductive lines CL3. Each of the gate electrodes GE of the first stacks SS1 may be electrically connected to one of the third conductive lines CL3. Each of the gate electrodes GE of the second stacks SS2 may be electrically connected to another one of the third conductive lines CL3. One of the gate contacts GC may electrically connect each of the gate electrodes GE of the first stacks SS1 to one of the third conductive lines CL3. Another one of the gate contacts GC may electrically connect each of the gate electrode GE of the second stacks SS2 to another one of the third conductive lines CL3.

The stack SS may further include second insulating patterns 108, which are interposed between the adjacent ones of the channel patterns CH spaced apart from each other in the third direction D3. The adjacent ones of the channel patterns CH may be electrically separated or disconnected from each other by the second insulating patterns 108. The second insulating patterns 108 may be interposed between a corresponding one of the first conductive lines CL1 and a corresponding one of the second conductive lines CL2. The second insulating patterns 108 may be interposed between the first insulating patterns 106. The second insulating patterns 108 may be formed of or include a material different from the first insulating patterns 106. In an embodiment, the first insulating patterns 106 may be formed of or include silicon oxide, and the second insulating patterns 108 may be formed of or include silicon nitride. As another embodiment, the second insulating patterns 108 may be formed of or include silicon oxide or may be an air gap.

Referring to FIGS. 2, 3, and 7 to 8, pads PAD may be provided on the pad region PR of the substrate 100. The pads PAD may be contact pads. The pads PAD may be provided to connect the first stacks SS1 to the second stacks SS2. The pads PAD may be formed of doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or combinations thereof, but the inventive concept is not limited to this example. The first and second conductive lines CL1 and CL2 may be formed of or include at least one of two-dimensional semiconductor materials (e.g., graphene, carbon nanotube, or combinations thereof).

The pads PAD may include first pads PAD1 and second pads PAD2. The first pads PAD1 may be spaced apart from each other in the first direction D1. The second pads PAD2 may be spaced apart from each other in the first direction D1. The second pads PAD2 may be spaced apart from the first pads PAD1 in the second direction D2. The first pads PAD1 and the second pads PAD2 may be alternately disposed in the second direction D2. The first pads PAD1 and the second pads PAD2 may be adjacent to each other in the second direction D2.

The first conductive lines CL1 may extend lengthwise to the pad region PR in the third direction D3. For the first conductive lines CL1, which are spaced apart from each other in the first direction D1, the smaller the distance to the substrate 100, the longer their length. End portions of the first conductive lines CL1 may be provided to have a stepwise shape on the pad region PR. The second conductive lines CL2 may extend lengthwise to a region on the pad region PR in the third direction D3. For the second conductive lines CL2, which are spaced apart from each other in the first direction D1, the smaller the distance to the substrate 100, the longer their length. End portions of the second conductive lines CL2 may be provided to have a stepwise shape on the pad region PR.

The first conductive lines CL1 may extend lengthwise to the pad region PR in the third direction D3 and may be connected to the first pads PAD1, respectively. The first conductive lines CL1 of the first stack SS1 may be respectively connected to the first conductive lines CL1 of the second stack SS2 adjacent thereto through the first pads PAD1. Each of the first pads PAD1 may be connected in common to a corresponding one of the first conductive lines CL1 of the first stack SS1 and a corresponding one of the first conductive lines CL1 of the second stack SS2. The first pads PAD1 may be arranged to form a stepwise structure.

The second conductive lines CL2 may extend lengthwise to the pad region PR in the third direction D3 and may be connected to the second pads PAD2, respectively. The second conductive lines CL2 of the first stacks SS1 may be electrically and respectively connected to the second conductive lines CL2 of the second stack SS2 adjacent thereto through the second pads PAD2. Each of the second pads PAD2 may be connected in common to a corresponding one of the second conductive lines CL2 of the first stack SS1 and a corresponding one of the second conductive lines CL2 of the second stacks SS2. The second pads PAD2 may be arranged to form a stepwise structure.

Each of the first stacks SS1 may be connected to a pair of the second stacks SS2, which are located at both sides of the same, through the first pads PAD1 and the second pads PAD2. In other words, one first stack SS1 and one second stack SS2, which are adjacent to each other, may be connected to each other through the first pads PAD1 or the second pads PAD2.

Cell insulating patterns 230 may be provided on the pad region PR adjacent to the cell array region CAR. The cell insulating patterns 230 may be disposed on the etch stop layer 104. The cell insulating patterns 230 may be spaced apart from each other in the second direction D2. The cell insulating patterns 230 may be in contact with a side surface SS_S of the stack SS. The cell insulating patterns 230 may be interposed between the uppermost ones of the first pads PAD1 and the uppermost ones of the second pads PAD2. The cell insulating patterns 230 may extend in the first direction D1. The cell insulating patterns 230 may not be in contact with the first and second conductive lines CL1 and CL2. In an embodiment, the cell insulating patterns 230 may be formed of or include silicon oxide.

Pad separation patterns 250 may be provided on the pad region PR. The pad separation patterns 250 may be provided on the etch stop layer 104. The pad separation patterns 250 may be disposed at both sides of the pads PAD. The first pads PAD1 and the second pads PAD2 may be spaced apart from each other in the second direction D2 with the pad separation patterns 250 interposed therebetween. The pad separation patterns 250 may extend lengthwise in the first and third directions D1 and D3. The pad separation patterns 250 may not be overlapped with the sidewall insulating patterns 130 in the third direction D3. The pad separation patterns 250 may cover side surfaces of the pads PAD.

On the pad region PR, first pad insulating patterns 206 may be interposed between the first conductive lines CL1, which are spaced apart from each other in the first direction D1, and may extend lengthwise into regions between the first pads PAD1, which are spaced apart from each other in the first direction D1. The first pad insulating patterns 206 may be interposed between the second conductive lines CL2 and may extend lengthwise into regions between the second pads PAD2, which are spaced apart from each other in the first direction D1. The pads PAD and the first pad insulating patterns 206 may be alternately stacked on top of one another. The first and second conductive lines CL1 and CL2 and the pads PAD may be separated, or electrically disconnected, from each other by the first pad insulating patterns 206. The first pad insulating patterns 206 may be in contact with the first insulating patterns 106, respectively. The first pad insulating patterns 206 may be formed of or include, for example, silicon oxide.

Second pad insulating patterns 208 may be interposed between the first pad insulating patterns 206 in the pad region PR. The second pad insulating patterns 208 may be formed of or include a material different from the first pad insulating patterns 206. For example, the second pad insulating patterns 208 may be formed of or include silicon nitride.

The pads PAD may be sequentially exposed in a stepwise manner. Conductive contacts 210 may be provided on the pads PAD. The conductive contacts 210 may be connected to exposed top surfaces of the pads PAD, respectively. Each of the pads PAD may be connected to at least one of the conductive contacts 210. Referring back to FIG. 1, if a voltage and/or signal is applied to the fourth conductive lines CL4, the voltage and/signal may be applied to the first and second conductive lines CL1 and CL2 through the pads PAD.

According to an embodiment of the inventive concept, the first and second conductive lines CL1 and CL2 may share the pads PAD. Thus, it may be possible to increase an area of the pads PAD and thereby to easily form the conductive contacts 210 and to reduce the number of the conductive contacts 210. As a result, it may be possible to easily increase an integration density of a semiconductor device and improve reliability of the semiconductor device.

Figure 9:
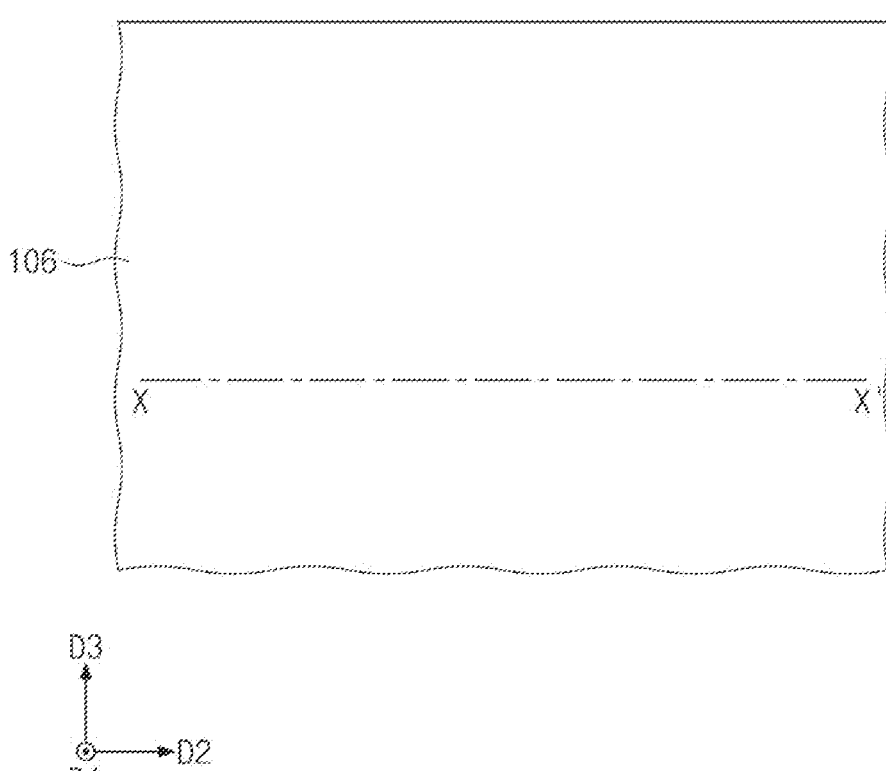
FIGS. 9, 11, 13, 15, 17, 19, 21, 23, 25, and 27 are plan views illustrating a method of fabricating a semiconductor device according to an example embodiment of the inventive concept.
Figure 10:
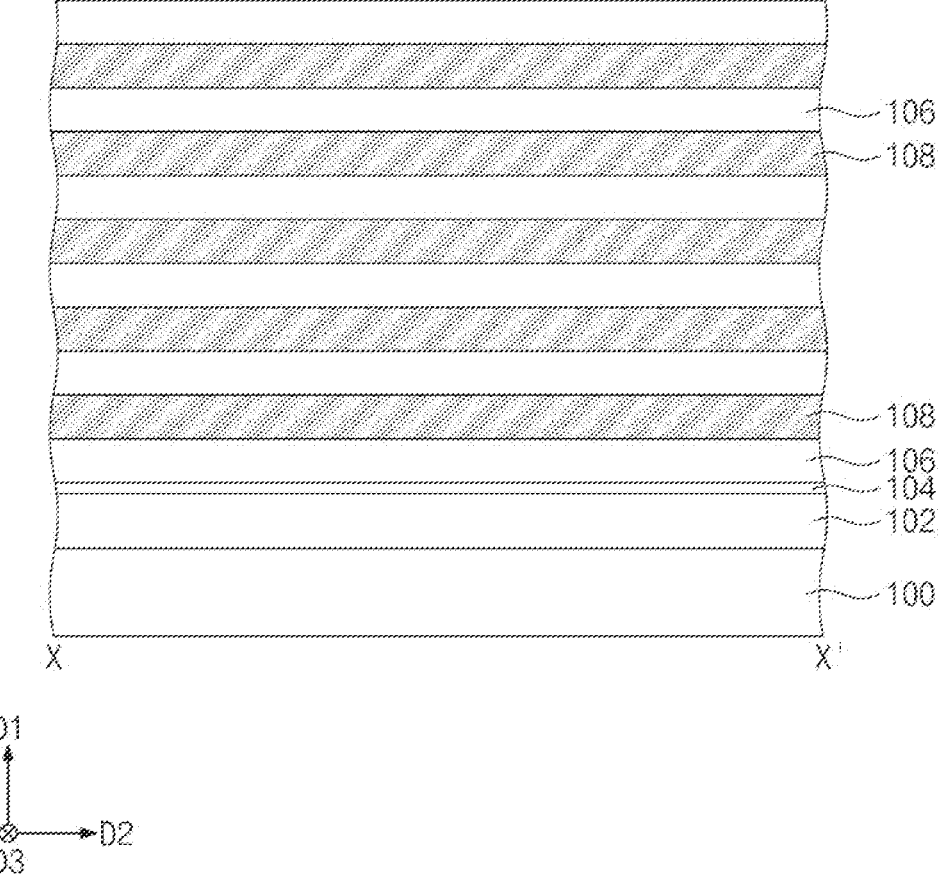
FIGS. 10, 14, 16, 18, 20, 22, 24, 26, and 28 are sectional views corresponding to lines of X-X' of FIGS. 9, 13, 15, 17, 19, 21, 23, 25, and 27, respectively.
Figure 11:
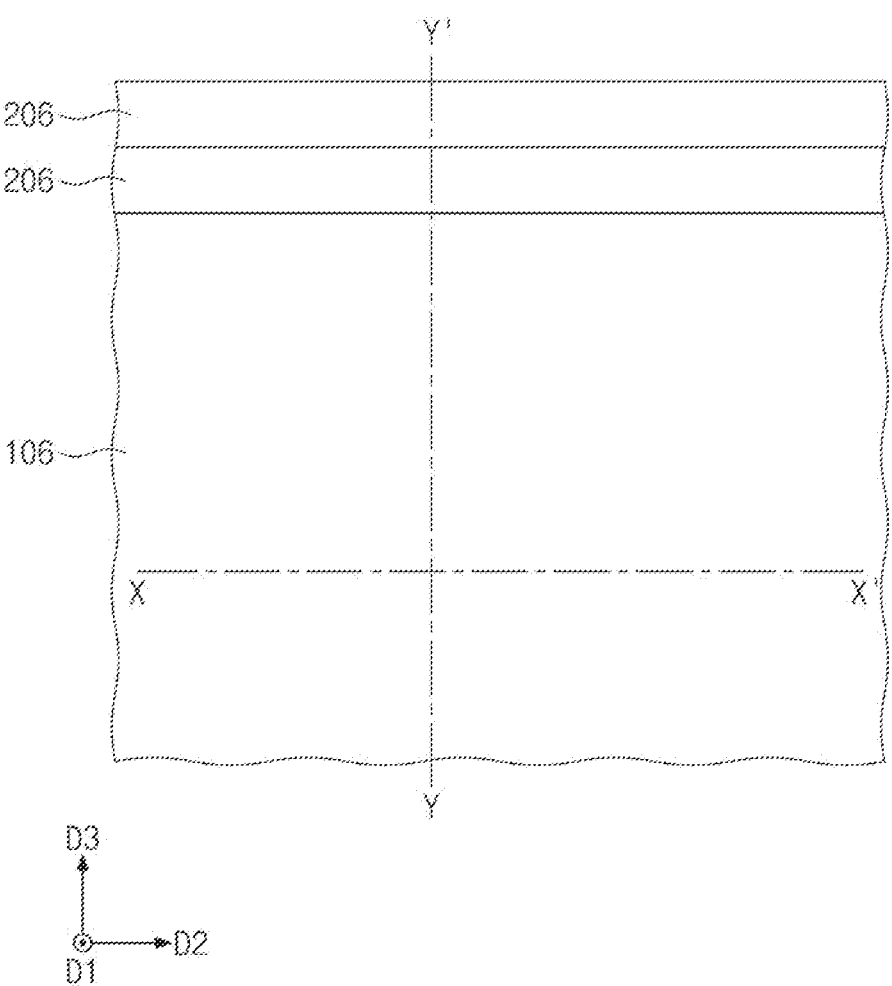
Figure 12:
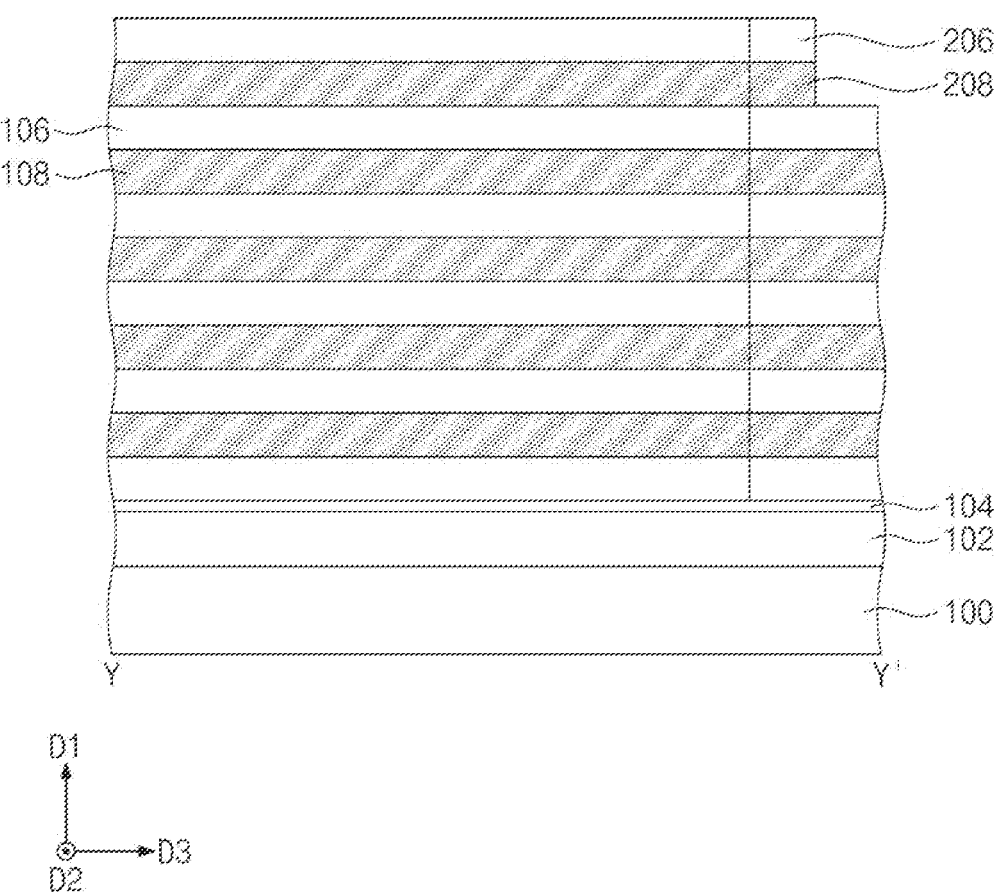
FIG. 12 is a sectional view corresponding to a line Y-Y' of FIG. 10.

FIGS. 9, 11, 13, 15, 17, 19, 21, 23, 25, and 27 are plan views illustrating a method of fabricating a semiconductor device according to an example embodiment of the inventive concept, FIGS. 10, 14, 16, 18, 20, 22, 24, 26, and 28 are sectional views corresponding to lines of X-X' of FIGS. 9, 13, 15, 17, 19, 21, 23, 25, and 27, respectively, and FIG. 12 is a sectional view corresponding to a line Y-Y' of FIG. 10. For the sake of brevity, features, which are different from the semiconductor device described with reference to FIGS. 1 to 8, will be mainly described below.

Referring to FIGS. 9 and 10, an interlayer insulating layer 102 and an etch stop layer 104 may be sequentially formed on a substrate 100. First insulating layers 106 and second insulating layers 108 may be stacked on the etch stop layer 104. The first and second insulating layers 106 and 108 may be alternately stacked in the first direction D1 perpendicular to a top surface 100U of the substrate 100. The lowermost one of the first insulating layers 106 may be interposed between the lowermost one of the second insulating layers 108 and the etch stop layer 104, and the uppermost one of the first insulating layers 106 may be disposed on the uppermost one of the second insulating layers 108. The first insulating layers 106 may be formed of or include silicon oxide. The second insulating layers 108 may be formed of or include a material (e.g., silicon nitride) having an etch selectivity with respect to the first insulating layers 106.

Referring to FIGS. 11 and 12, first pad insulating layers 206 and second pad insulating layers 208 may be formed on the substrate 100. The first and second pad insulating layers 206 and 208 may be alternately stacked in the first direction D1 perpendicular to a top surface 100U of the substrate 100. The lowermost one of the first pad insulating layers 206 may be interposed between the lowermost one of the second pad insulating layers 208 and the etch stop layer 104, and the uppermost one of the first pad insulating layers 206 may be disposed on the uppermost one of the second pad insulating layers 208. The first pad insulating layers 206 and second pad insulating layers 208 may be adjacent to the first insulating layers 106 and the second insulating layers 108 in the third direction D3. The first insulating layers 106 and the second insulating layers 108 may be formed on a cell array region CAR of the substrate 100. The first pad insulating layers 206 may be portions of the first insulating layers 106, which are extended to a pad region PR of the substrate 100, and the second pad insulating layers 208 may be portions of the second insulating layers 108, which are extended to the pad region PR of the substrate 100. The first and second pad insulating layers 206 and 208 may be alternately stacked in the first direction D1. End portions of the first and second pad insulating layers 206 and 208 may be formed in a stepwise shape. The first pad insulating layers 206 may be formed of or include silicon oxide. The second pad insulating layers 208 may be formed of or include a material (e.g., silicon nitride) having an etch selectivity with respect to the first pad insulating layers 206.

Figure 13:
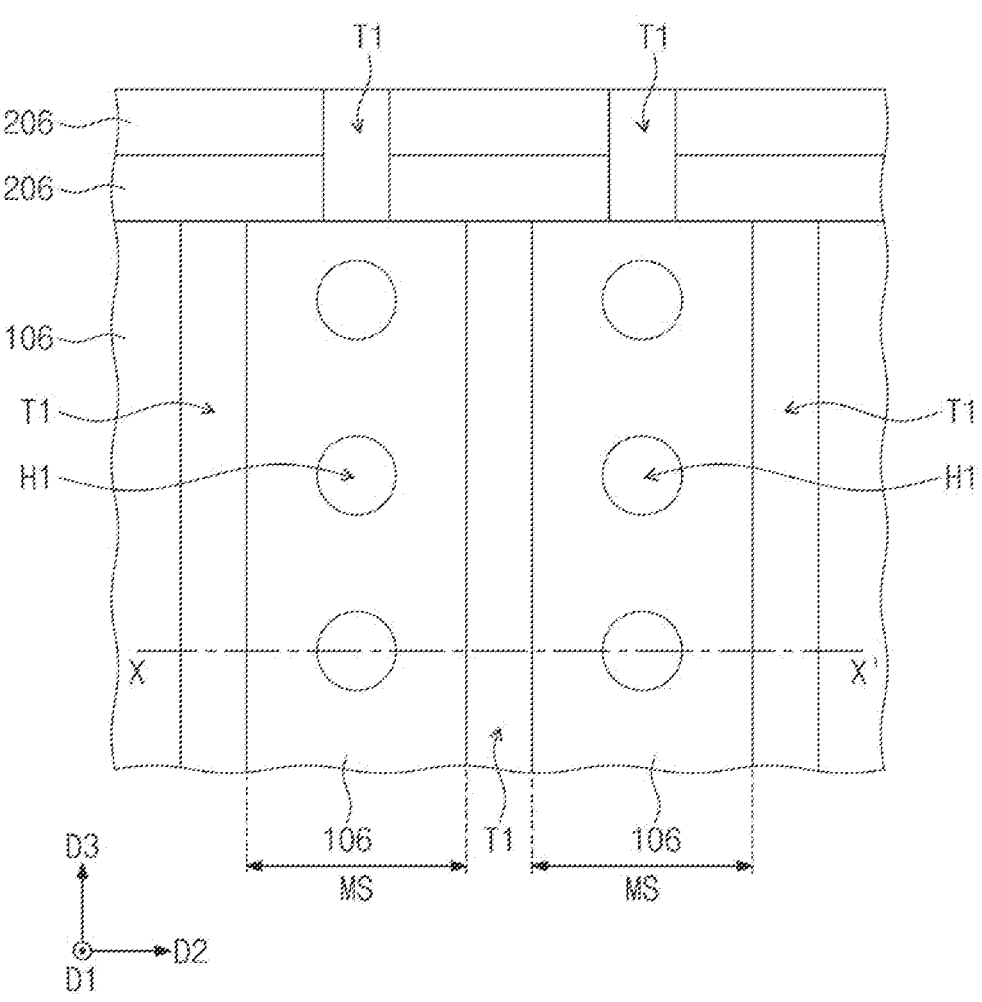
Figure 14:
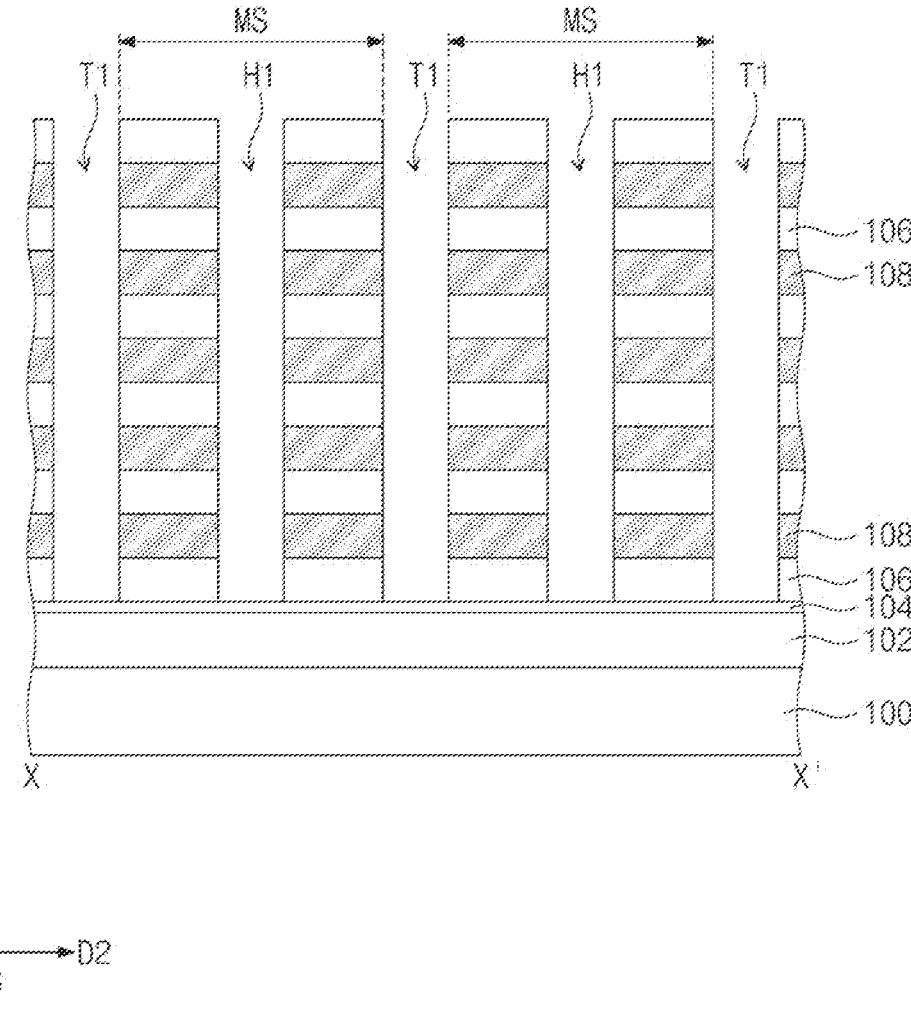

Referring to FIGS. 13 and 14, first trenches T1 may be formed in the first and second insulating layers 106 and 108 and the first and second pad insulating layers 206 and 208. Each of the first trenches T1 may be formed to penetrate the first and second insulating layers 106 and 108 and the first and second pad insulating layers 206 and 208 in the first direction D1 and to expose a top surface of the etch stop layer 104. The first trenches T1 may be spaced apart from each other in a second direction D2, which is parallel to the top surface 100U of the substrate 100, and may extend lengthwise in a third direction D3, which is parallel to the top surface 100U of the substrate 100. The third direction D3 may not be parallel to the second direction D2. The formation of the first trenches T1 may include anisotropically etching the first and second insulating layers 106 and 108 and the first and second pad insulating layers 206 and 208.

The first trenches T1 on the cell array region CAR may penetrate the first insulating layers 106 and the second insulating layers 108 in the first direction D1. The first trenches T1 on the cell array region CAR may be spaced apart from each other in the second direction D2 and may extend lengthwise in the third direction D3. The first trenches T1 on the pad region PR may also penetrate the first and second pad insulating layers 206 and 208 in the first direction D1. The first trenches T1 on the pad region PR may be spaced apart from each other in the second direction D2 and may extend lengthwise in the third direction D3. The first trenches T1 on the pad region PR may be offset from the first trenches T1 on the cell array region CAR in the second direction D2.

A mold structure MS may be defined by the first trenches T1 on the cell array region CAR. The mold structure MS may include remaining portions of the first insulating layers 106 and remaining portions of the second insulating layers 108, which are interposed between the first trenches T1. The remaining portions of the first insulating layers 106 may be referred to as first insulating patterns 106, and the remaining portions of the second insulating layers 108 may be referred to as second insulating patterns 108. In other words, the mold structure MS may include the first and second insulating patterns 106 and 108, which are alternately stacked in the first direction D1. The first trenches T1 may be spaced apart from each other in the second direction D2 with the mold structure MS interposed therebetween and may extend lengthwise in the third direction D3. The mold structure MS may extend lengthwise in the third direction D3, between the first trenches T1.

Remaining portions of the first pad insulating layers 206 may be referred to as the first pad insulating patterns 206. Remaining portions of the second pad insulating layers 208 may be referred to as the second pad insulating patterns 208. The first and second pad insulating patterns 206 and 208 may be defined by the first trenches T1 on the pad region PR.

First holes H1 may be formed in the mold structure MS. Each of the first holes H1 may extend in the first direction D1 to penetrate the mold structure MS and to expose the top surface of the etch stop layer 104. Between the first trenches T1, the first holes H1 may be spaced apart from each other in the third direction D3. The formation of the first holes H1 may include anisotropically etching the first and second insulating patterns 106 and 108.

Figure 15:
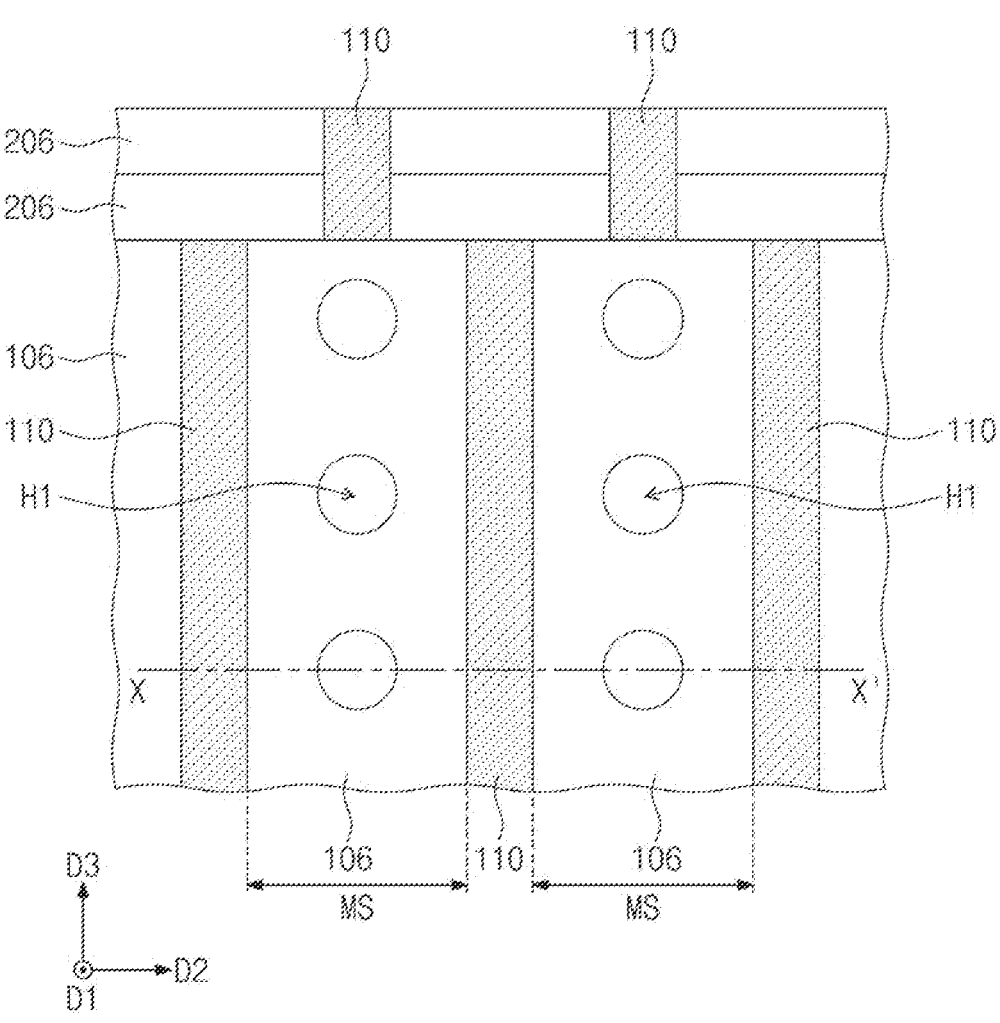
Figure 16:
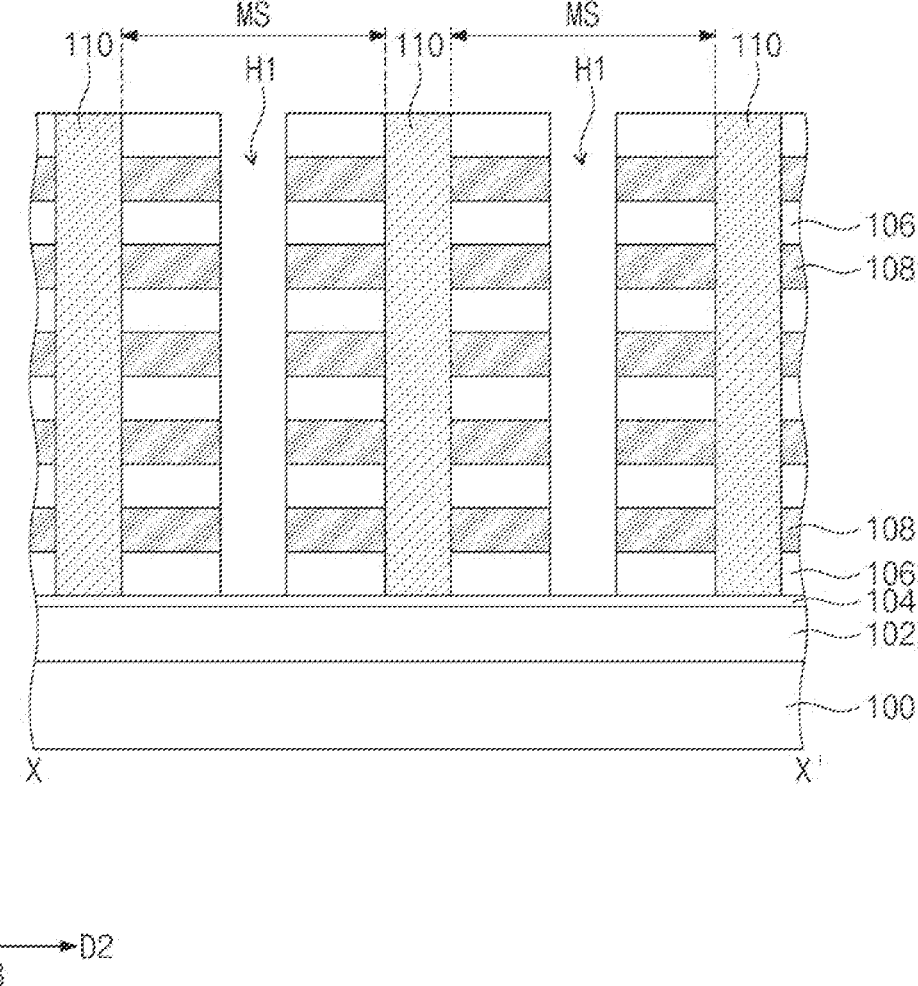

Referring to FIGS. 15 and 16, first sacrificial patterns 110 may be formed in the first trenches T1, respectively. The first sacrificial patterns 110 may be formed to fill the first trenches T1, respectively. The first sacrificial patterns 110 on the cell array region CAR may be spaced apart from each other in the second direction D2 with the mold structure MS interposed therebetween and may extend in the third direction D3. The first sacrificial patterns 110 may cover opposite side surfaces of the mold structure MS. The first sacrificial patterns 110 may be formed of or include a material having an etch selectivity with respect to the second insulating patterns 108. In an embodiment, each of the first sacrificial patterns 110 may include a silicon oxide layer, which is formed to conformally cover an inner surface of each of the first trenches T1 and to fill an upper region of each of the first trenches T1, and a silicon nitride layer, which is formed to fill a remaining region of each of the first trenches T1. The first sacrificial patterns 110 on the pad region PR may be spaced apart from each other in the second direction D2 with the first and second pad insulating patterns 206 and 208 interposed therebetween and may extend in the third direction D3.

Figure 17:
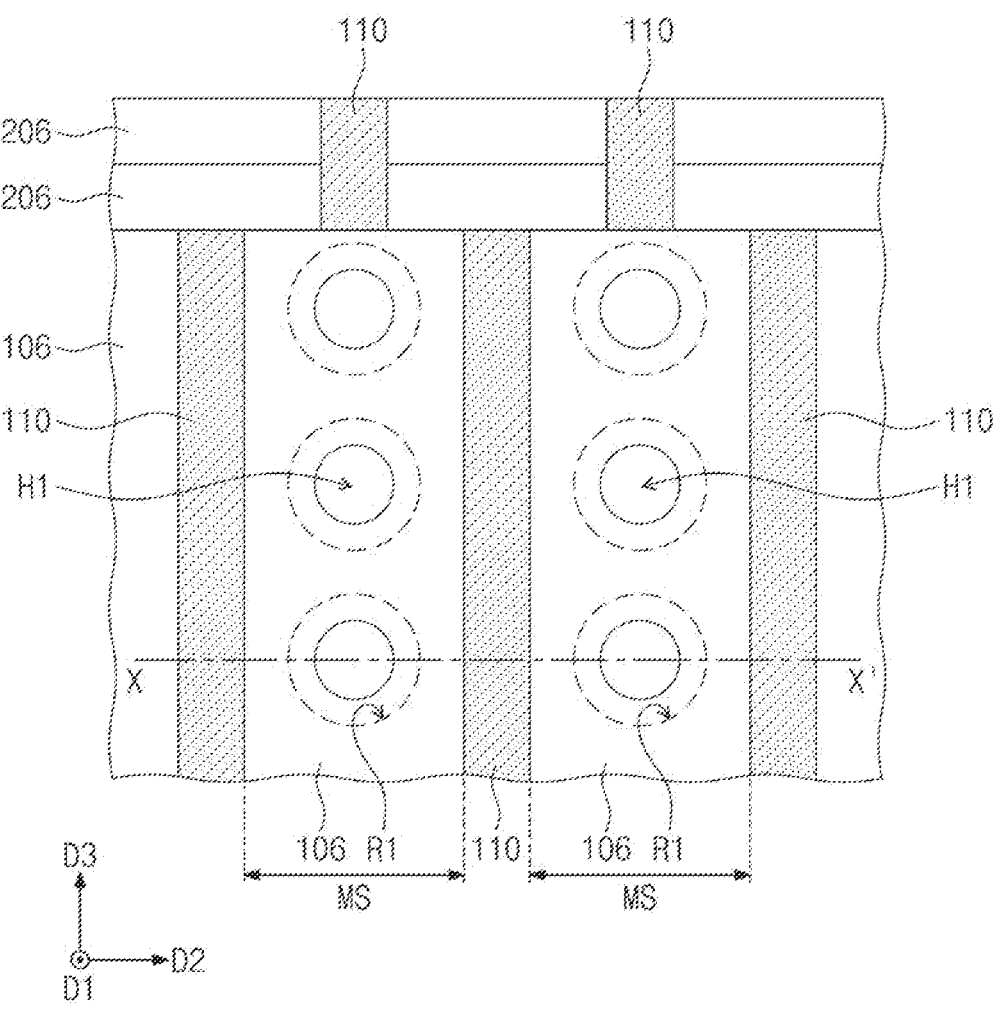
Figure 18:
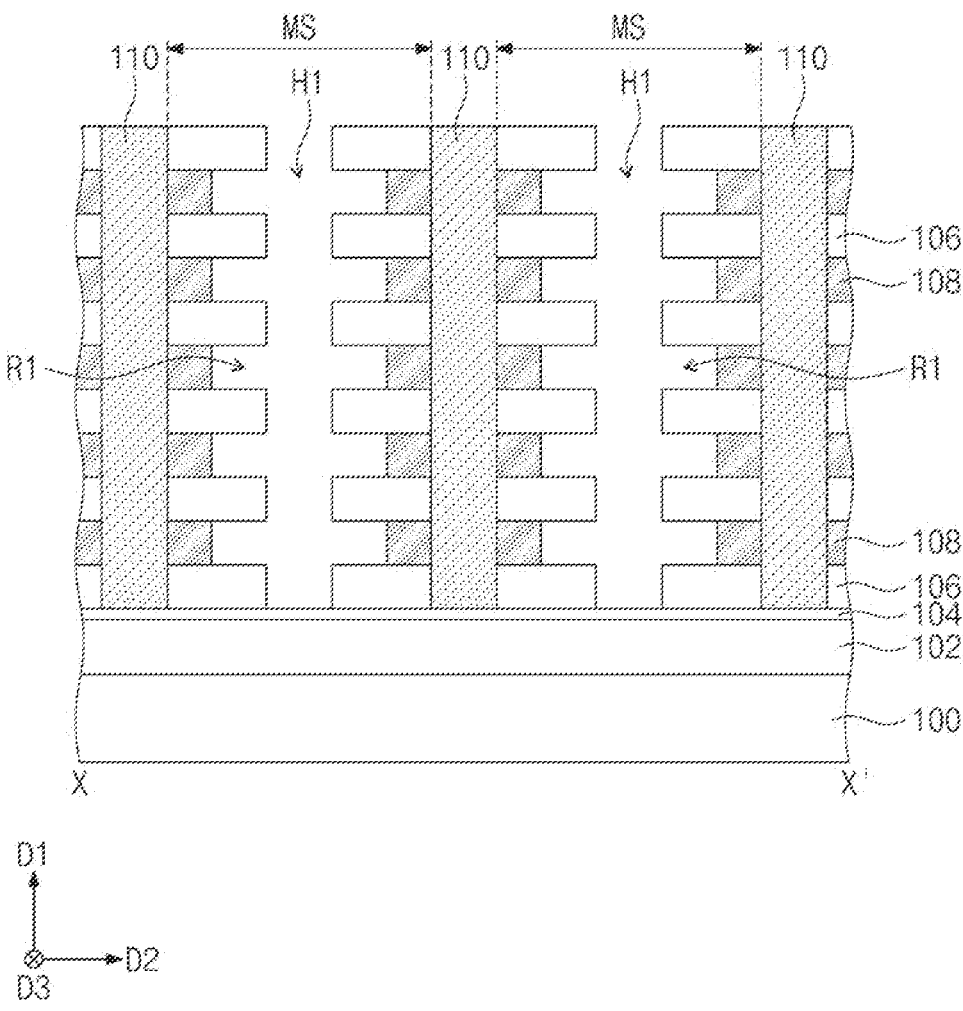

Referring to FIGS. 17 and 18, each of the first holes H1 may be formed to expose side surfaces of the first and second insulating patterns 106 and 108 of the mold structure MS. The exposed side surfaces of the second insulating patterns 108 may be selectively recessed, and thus, first recess regions R1 may be formed in the mold structure MS. In an embodiment, the formation of the first recess regions R1 may include performing an etching process, which has an etch selectivity with respect to the second insulating patterns 108, to laterally etch the exposed side surfaces of the second insulating patterns 108. The first recess regions R1 may be spaced apart from each other in the first direction D1 and may be respectively interposed between the first insulating patterns 106. Each of the first recess regions R1 may be formed to enclose each of the first holes H1, when viewed in a plan view. For example, each of the first recess regions R1 may surround a corresponding one of the first holes H1.

Figure 19:
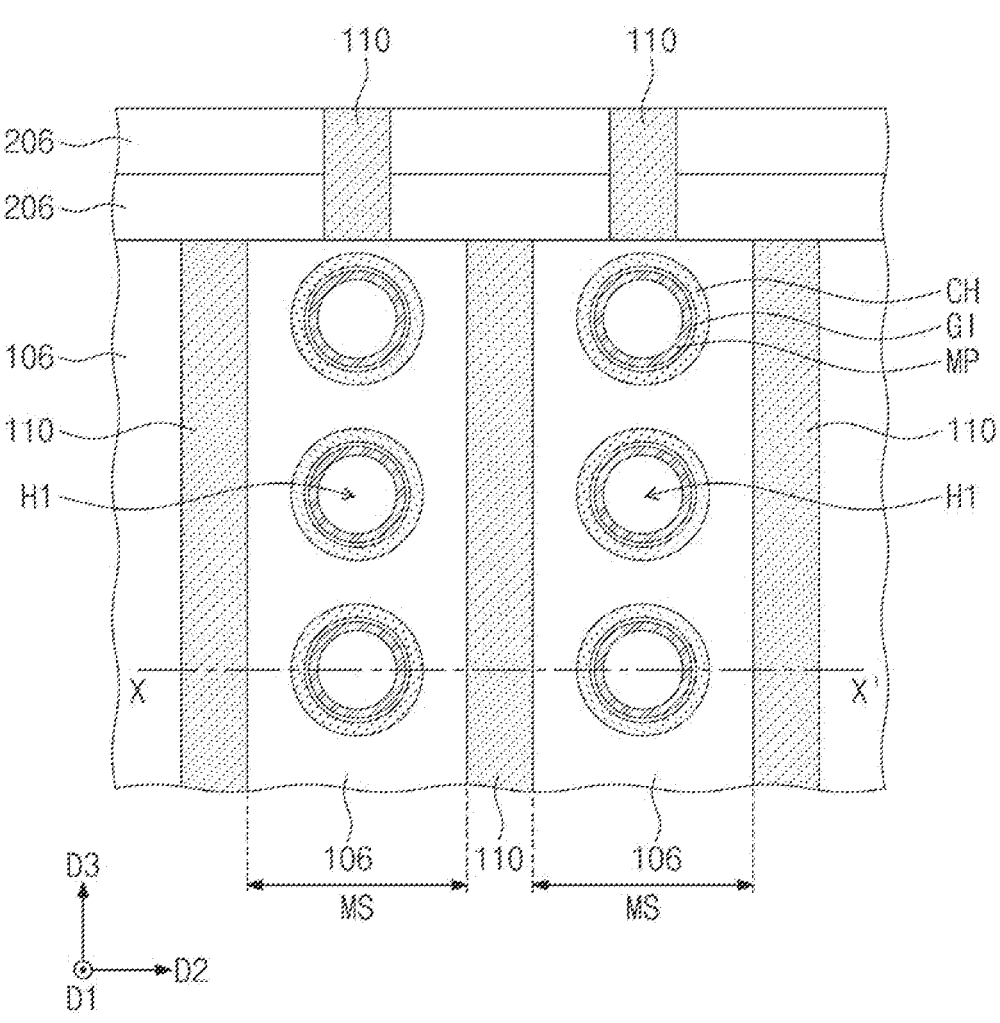
Figure 20:
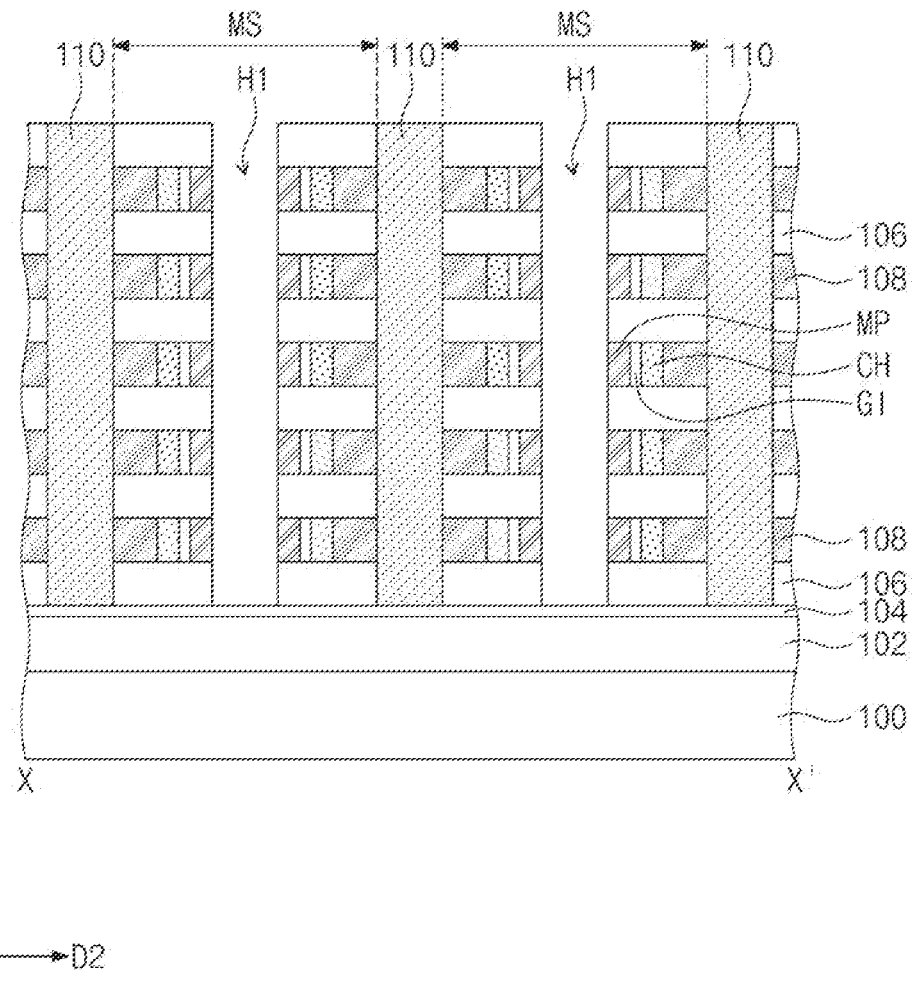

Referring to FIGS. 19 and 20, a plurality of channel patterns CH may be formed in the first recess regions R1, respectively. Each of the channel patterns CH may fill a portion of each of the first recess regions R1. In an embodiment, the formation of the channel patterns CH may include forming a channel layer to fill the first recess regions R1 and a portion of each of the first holes H1, removing the channel layer from the first holes H1, and laterally etching the channel layer until the channel layer has a desired thickness in each of the first recess regions R1.

A plurality of gate insulating patterns GI may be respectively formed in the first recess regions R1 to cover side surfaces of the channel patterns CH, respectively. Each of the gate insulating patterns GI may fill a portion of each of the first recess regions R1. A plurality of metal patterns MP may be respectively formed in the first recess regions R1 to cover side surfaces of the gate insulating patterns GI, respectively. Each of the metal patterns MP may fill a remaining region of each of the first recess regions R1. The gate insulating patterns GI and the metal patterns MP may be formed by substantially the same method as the channel patterns CH.

Figure 21:
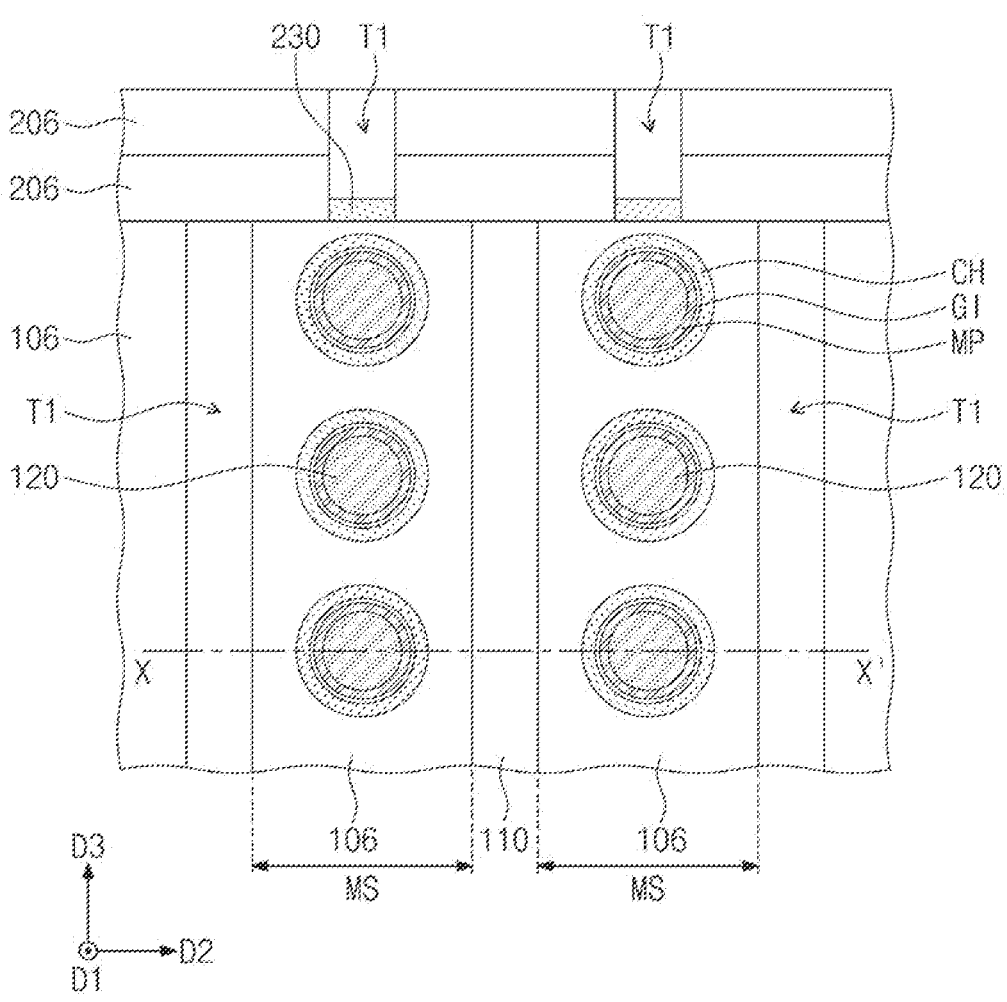
Figure 22:
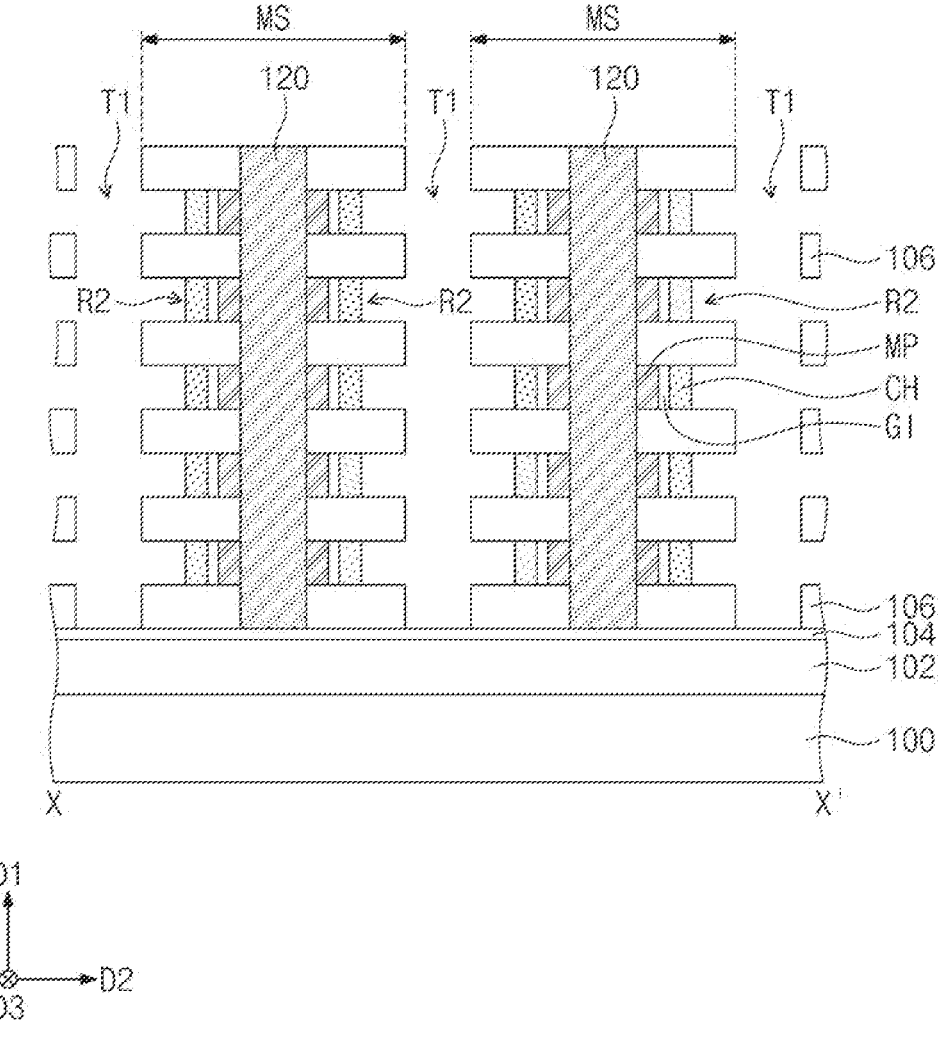

Referring to FIGS. 21 and 22, second sacrificial patterns 120 may be formed in the first holes H1, respectively. The second sacrificial patterns 120 may be formed to fill the first holes H1, respectively. The second sacrificial patterns 120 may be provided in the mold structure MS to be spaced apart from each other in the third direction D3. The second sacrificial patterns 120 may be formed of or include a material having an etch selectivity with respect to the second insulating patterns 108. As an example, each of the second sacrificial patterns 120 may include a silicon oxide layer, which is formed to conformally cover an inner surface of each of the first holes H1 and to fill an upper region of each of the first holes H1, and a silicon nitride layer, which is formed to fill a remaining region of each of the first holes H1.

The first sacrificial patterns 110 may be removed from the first trenches T1. Each of the first trenches T1 on the cell array region CAR may be formed to expose side surfaces of the first and second insulating patterns 106 and 108 of the mold structure MS. Each of the first trenches T1 on the pad region PR may expose side surfaces of the first and second pad insulating patterns 206 and 208.

The exposed side surfaces of the second insulating patterns 108 may be selectively recessed, and thus, second recess regions R2 may be formed in the mold structure MS and between the first pad insulating patterns 206. The formation of the second recess regions R2 may include performing an etching process, which has an etch selectivity with respect to the second insulating patterns 108, to laterally etch the exposed side surfaces of the second insulating patterns 108. The formation of the second recess regions R2 may include performing an etching process, which has an etch selectivity with respect to the second pad insulating patterns 208, to laterally etch the exposed side surfaces of the second pad insulating patterns 208. The second recess regions R2 on the cell array region CAR may expose side surfaces of the channel patterns CH. The second recess regions R2 on the cell array region CAR may be spaced apart from each other in the first direction D1 and may be respectively interposed between the first insulating patterns 106. Each of the second recess regions R2 on the cell array region CAR may have a line shape extending in the third direction D3.

The second recess regions R2 on the pad region PR may be formed below the first pad insulating patterns 206, respectively. Cell insulating patterns 230 may be formed on the pad region PR and in the first trenches T1 between the first pad insulating patterns. The cell insulating patterns 230 may cover a portion of the exposed side surface of the mold structure MS.

Figure 23:
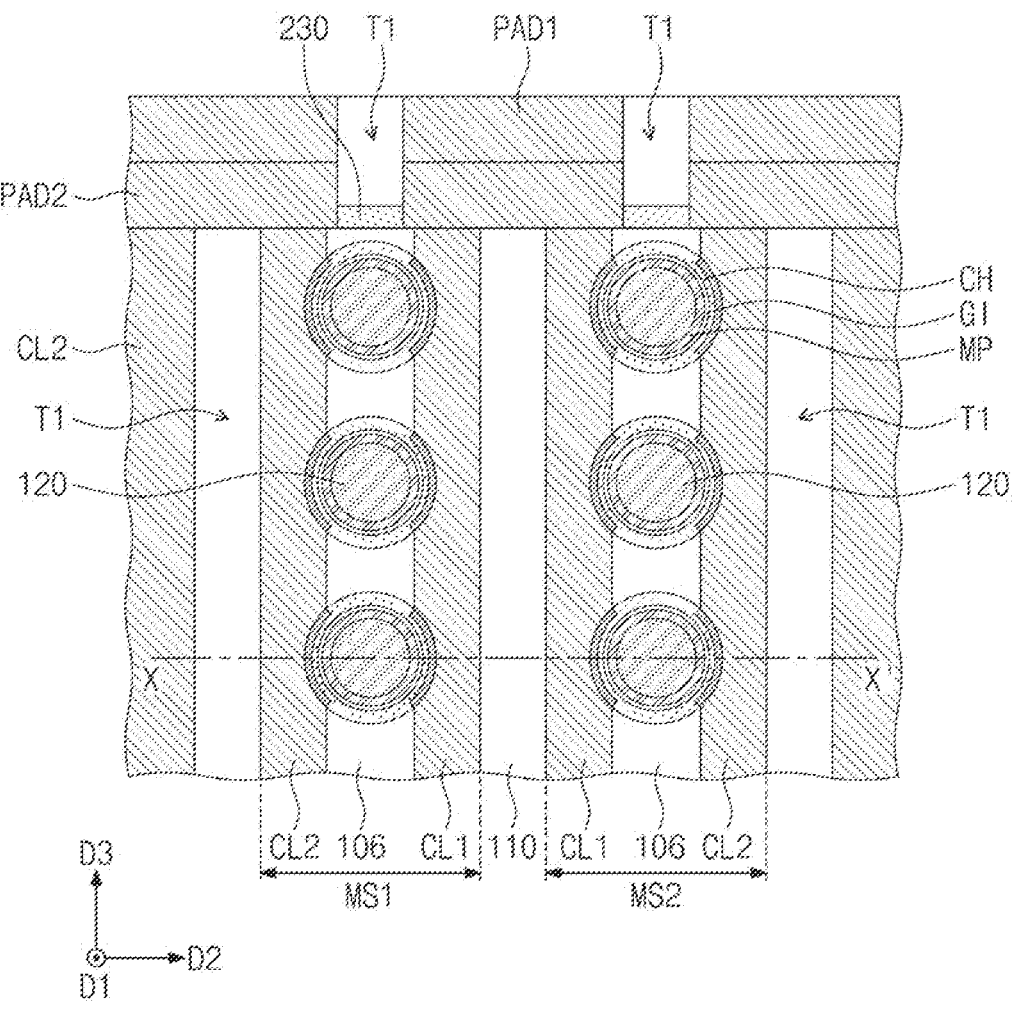
Figure 24:
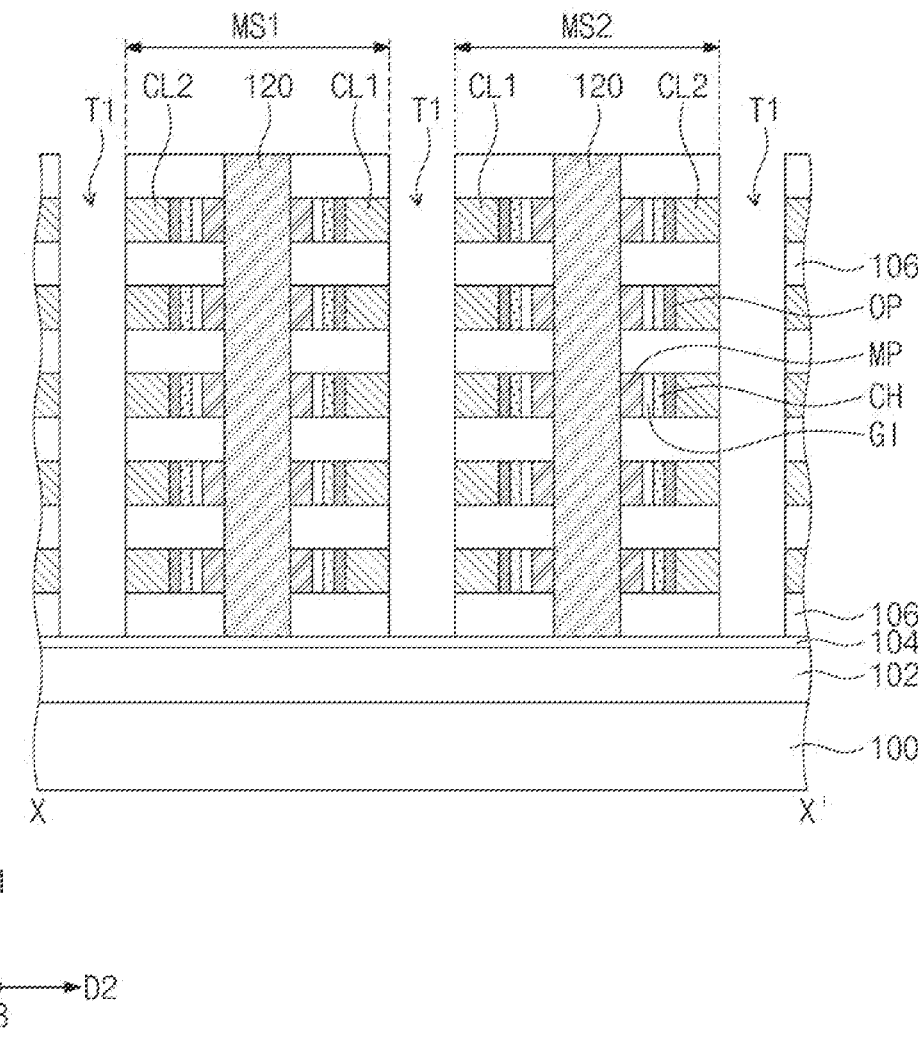

Referring to FIGS. 23 and 24, first conductive lines CL1 and first impurity patterns OP1 may be formed in corresponding ones of the second recess regions R2 on the cell array region CAR. Each of the first impurity patterns OP1 may fill a portion of each of the corresponding second recess regions R2 and may be in contact with a side surface of each of the channel patterns CH. Each of the first conductive lines CL1 may fill a remaining region of each of the corresponding second recess regions R2.

Second conductive lines CL2 and second impurity patterns OP2 may be formed in corresponding ones of the second recess regions R2 on the cell array region CAR. Each of the second impurity patterns OP2 may fill a portion of each of the corresponding second recess regions R2 and may be in contact with an opposite side surface of each of the channel patterns CH. Each of the second conductive lines CL2 may fill a remaining region of each of the corresponding second recess regions R2.

In an embodiment, the formation of the first and second impurity patterns OP1 and OP2 may include doping side surfaces of the channel patterns CH, which are exposed by the second recess regions R2, with impurities. The first and second impurity patterns OP1 and OP2 may have the same conductivity type, and the impurities may be n-type or p-type impurities. In an embodiment, the formation of the first and second conductive lines CL1 and CL2 may include forming a conductive layer to fill remaining portions of the second recess regions R2 and to fill a portion of each of the first trenches T1 and removing the conductive layer from the first trenches T1.

First pads PAD1 and second pads PAD2 may be formed in the second recess regions R2 on the pad region PR. The first pads PAD1 may be connected to the first conductive lines CL1, and the second pads PAD2 may be connected to the second conductive lines CL2. The first pads PAD1 and the second pads PAD2 may be interposed between the first pad insulating patterns 206.

Figure 25:
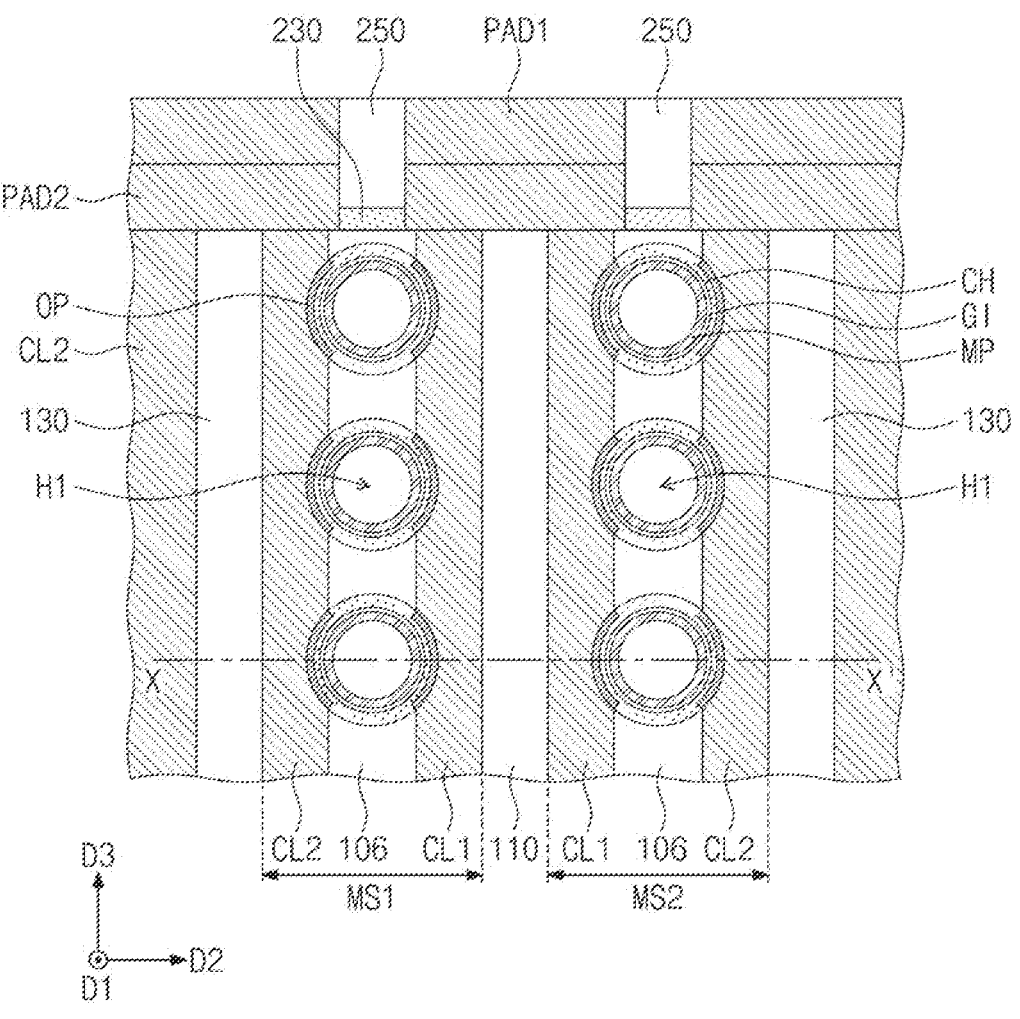
Figure 26:
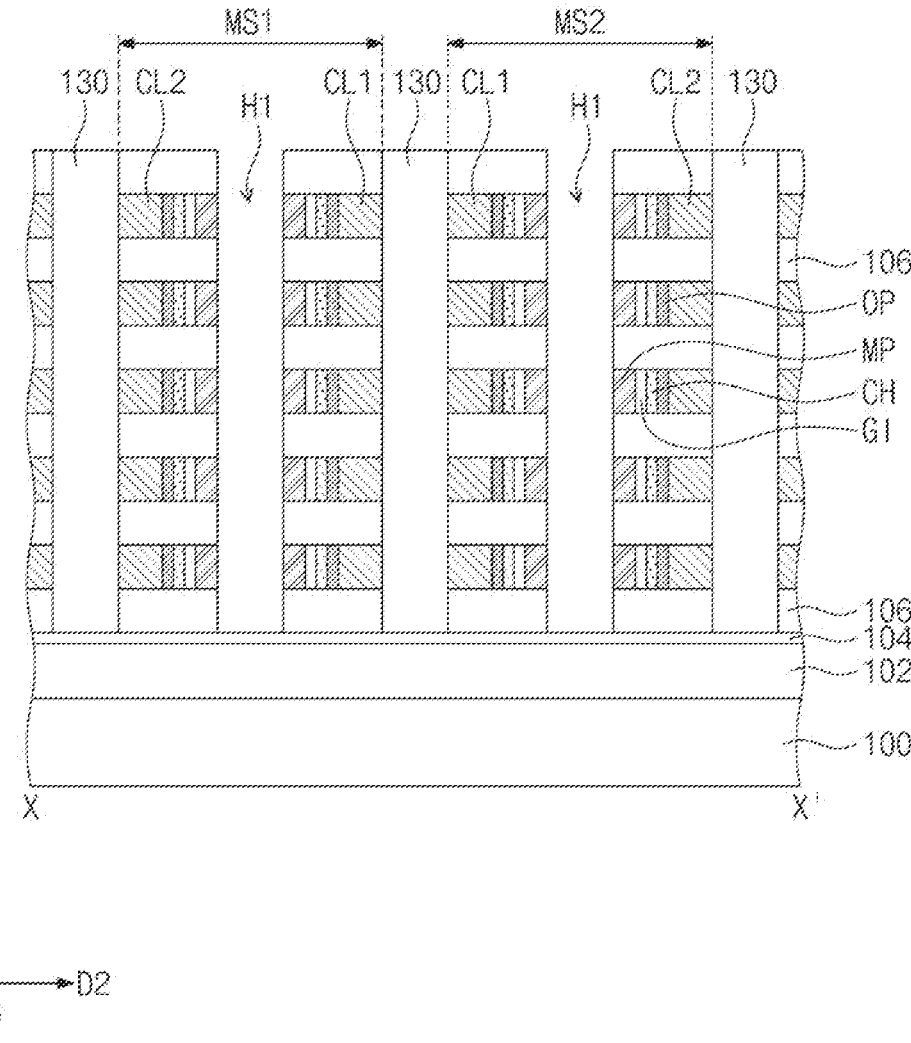

Referring to FIGS. 25 and 26, sidewall insulating patterns 130 may be formed in the first trenches T1, respectively, on the cell array region CAR. The sidewall insulating patterns 130 may be formed to fill the first trenches T1, respectively. The sidewall insulating patterns 130 may be spaced apart from each other in the second direction D2 with the mold structure MS interposed therebetween. One of the sidewall insulating patterns 130 may extend in the first direction D1 to cover side surfaces of the first conductive lines CL1, and another of the sidewall insulating patterns 130 may extend in the first direction D1 to cover side surfaces of the second conductive lines CL2. Each of the sidewall insulating patterns 130 may have a line shape extending in the third direction D3. The second sacrificial patterns 120 may be removed from the first holes H1. Pad separation patterns 250 may be formed in the first trenches T1, respectively, on the pad region PR.

Figure 27:
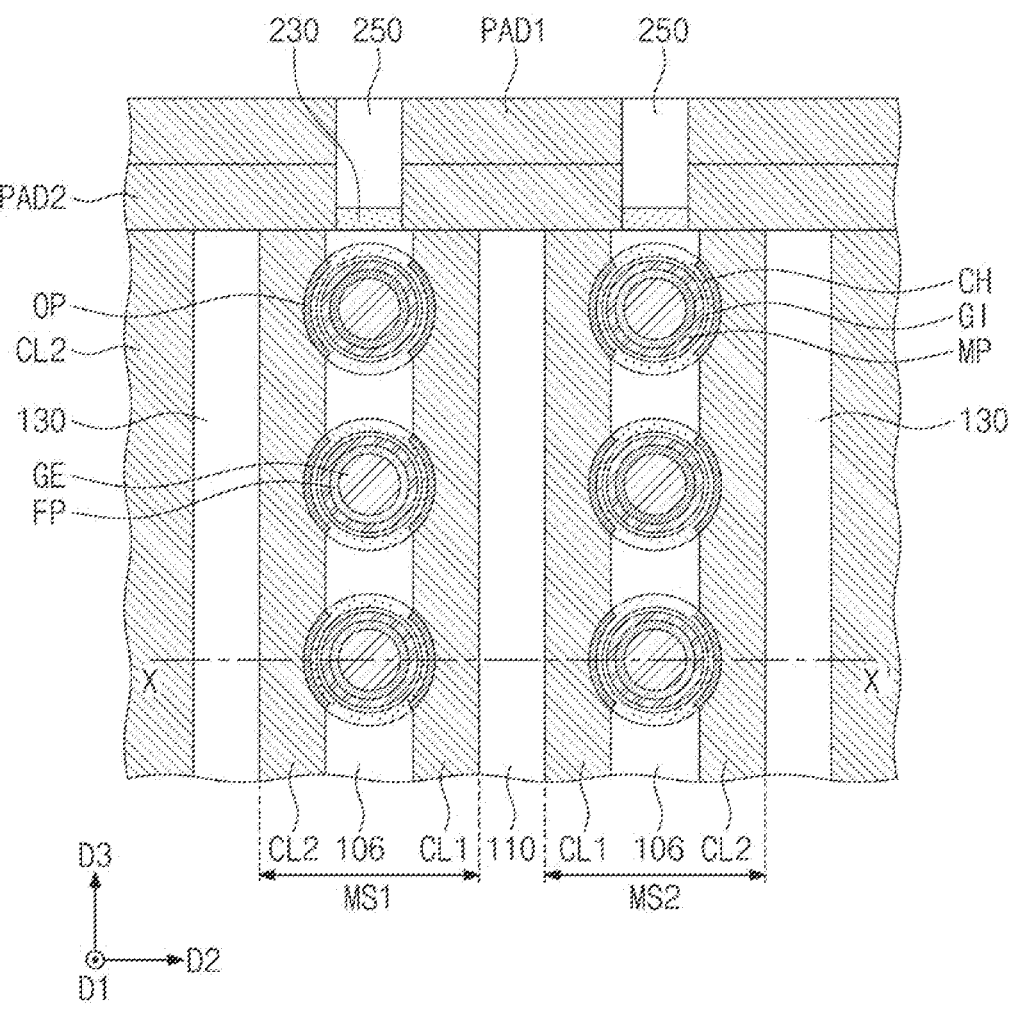
Figure 28:
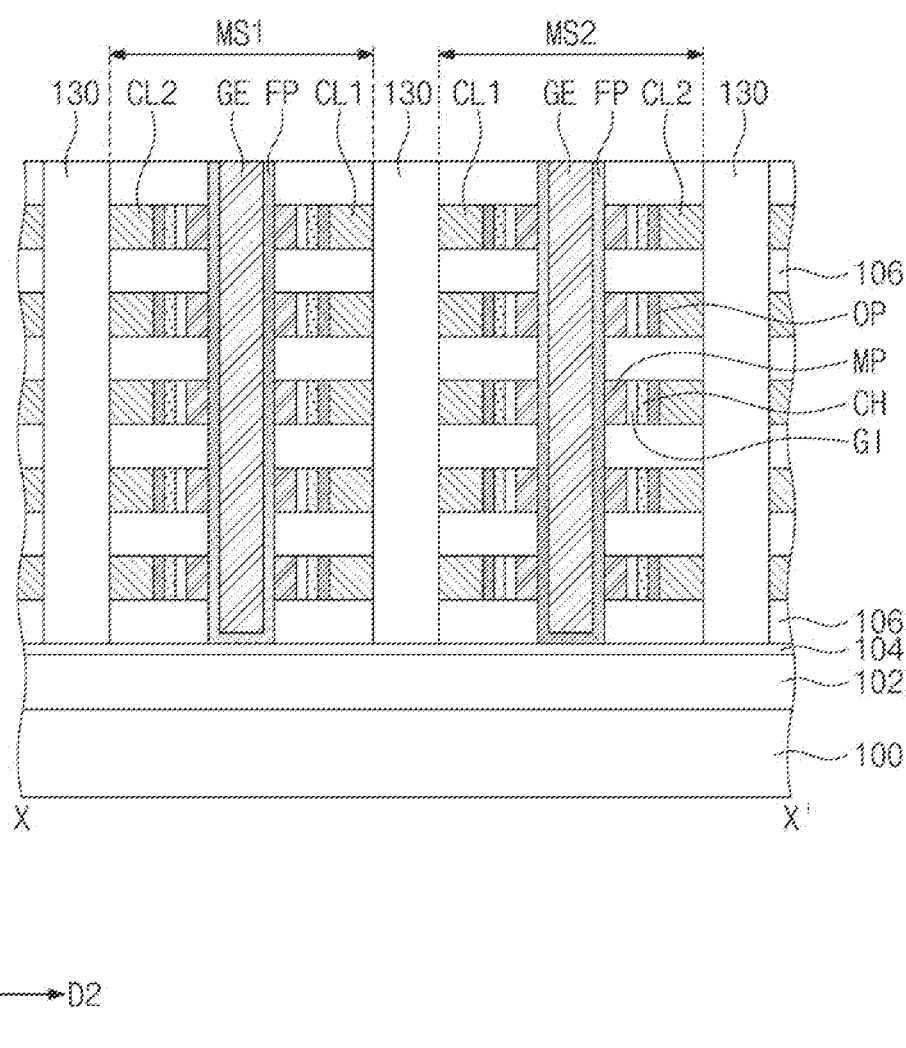

Referring to FIGS. 27 and 28, a ferroelectric pattern FP may be formed in each of the first holes H1. The ferroelectric pattern FP may be formed to fill a portion of each of the first holes H1 and to conformally cover an inner surface of each of the first holes H1. The ferroelectric pattern FP may be formed to cover side surfaces of the metal patterns MP, side surfaces of the first insulating patterns 106, and a top surface of the etch stop layer 104. For example, the ferroelectric pattern FP may contact side surfaces of the metal patterns MP, side surfaces of the first insulating patterns 106, and the top surface of the etch stop layer 104. A gate electrode GE may be formed in each of the first holes H1. The gate electrode GE may be formed to fill a remaining region of each of the first holes H1.

Referring back to FIGS. 1 to 4, the gate electrode GE, the ferroelectric pattern FP, the channel patterns CH, the gate insulating patterns GI, the metal patterns MP, the first and second conductive lines CL1 and CL2, the first and second impurity patterns OP1 and OP2, and the first insulating patterns 106 may constitute a stack SS. The gate contact GC and the third conductive lines CL3 may be formed on the stack SS. The conductive contacts 210 may be formed on the first pads PAD1 and the second pads PAD2. As a result, the semiconductor device may be fabricated.

Figure 29:
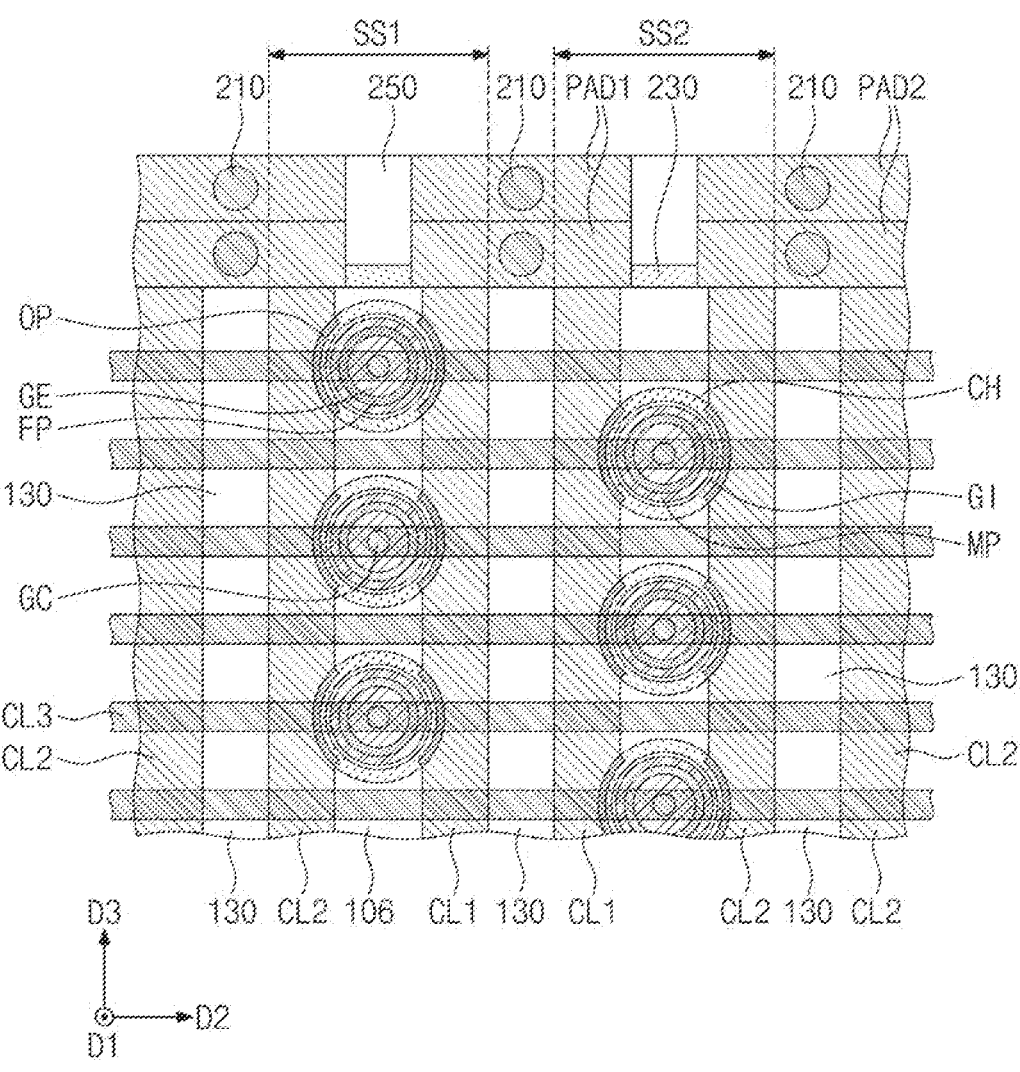
FIGS. 29 and 30 are plan views illustrating a semiconductor device according to example embodiments of the inventive concept.
Figure 30:
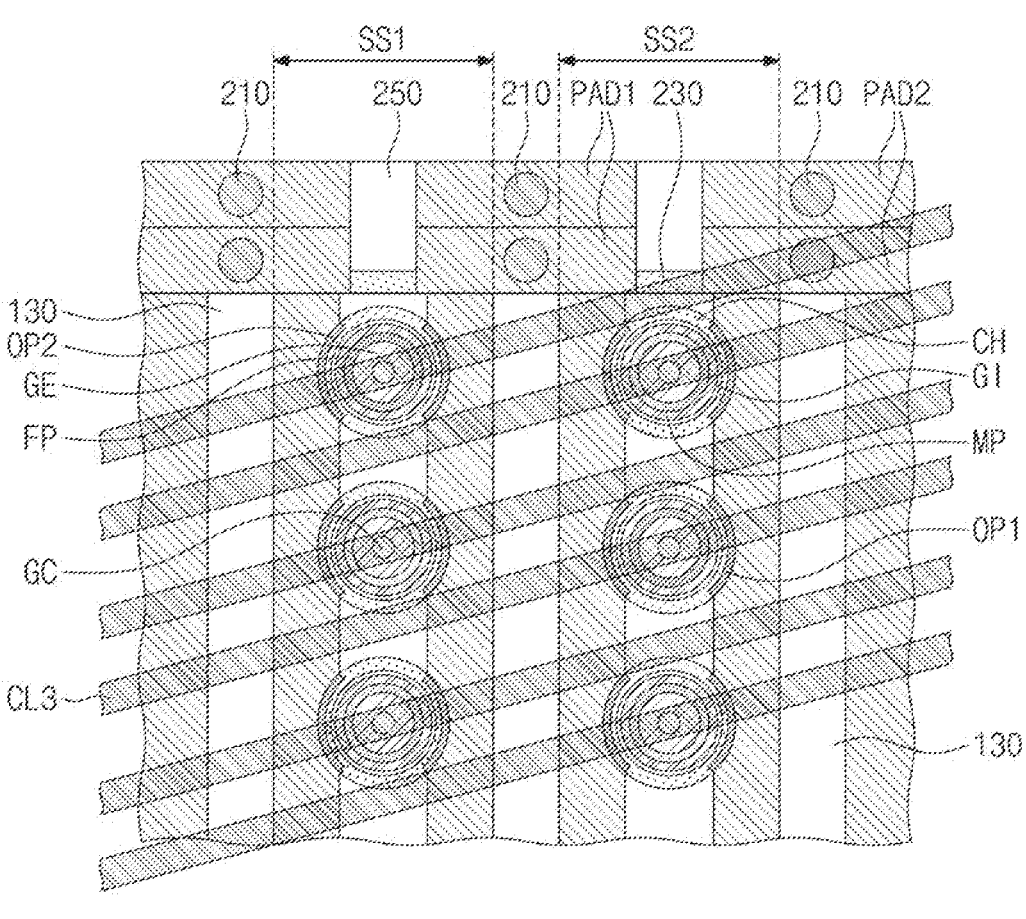

FIGS. 29 and 30 are plan views illustrating a semiconductor device according to example embodiments of the inventive concept. For the sake of brevity, features, which are different from the semiconductor device described with reference to FIGS. 1 to 8, will be mainly described below.

In an example embodiment, as shown in FIG. 29, the gate electrodes GE of the first stack SS1 and the gate electrodes GE of the second stack SS2 may be offset from each other in the third direction D3. For example, the gate electrodes GE of the first stack SS1 and the gate electrodes GE of the second stack SS2 may be disposed in a zigzag shape.

The third conductive lines CL3 may be disposed on the gate electrodes GE. When viewed in a plan view, each of the gate electrodes GE may be overlapped with a corresponding one of the third conductive lines CL3.

In an example embodiment, as shown in FIG. 30, the gate electrodes GE of the first stack SS1 and the gate electrodes GE of the second stack SS2 may be aligned to each other in the second direction D2. The third conductive lines CL3 may be disposed on the gate electrodes GE. The third conductive lines CL3 may extend in a direction that is inclined at an angle to the second direction D2. That is, the third conductive lines CL3 may extend in a direction that is non-parallel to both of the second and third directions D2 and D3. When viewed in a plan view, each of the gate electrodes GE may be overlapped with a corresponding one of the third conductive lines CL3.

Figure 31:
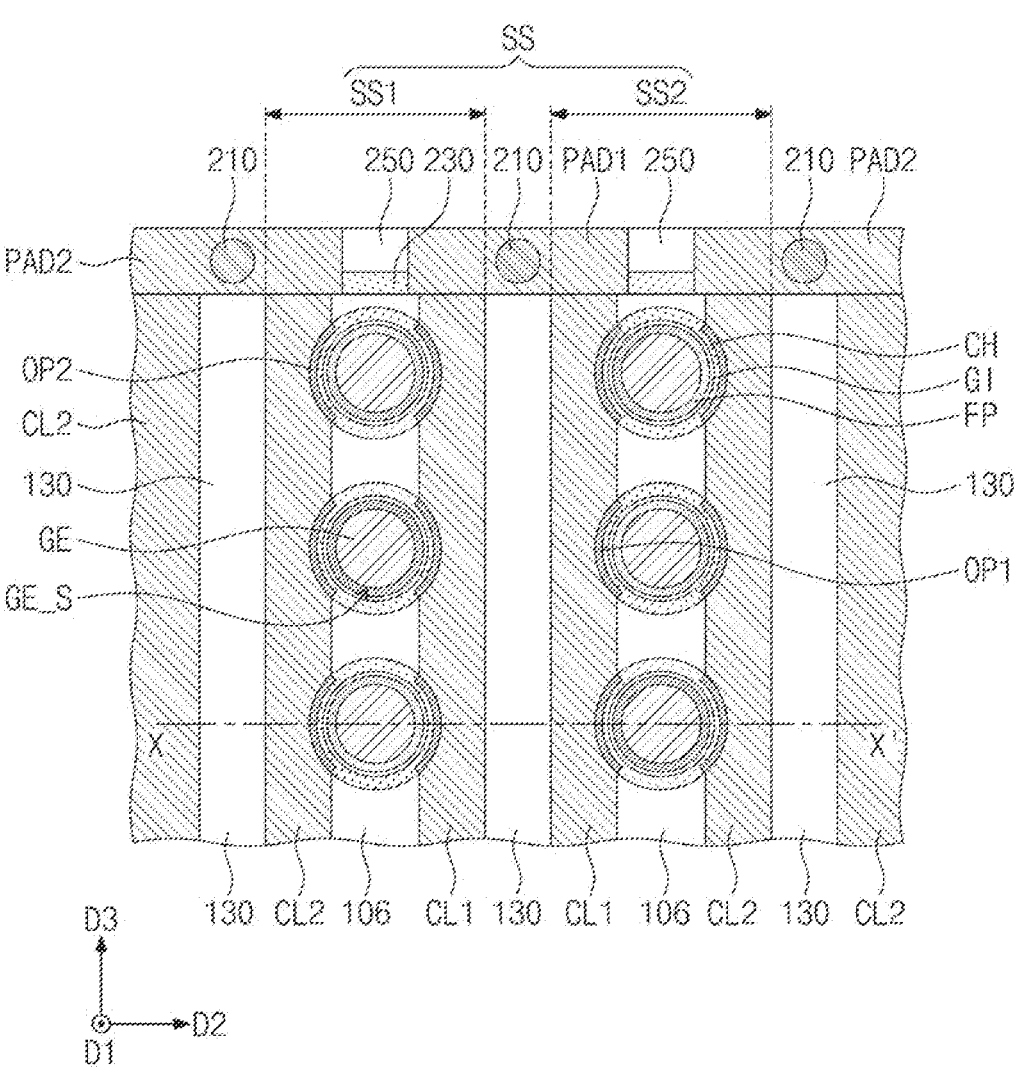
FIG. 31 is a plan view illustrating a semiconductor device according to an example embodiment of the inventive concept.
Figure 32:
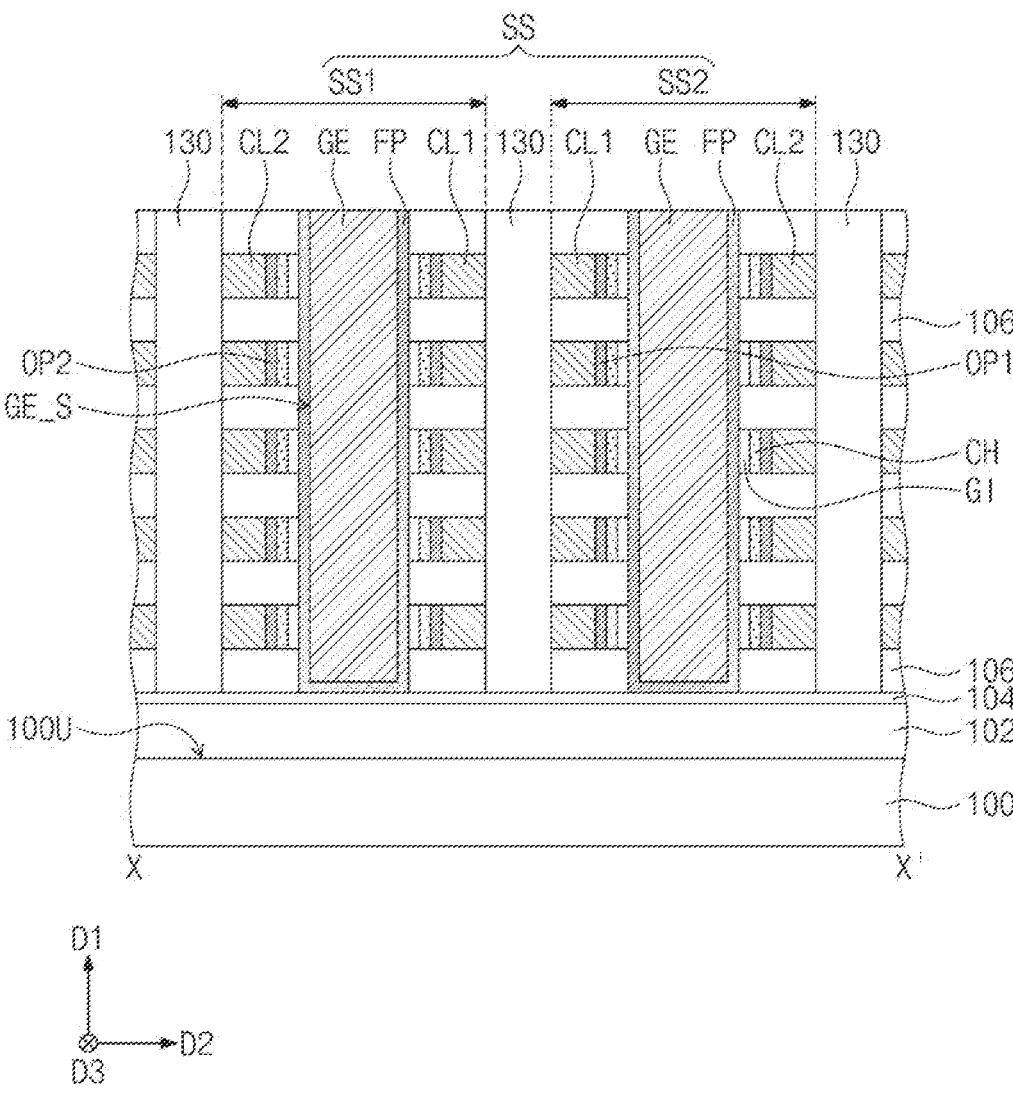
FIG. 32 is a sectional view corresponding to a line X-X' of FIG. 24.

FIG. 31 is a plan view illustrating a semiconductor device according to an example embodiment of the inventive concept. FIG. 32 is a sectional view corresponding to a line X-X' of FIG. 24. For the sake of brevity, features, which are different from the semiconductor device described with reference to FIGS. 1 to 8, will be mainly described below.

Referring to FIGS. 31 and 32, the stack SS may include the channel patterns CH enclosing a side surface GE_S of a corresponding one of the gate electrodes GE, the ferroelectric pattern FP between each of the channel patterns CH and the corresponding gate electrode GE, and the gate insulating pattern GI between each of the channel patterns CH and the ferroelectric pattern FP. According to the present embodiments, the stack SS may not include the metal pattern MP between the ferroelectric pattern FP and the gate insulating pattern GI described with reference to FIGS. 1 to 8. The gate insulating pattern GI may enclose the side surface GE_S of the corresponding gate electrode GE and may be spaced apart from the side surface GE_S of the corresponding gate electrode GE with the ferroelectric pattern FP interposed therebetween. The gate insulating pattern GI may be in contact with a side surface of the ferroelectric pattern FP.

The corresponding gate electrode GE, each of the channel patterns CH enclosing the side surface GE_S of the corresponding gate electrode GE, the ferroelectric pattern FP and the gate insulating pattern GI interposed between each of the channel patterns CH and the corresponding gate electrode GE, and corresponding first and second impurity patterns OP1 and OP2, which are disposed at both sides of each of the channel patterns CH, may constitute a ferroelectric field effect transistor (Fe FET). Except for the afore-described differences, the semiconductor device according to the present embodiments may be configured to have substantially the same features as the semiconductor device described with reference to FIGS. 1 to 8.

Figure 33:
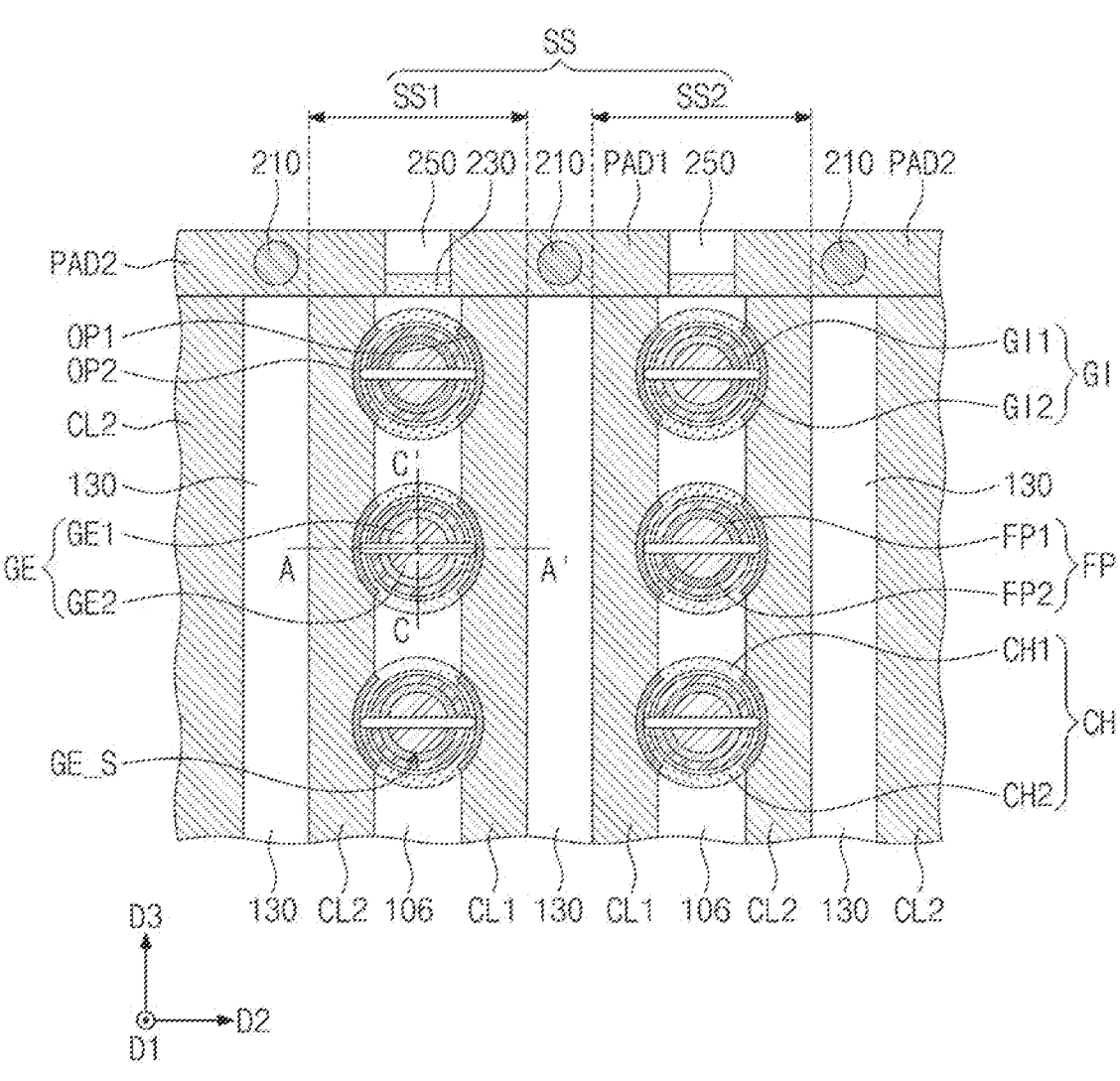
FIG. 33 is a plan view illustrating a semiconductor device according to an example embodiment of the inventive concept.
Figure 34:
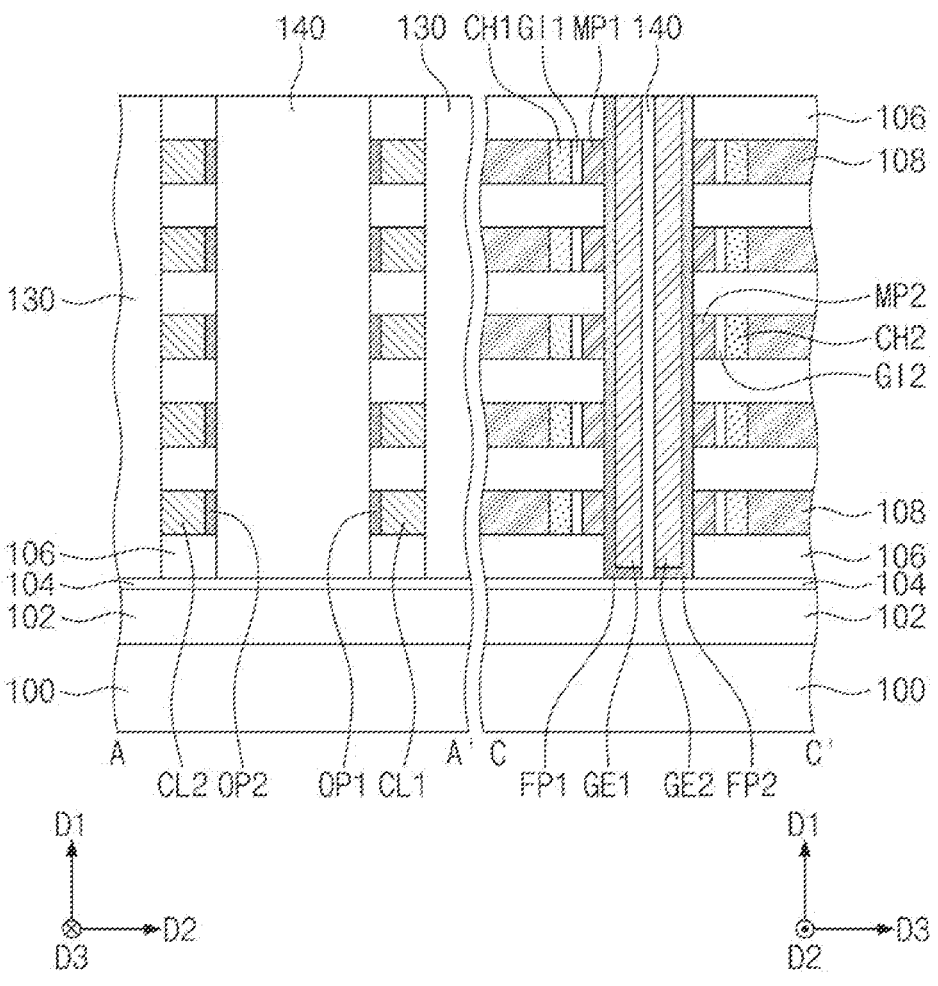
FIG. 34 is a sectional view corresponding to lines A-A' and C-C' of FIG. 33.

FIG. 33 is a plan view illustrating a semiconductor device according to an example embodiment of the inventive concept. FIG. 34 is a sectional view corresponding to lines A-A' and C-C' of FIG. 33. For the sake of brevity, features, which are different from the semiconductor device described with reference to FIGS. 1 to 8, will be mainly described below.

Referring to FIGS. 33 and 34, the stack SS may further include a separation insulating pattern 140, which is provided to penetrate each of the gate electrodes GE. The separation insulating pattern 140 may extend lengthwise in the second direction D2 to penetrate a corresponding one of the gate electrodes GE, the ferroelectric pattern FP, the metal pattern MP, the gate insulating pattern GI, and each of the channel patterns CH. The separation insulating pattern 140 may extend in the first direction D1 to penetrate the corresponding gate electrode GE and a bottom portion of the ferroelectric pattern FP. For example, a top surface of the separation insulating pattern 140 may be coplanar with a top surface of the corresponding gate electrode GE, and a bottom surface of the separation insulating pattern 140 may contact a top surface of the etch stop layer 104. The corresponding gate electrode GE may be divided into a first gate electrode GE1 and a second gate electrode GE2, which are spaced apart from each other in the third direction D3 by the separation insulating pattern 140, and the ferroelectric pattern FP may be divided into a first ferroelectric pattern FP1 and a second ferroelectric pattern FP2, which are spaced apart from each other in the third direction D3 by the separation insulating pattern 140. The metal pattern MP may be divided into a first metal pattern MP1 and a second metal pattern MP2, which are spaced apart from each other in the third direction D3 by the separation insulating pattern 140, and the gate insulating pattern GI may be divided into a first gate insulating pattern GI1 and a second gate insulating pattern GI2, which are spaced apart from each other in the third direction D3 by the separation insulating pattern 140. Each of the channel patterns CH may be divided into a first channel pattern CH1 and a second channel pattern CH2, which are spaced apart from each other in the third direction D3 by the separation insulating pattern 140.

The first gate electrode GE1, the first ferroelectric pattern FP1, the first metal pattern MP1, the first gate insulating pattern GI1, and the first channel pattern CH1 may constitute a first ferroelectric field effect transistor, and the second gate electrode GE2, the second ferroelectric pattern FP2, the second metal pattern MP2, the second gate insulating pattern GI2, and the second channel pattern CH2 may constitute a second ferroelectric field effect transistor. The first ferroelectric field effect transistor and the second ferroelectric field effect transistor may be electrically separated or disconnected from each other by the separation insulating pattern 140. The separation insulating pattern 140 may be formed of or include at least one of silicon oxide, silicon nitride, and/or silicon oxynitride.

The first channel pattern CH1 and the second channel pattern CH2 may be connected to a corresponding one of the first impurity patterns OP1 and may be connected to a corresponding one of the first conductive lines CL1 through the corresponding first impurity pattern OP1. The first channel pattern CH1 and the second channel pattern CH2 may share the corresponding first impurity pattern OP1 and the corresponding first conductive line CL1. The first channel pattern CH1 and the second channel pattern CH2 may be connected to a corresponding one of the second impurity patterns OP2 and may be connected to a corresponding one of the second conductive lines CL2 through the corresponding second impurity pattern OP2. The first channel pattern CH1 and the second channel pattern CH2 may share the corresponding second impurity pattern OP2 and the corresponding second conductive line CL2.

Figure 35:
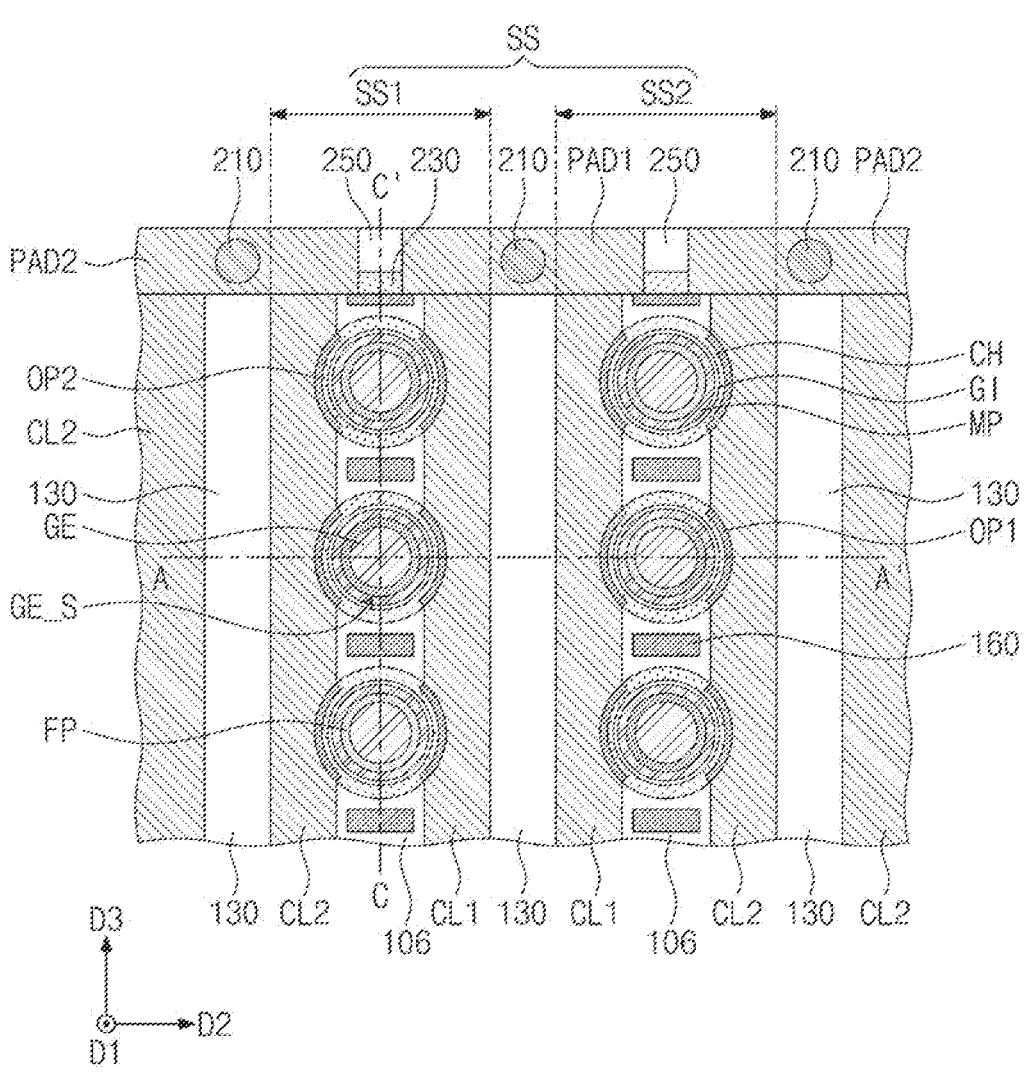
FIG. 35 is a plan view illustrating a semiconductor device according to an example embodiment of the inventive concept.
Figure 36:
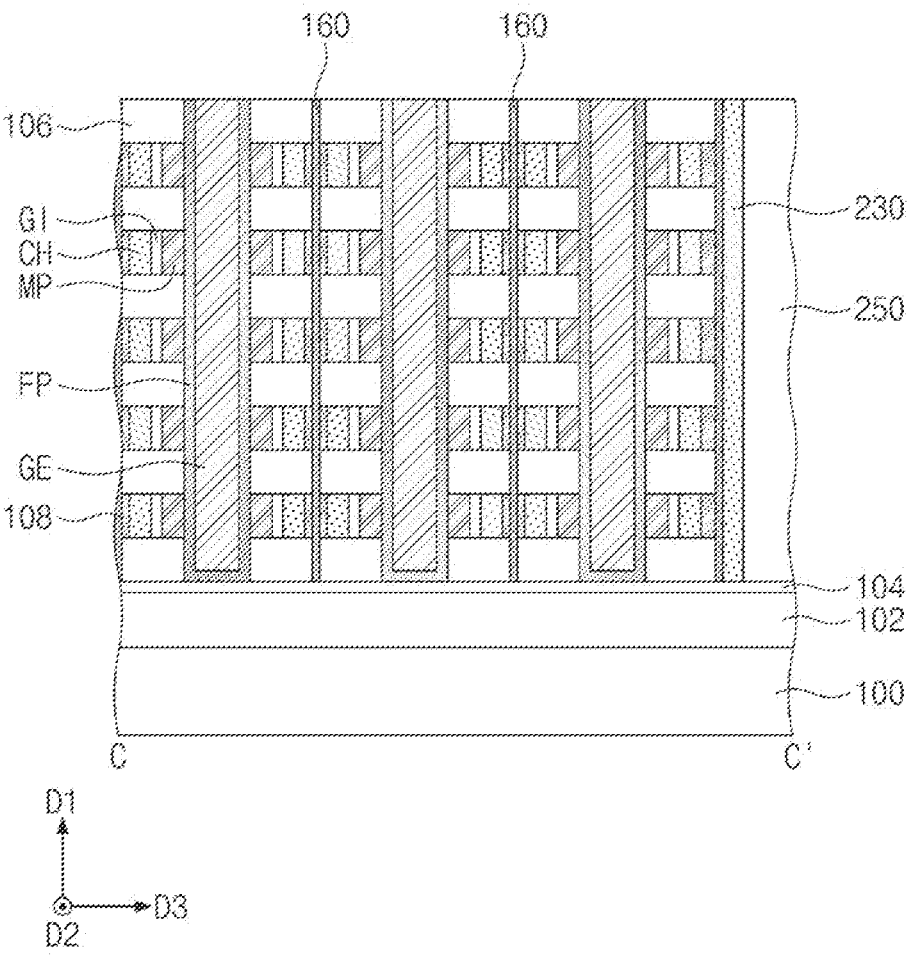
FIG. 36 is a sectional view corresponding to a line C-C' of FIG. 35.

FIG. 35 is a plan view illustrating a semiconductor device according to an example embodiment of the inventive concept. FIG. 36 is a sectional view corresponding to a line C-C' of FIG. 35. A sectional view taken along a line A-A' of FIG. 35 may be substantially the same as that in FIG. 4. For the sake of brevity, features, which are different from the semiconductor device described with reference to FIGS. 1 to 8, will be mainly described below.

Figure 4:
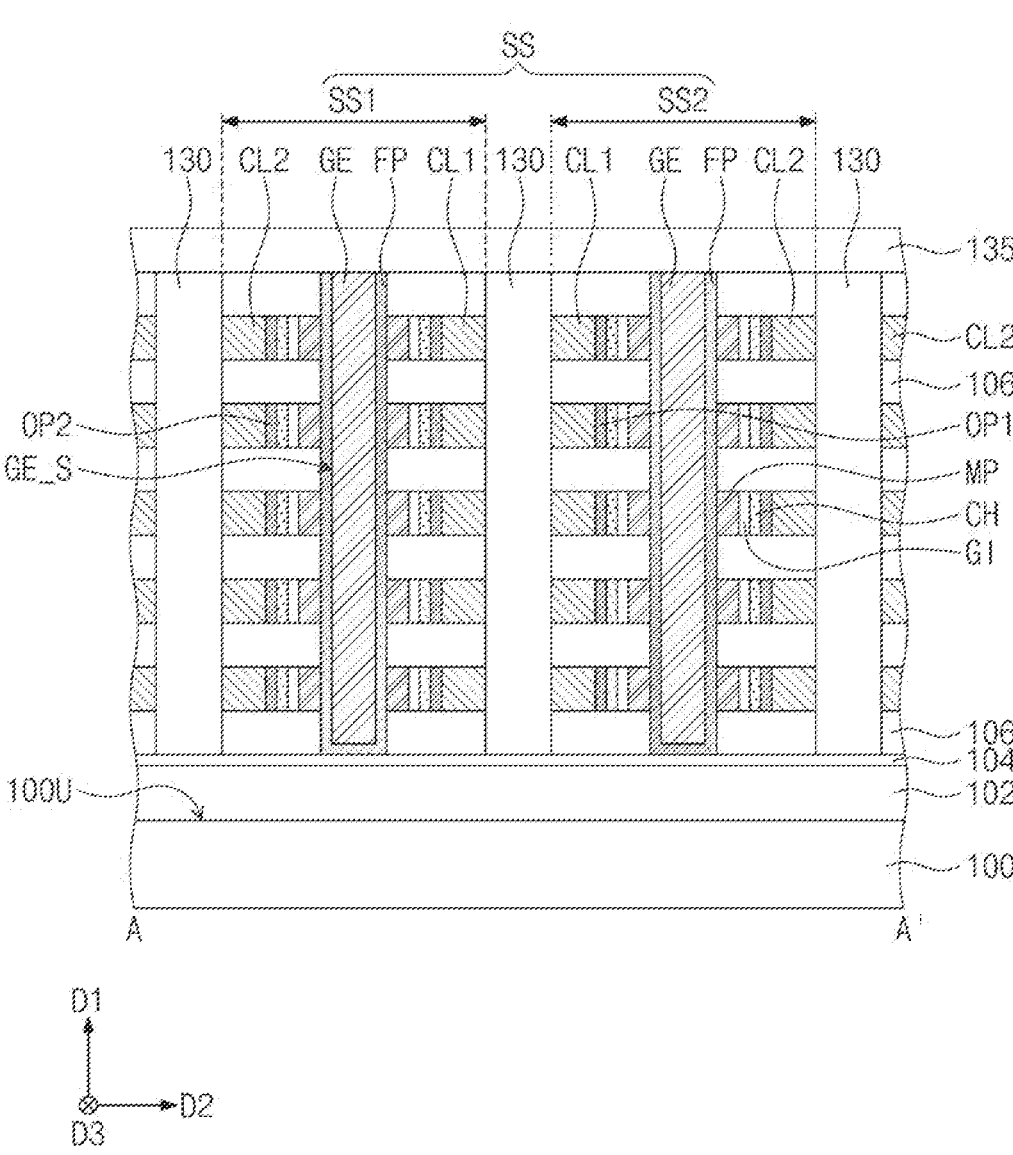
FIGS. 4 to 8 are sectional views, which are respectively taken along lines A-A', B-B', C-C', D-D', and E-E' of FIG. 2 to illustrate a semiconductor device according to an example embodiment of the inventive concept.

Referring to FIGS. 4, 35, and 36, the stack SS may further include shielding lines 160, which are disposed between the first and second conductive lines CL1 and CL2 and are disposed between the gate electrodes GE. The shielding lines 160 and the gate electrodes GE may be alternately arranged in the third direction D3. The shielding lines 160 may extend in the first direction D1 and parallel to the gate electrodes GE. The shielding lines 160 may be disposed between adjacent ones of channel patterns CH, which are respectively provided to enclose side surfaces GE_S of the gate electrodes GE. The stack SS may further include the second insulating patterns 108 between adjacent ones of the channel patterns CH, and in this case, each of the shielding lines 160 may extend in the first direction D1 to penetrate the first insulating patterns 106 and the second insulating patterns 108, which are interposed between the first insulating patterns 106. Some of the shielding lines 160 may be in contact with the cell insulating patterns 230. In example embodiments, top surfaces of the shielding lines 160 may be coplanar with a top surface of the uppermost one of the first insulating patterns 106, and bottom surfaces of the shielding lines 160 may contact a top surface of the etch stop layer 104. The shielding lines 160 may be formed of or include at least one of metallic materials, and a ground voltage may be applied to the shielding lines 160. The shielding lines 160 may be used to prevent an electrical interference issue from occurring between the gate electrodes GE and between adjacent ones of the channel patterns CH.

Figure 37:
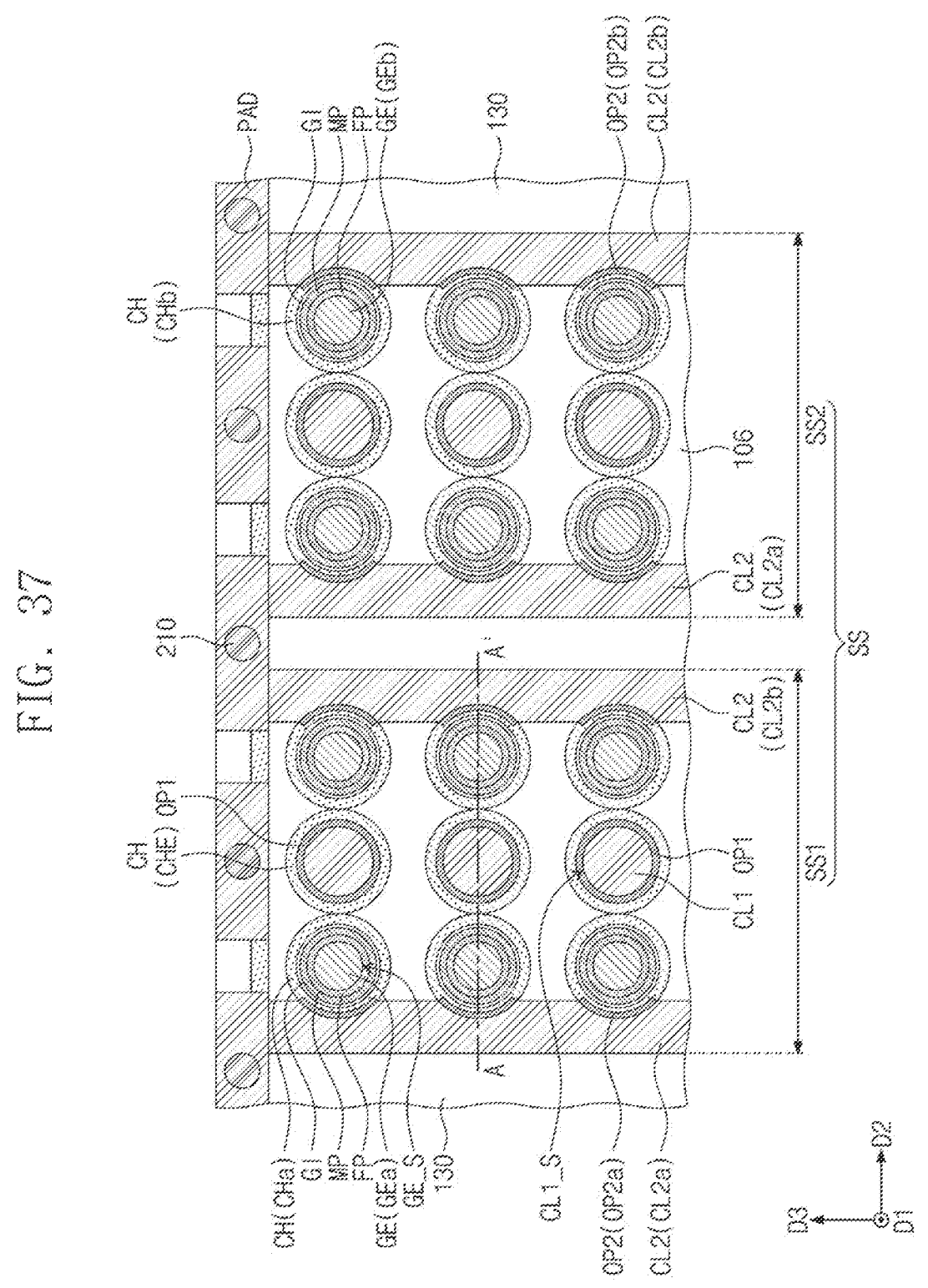
Figure 38:
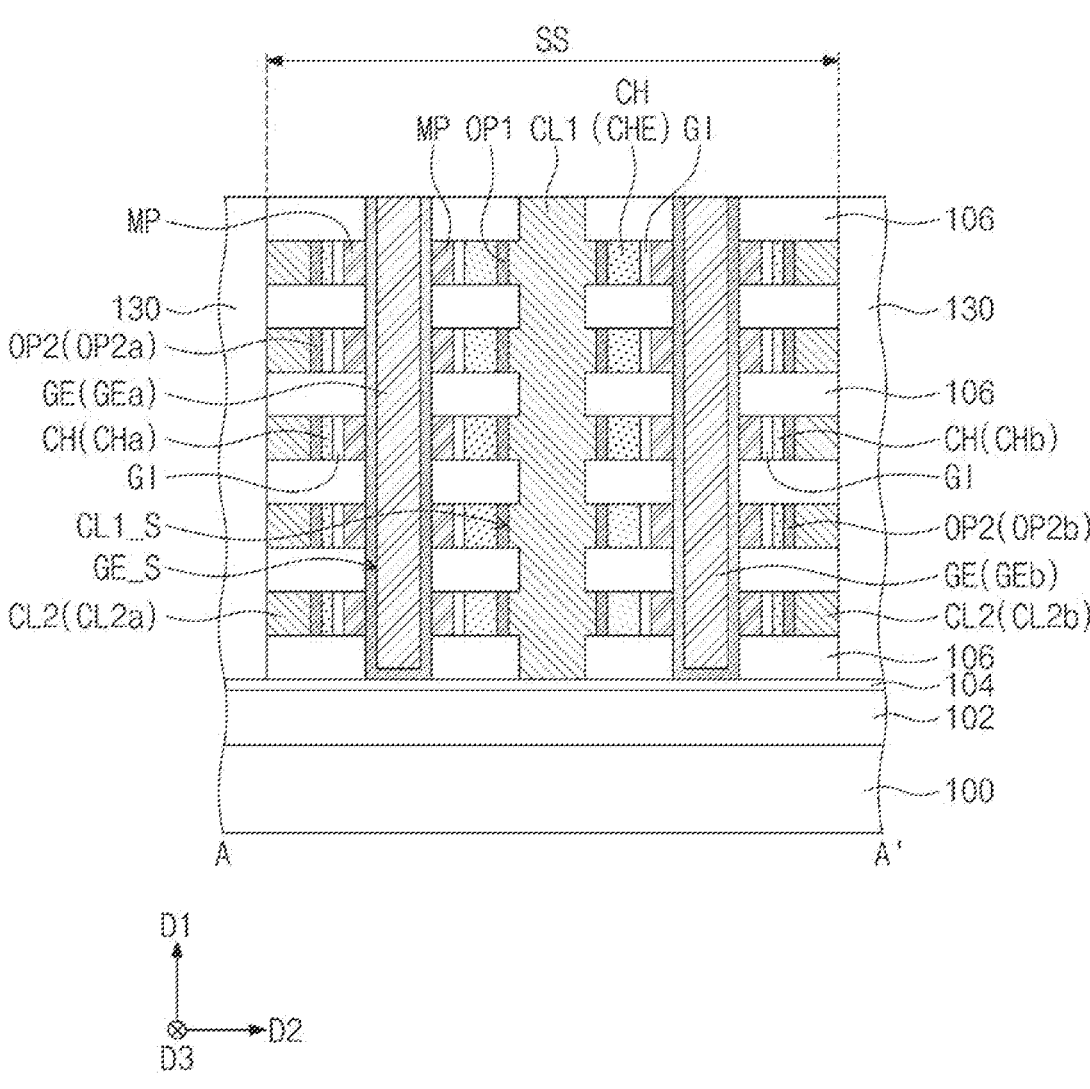
FIG. 38 is a sectional view corresponding to a line A-A' of FIG. 37.

FIG. 37 is a plan view illustrating a semiconductor device according to an example embodiment of the inventive concept. FIG. 38 is a sectional view corresponding to a line A-A' of FIG. 37. For the sake of brevity, features, which are different from the semiconductor device described with reference to FIGS. 1 to 8, will be mainly described below.

Referring to FIGS. 37 and 38, the stack SS may include second conductive lines CL2*a*, which are spaced apart from each other in the first direction D1 and constitute a first column, second conductive lines CL2*b*, which are spaced apart from the second conductive lines CL2*a* of the first column in the second direction D2 and from each other in the first direction D1 and constitute a second column, first conductive lines CL1, which are disposed between the second conductive lines CL2*a* of the first column and the second conductive lines CL2*b* of the second column and are spaced apart from each other in the third direction D3, and gate electrodes GE, which are disposed between the second conductive lines CL2*a* of the first column and the first conductive lines CL1 and between the second conductive lines CL2*b* of the second column and the first conductive lines CL1. The second conductive lines CL2*a* of the first column and the second conductive lines CL2*b* of the second column may extend lengthwise in the third direction D3. The first conductive lines CL1 may extend in the first direction D1 and may be spaced apart from each other in the third direction D3. The gate electrodes GE may extend in the first direction D1. The gate electrodes GE may include gate electrodes GEa of a first column, which are provided between the second conductive lines CL2*a* of the first column and the first conductive lines CL1 and are spaced apart from each other in the third direction D3, and gate electrodes GEb of a second column, which are provided between the second conductive lines CL2*b* of the second column and the first conductive lines CL1 and are spaced apart from each other in the third direction D3.

The stack SS may further include a plurality of channel patterns CH, which are provided to enclose the side surface GE_S of each of the gate electrodes GE. The channel patterns CH may include channel patterns CHa of a first column, which are provided to enclose the side surface GE_S of each of the gate electrodes GEa of the first column and are spaced apart from each other in the first direction D1, and channel patterns CHb of a second column, which are provided to enclose the side surface GE_S of each of the gate electrodes GEb of the second column and are spaced apart from each other in the first direction D1. The channel patterns CH may further include channel extended portions CHE, which are provided to enclose a side surface CL2_S of each of the second conductive lines CL2 and are spaced apart from each other in the first direction D1. The channel extended portions CHE may be disposed between the channel patterns CHa of the first column and the channel patterns CHb of the second column and may connect the channel patterns CHa of the first column to the channel patterns CHb of the second column.

The stack SS may further include the second impurity patterns OP2, which are interposed between the second conductive lines CL2a of the first column and the channel patterns CHa of the first column and between the second conductive lines CL2b of the second column and the channel patterns CHb of the second column. The second impurity patterns OP2 may include second impurity patterns OP2a of a first column, which are respectively interposed between the second conductive lines CL2a of the first column and the channel patterns CHa of the first column and are spaced apart from each other in the first direction D1, and second impurity patterns OP2b of a second column, which are respectively interposed between the second conductive lines CL2b of the second column and the channel patterns CHb of the second column and are spaced apart from each other in the first direction D1. The channel patterns CHa of the first column may be electrically and respectively connected to the second conductive lines CL2a of the first column through the second impurity patterns OP2a of the first column. The channel patterns CHb of the second column may be electrically and respectively connected to the second conductive lines CL2b of the second column through the second impurity patterns OP2b of the second column.

The stack SS may further include the first impurity patterns OP1, which are interposed between each of the first conductive lines CL1 and the channel extended portions CHE. The first impurity patterns OP1 may be spaced apart from each other in the first direction D1 and may be respectively interposed between the channel extended portions CHE and a corresponding one of the first conductive lines CL1. The first impurity patterns OP1 may be provided to enclose a side surface CL1_S of the corresponding first conductive line CL1. The channel extended portions CHE may be spaced apart from the side surface CL1_S of the corresponding first conductive line CL1, with the first impurity patterns OP1 interposed therebetween. The channel patterns CHa of the first column and the channel patterns CHb of the second column may be electrically connected to the corresponding first conductive line CL1 through the channel extended portions CHE and the first impurity patterns OP1.

The stack SS may further include the first insulating patterns 106, which are spaced apart from each other in the first direction D1. The first insulating patterns 106 may be interposed between the channel patterns CHa of the first column, and the channel patterns CHa of the first column may be electrically separated or disconnected from each other by the first insulating patterns 106. The first insulating patterns 106 may extend horizontally (e.g., in the second direction D2) and may be interposed between the channel extended portions CHE. The channel extended portions CHE may be electrically separated or disconnected from each other by the first insulating patterns 106. The first insulating patterns 106 may extend horizontally (e.g., in the second direction D2) and may be interposed between the channel patterns CHb of the second column. The channel patterns CHb of the second column may be electrically separated or disconnected from each other by the first insulating patterns 106. The first insulating patterns 106 may extend into regions between the second impurity patterns OP2a of the first column and between the second conductive lines CL2a of the first column and may enclose the side surface GE_S of each of the gate electrodes GEa of the first column. The first insulating patterns 106 may extend into regions between the second impurity patterns OP2b of the second column and between the second conductive lines CL2b of the second column and may enclose the side surface GE_S of each of the gate electrodes GEb of the second column. The first insulating patterns 106 may extend into a region between the first impurity patterns OP1. The first insulating patterns 106 may enclose the side surface CL1_S of the corresponding first conductive line CL1 and may be in contact with the side surface CL1_S of the corresponding first conductive line CL1.

The sidewall insulating patterns 130 may be disposed on the etch stop layer 104 and at both sides of the stack SS. The sidewall insulating patterns 130 may be spaced apart from each other in the second direction D2 with the stack SS interposed therebetween. The sidewall insulating patterns 130 may extend in the first direction D1 and the third direction D3. One of the sidewall insulating patterns 130 may extend in the first direction D1 to cover side surfaces of the second conductive lines CL2a and the first insulating patterns 106 of the first column and may extend along the side surfaces of the second conductive lines CL2a of the first column and in the third direction D3. Another of the sidewall insulating patterns 130 may extend in the first direction D1 to cover side surfaces of the second conductive lines CL2b and the first insulating patterns 106 of the second column and may extend along the side surfaces of the second conductive lines CL2b of the second column and in the third direction D3.

Each of the pads PAD may be connected to one of the second conductive lines CL2a of the first column and one of the second conductive lines CL2b of the second column. One of the second conductive lines CL2a of the first column and one of the second conductive lines CL2b of the second column may be adjacent to each other.

Figure 39:
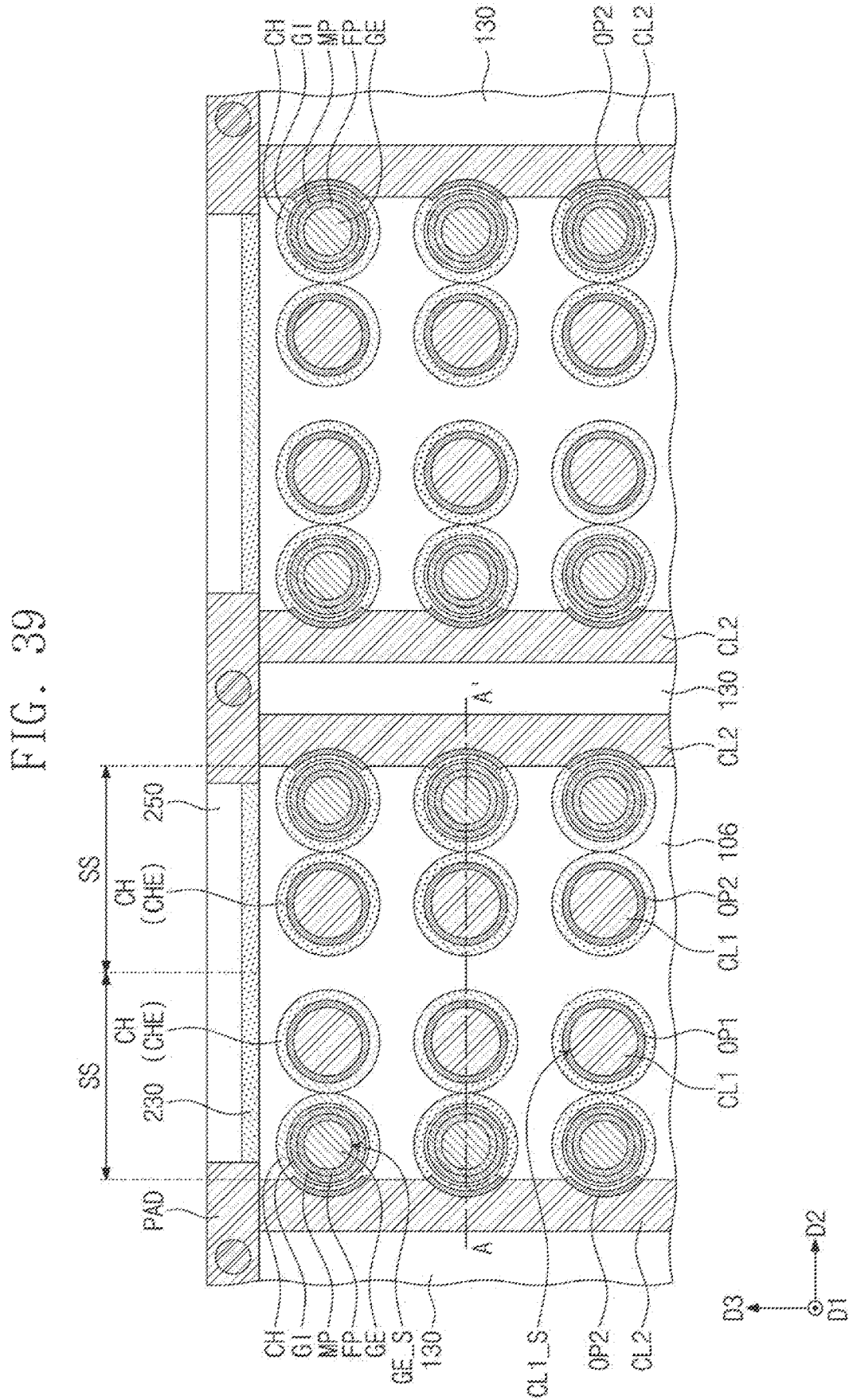
FIG. 39 is a plan view illustrating a semiconductor device according to an example embodiment of the inventive concept.
Figure 40:
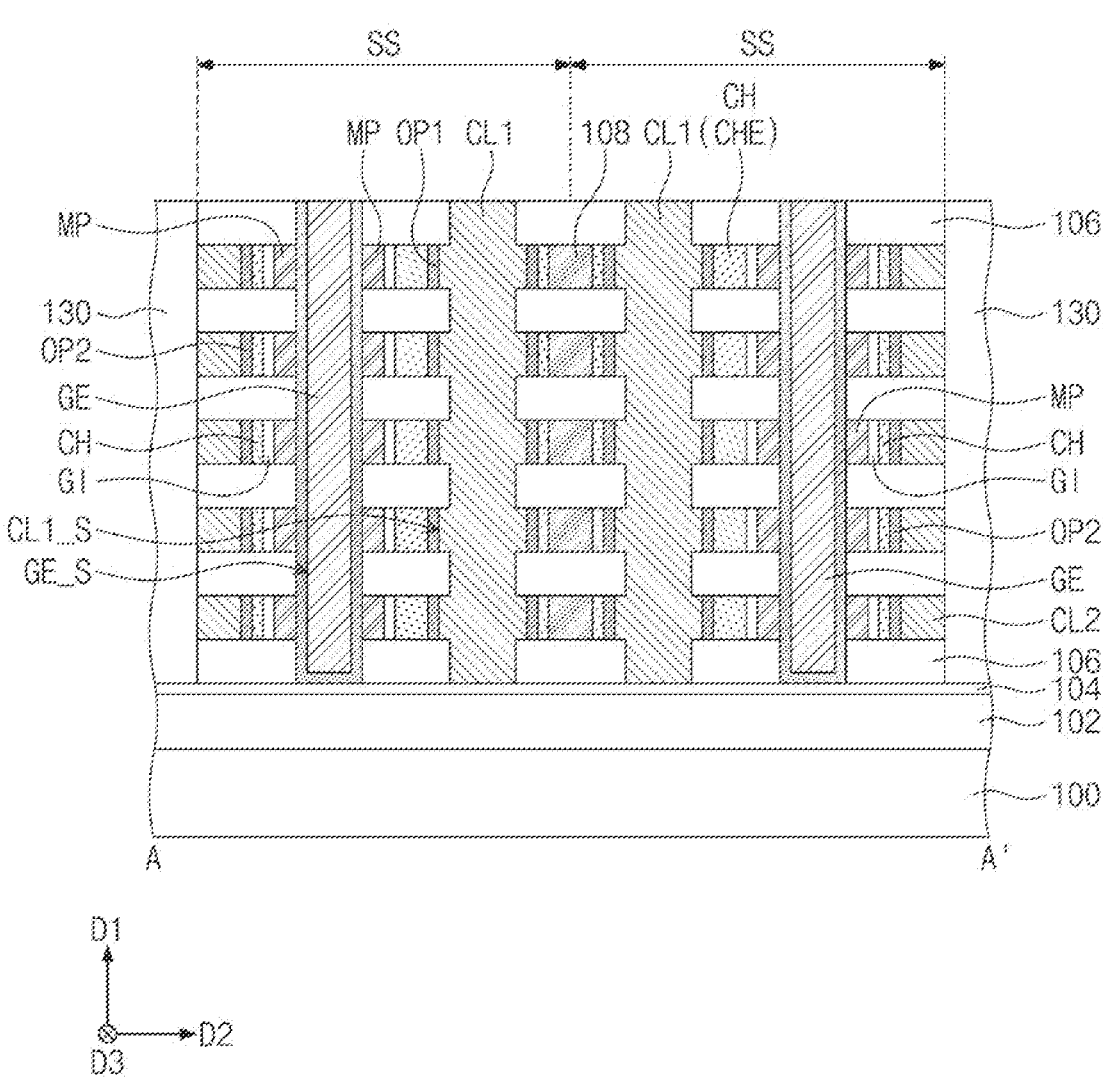
FIG. 40 is a sectional view corresponding to a line A-A' of FIG. 39.

FIG. 39 is a plan view illustrating a semiconductor device according to an example embodiment of the inventive concept. FIG. 40 is a sectional view corresponding to a line A-A' of FIG. 39. For the sake of brevity, features, which are different from the semiconductor device described with reference to FIGS. 1 to 8, will be mainly described below.

Referring to FIGS. 39 and 40, the stack SS may include second conductive lines CL2, which are spaced apart from each other in the first direction D1, first conductive lines CL1, which are spaced apart from the second conductive lines CL2 in the second direction D2, and gate electrodes GE, which are disposed between the first and second conductive lines CL1 and CL2. The second conductive lines CL2 may extend in the third direction D3. The first conductive lines CL1 may extend in the first direction D1 and may be spaced apart from each other in the third direction D3. The gate electrodes GE may be spaced apart from each other in the third direction D3, between the first and second conductive lines CL1 and CL2, and may extend in the first direction D1.

The stack SS may further include a plurality of channel patterns CH, which are provided to enclose the side surface GE_S of each of the gate electrodes GE. The channel patterns CH may be provided to enclose a side surface GE_S of a corresponding one of the gate electrodes GE and may be spaced apart from each other in the first direction D1. The channel patterns CH may extend horizontally (e.g., in the second direction D2) and may enclose the side surface CL1_S of a corresponding one of the first conductive lines CL1. The channel patterns CH may further include the channel extended portions CHE, which are provided to enclose the side surface CL1_S of the corresponding first conductive line CL1 and are spaced apart from each other in the first direction D1.

The stack SS may further include the second impurity patterns OP2 between the second conductive lines CL2 and the channel patterns CH and the first impurity patterns OP1 between the first conductive line CL1 and the channel patterns CH (i.e., the channel extended portions CHE). The second impurity patterns OP2 may be spaced apart from each other in the first direction D1 and may be respectively interposed between the channel patterns CH and the first conductive lines CL1. The first impurity patterns OP1 may be spaced apart from each other in the first direction D1 and may be respectively interposed between the channel patterns CH (i.e., the channel extended portions CHE) and a corresponding one of the first conductive lines CL1. The first impurity patterns OP1 may enclose the side surface CL1_S of the corresponding first conductive line CL1. The channel patterns CH (i.e., the channel extended portions CHE) may be spaced apart from the side surface CL1_S of the corresponding first conductive line CL1 with the first impurity patterns OP1 interposed therebetween. The channel patterns CH may be electrically connected to the second conductive lines CL2, respectively, through the second impurity patterns OP2 and may be electrically connected to the corresponding first conductive line CL1 through the channel extended portions CHE and the first impurity patterns OP1.

Each of the second conductive lines CL2 may extend in the third direction D3 and may be connected to adjacent ones of the channel patterns CH, which are spaced apart from each other in the third direction D3. The adjacent ones of the second impurity patterns OP2, which are spaced apart from each other in the third direction D3, may be disposed between each of the second conductive lines CL2 and the adjacent ones of the channel patterns CH. Each of the second conductive lines CL2 may be electrically connected to the adjacent ones of the channel patterns CH through the adjacent ones of the second impurity patterns OP2. The first conductive lines CL1 may be spaced apart from each other in the third direction D3 and may be respectively connected to the adjacent ones of the channel patterns CH, which are spaced apart from each other in the third direction D3. The adjacent ones of the channel patterns CH may extend in the second direction D2 and may enclose the side surfaces CL1_S of the first conductive lines CL1, respectively. The adjacent ones of the channel patterns CH may include the channel extended portions CHE, which are respectively provided to enclose the side surfaces CL1_S of the first conductive lines CL1 and are adjacent to each other. Adjacent ones of the first impurity patterns OP1, which are spaced apart from each other in the third direction D3, may be respectively disposed between the first conductive lines CL1 and the adjacent ones of the channel extended portions CHE. The adjacent ones of the first impurity patterns OP1 may enclose the side surfaces CL1_S of the first conductive lines CL1, respectively, and the adjacent ones of the channel extended portions CHE may be spaced apart from the side surfaces CL1_S of the first conductive lines CL1 with the adjacent ones of the first impurity patterns OP1 interposed therebetween. The adjacent ones of the channel patterns CH may be electrically and respectively connected to the first conductive lines CL1 through the adjacent ones of the channel extended portions CHE and the adjacent ones of the first impurity patterns OP1.

The stack SS may further include first insulating patterns 106, which are spaced apart from each other in the first direction D1 and are interposed between the channel patterns CH. The first insulating patterns 106 and the channel patterns CH may be alternately stacked in the first direction D1. The channel patterns CH may be electrically separated or disconnected from each other by the first insulating patterns 106. Each of the first insulating patterns 106 may enclose the side surface GE_S of the corresponding gate electrode GE. The first insulating patterns 106 may extend into regions between the second impurity patterns OP2 and between the second conductive lines CL2 and may extend into regions between the first impurity patterns OP1. The first insulating patterns 106 may enclose the side surface CL1_S of the corresponding first conductive line CL1 and may be in contact with the side surface CL1_S of the corresponding first conductive line CL1.

In an embodiment, a pair of stacks SS, which are adjacent to each other in the second direction D2, may be provided. The first conductive lines CL1 in one of the paired stacks SS may face the first conductive lines CL1 in the other of the paired stacks SS. The paired stacks SS may be disposed to be symmetric with respect to each other. The first insulating patterns 106 in the one of the paired stacks SS may extend horizontally (e.g., in the second direction D2) and may be connected to the first insulating patterns 106 in the other of the paired stacks SS. The second insulating patterns 108 may be interposed between the channel extended portions CHE, which are respectively included in the paired stacks SS.

The sidewall insulating patterns 130 may be spaced apart from each other in the second direction D2 with the paired stacks SS interposed therebetween. One of the sidewall insulating patterns 130 may extend in the first direction D1 to cover side surfaces of the first conductive lines CL1 and the first insulating patterns 106 in the one of the paired stacks SS. Another one of the sidewall insulating patterns 130 may extend in the first direction D1 to cover side surfaces of the second conductive lines CL2 and the first insulating patterns 106 in the other of the paired stacks SS.

The paired stacks SS and other paired stacks SS may be spaced apart from each other in the second direction D2, with the sidewall insulating pattern 130 interposed therebetween. Each of the pads PAD may be connected in common to one of the second conductive lines CL2 of the paired stacks SS and one of the second conductive lines CL2 of the other paired stacks SS. Each of the pads PAD may connect one of the second conductive lines CL2 of the paired stacks SS to one of the second conductive lines CL2 of the other paired stacks SS.

Figure 41:
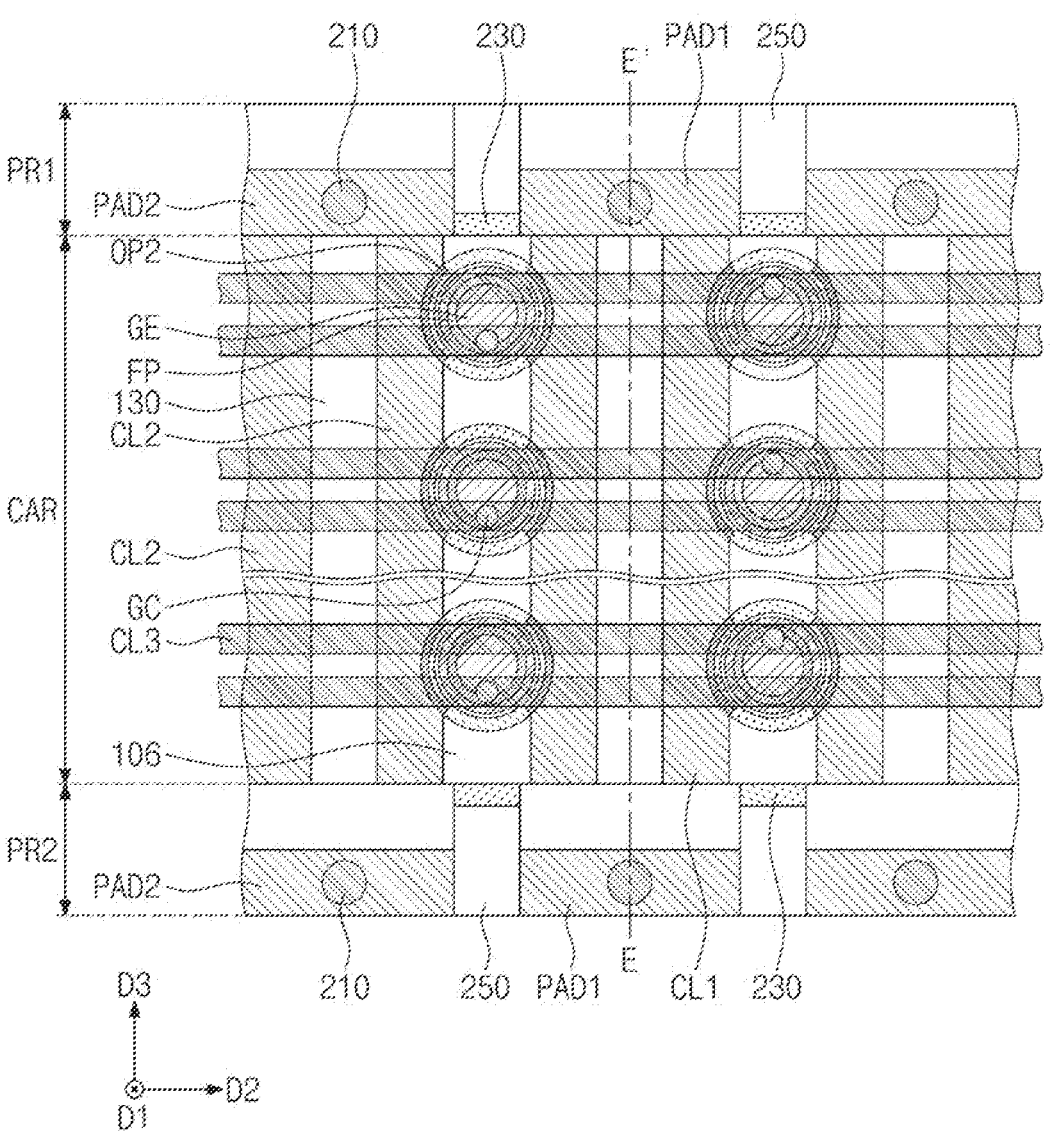
FIG. 41 is a plan view illustrating a semiconductor device according to an example embodiment of the inventive concept.
Figure 42:
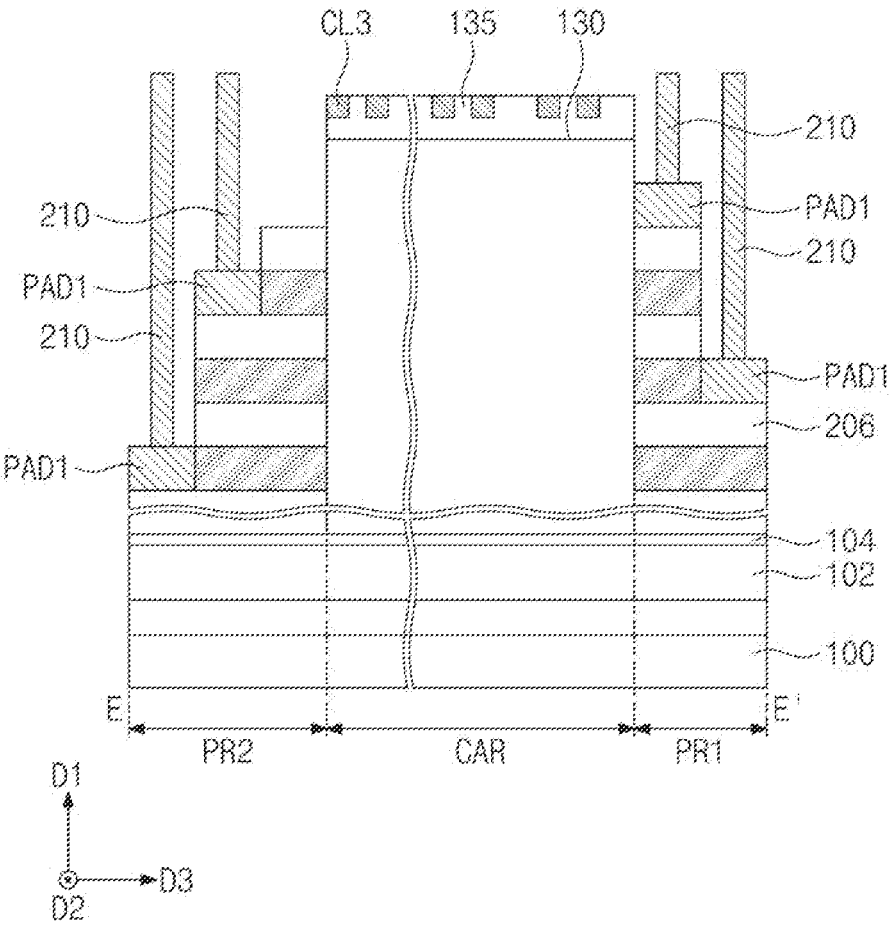
FIG. 42 is a sectional view corresponding to a line E-E' of FIG. 41.

FIG. 41 is a plan view illustrating a semiconductor device according to an example embodiment of the inventive concept. FIG. 42 is a sectional view corresponding to a line E-E' of FIG. 41. For the sake of brevity, features, which are different from the semiconductor device described with reference to FIGS. 1 to 8, will be mainly described below.

Referring to FIGS. 41 and 42, the pad region PR may include a first pad region PR1 and a second pad region PR2. The first pad region PR1 and the second pad region PR2 may be spaced apart from each other in the third direction D3, and the cell array region CAR may be interposed between the first pad region PR1 and the second pad region PR2.

The first pads PAD1 may be spaced apart from each other in the first direction D1. Here, the first pads PAD1 may be alternately disposed in the second pad region PR2 and the first pad region PR1, as a distance from the top surface of the substrate 100 increases. For example, among the first pads PAD1, a pad closest to the substrate 100 may be disposed in the second pad region PR2, and a pad next closest to the substrate 100 may be disposed in the first pad region PR1.

Figure 43:
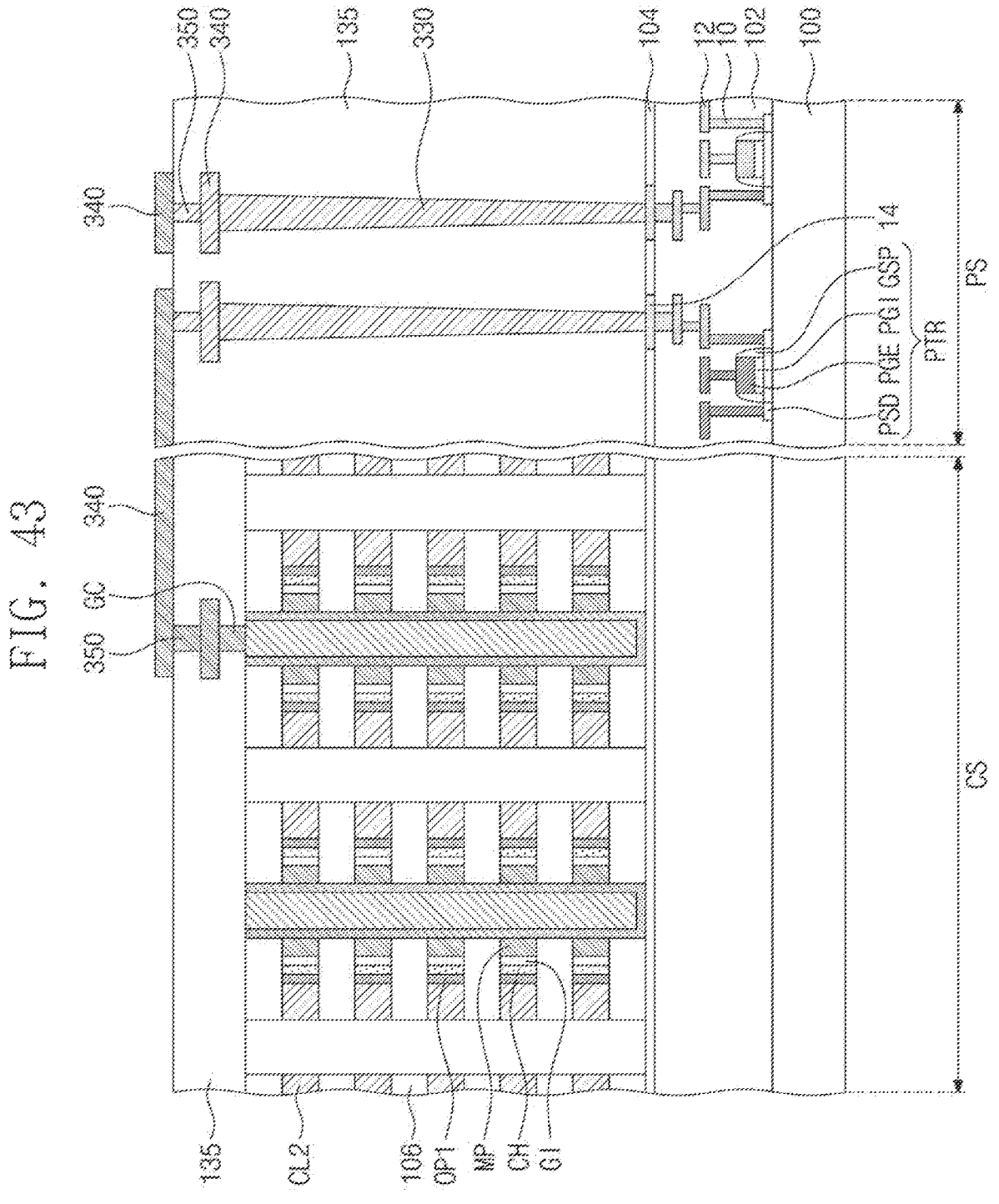
FIGS. 43 to 45 are sectional views illustrating a semiconductor device according to an example embodiment of the inventive concept.

FIG. 43 is a sectional view illustrating a semiconductor device according to an example embodiment of the inventive concept. For the sake of brevity, features, which are different from the semiconductor device described with reference to FIGS. 1 to 8, will be mainly described below.

Referring to FIG. 43, a peripheral circuit structure PS and a cell structure CS may be provided on the substrate 100. The cell structure CS may include the interlayer insulating layer 102, the etch stop layer 104, the stack SS, and the sidewall insulating patterns 130 described with reference to FIGS. 1 to 8. The peripheral circuit structure PS may include peripheral transistors PTR, which are integrated on the substrate 100, and peripheral contacts and peripheral lines 12, which are connected to the peripheral transistors PTR.

Each of the peripheral transistors PTR may include a peripheral gate electrode PGE on the substrate 100, a peripheral gate insulating pattern PGI between the substrate 100 and the peripheral gate electrode PGE, gate spacers GSP on opposite side surfaces of the peripheral gate electrode PGE, and peripheral source/drain regions PSD at both sides of the peripheral gate electrode PGE. The peripheral circuit structure PS may further include the peripheral contacts 10 and the peripheral lines 12, which are disposed in the interlayer insulating layer 102 and are connected to the peripheral source/drain regions PSD and the peripheral gate electrode PGE.

The peripheral circuit structure PS may be disposed at a side of the cell structure CS. The interlayer insulating layer 102 may extend horizontally (e.g., in the second direction D2) to cover the peripheral transistors PTR, the peripheral contacts 10, and the peripheral lines 12, and the etch stop layer 104 may extend along a top surface of the interlayer insulating layer 102. The peripheral transistors PTR may be offset from the stack SS of the cell structure CS horizontally (e.g., in the second direction D2) and may not be overlapped with the stack SS vertically (e.g., in the first direction D1).

The cell structure CS may further include an upper insulating layer 135, which is provided on the stack SS, and a gate contact GC, upper contacts 350, and upper interconnection lines 340, which are provided in the upper insulating layer 135. The gate contact GC may be connected to the upper contacts 350 and the upper interconnection lines 340.

The peripheral circuit structure PS may further include peripheral contact plugs 330 and peripheral pads 14, which are connected to each other. Each of the peripheral pads 14 may be provided to penetrate the etch stop layer 104 and may be connected to a corresponding one of the peripheral contact plugs 330. The peripheral pads 14 may be electrically connected to the peripheral transistors PTR through the peripheral contacts 10 and the peripheral lines 12. The upper insulating layer 135 may extend to a region on the peripheral circuit structure PS and may cover the peripheral contact plugs 330 and the peripheral pads 14. The upper contacts 350 and the upper interconnection lines 340 may be disposed in the upper insulating layer 135 on the peripheral circuit structure PS. The peripheral contact plugs 330 may be provided to penetrate at least a portion of the upper insulating layer 135 and may be connected to the upper contacts 350 and the upper interconnection lines 340. The gate electrodes GE of the stack SS may be electrically connected to the peripheral transistors PTR through the gate contact GC, the upper contacts 350, the upper interconnection lines 340, the peripheral contact plugs 330, the peripheral pads 14, the peripheral contacts 10, and the peripheral lines 12.

Figure 44:
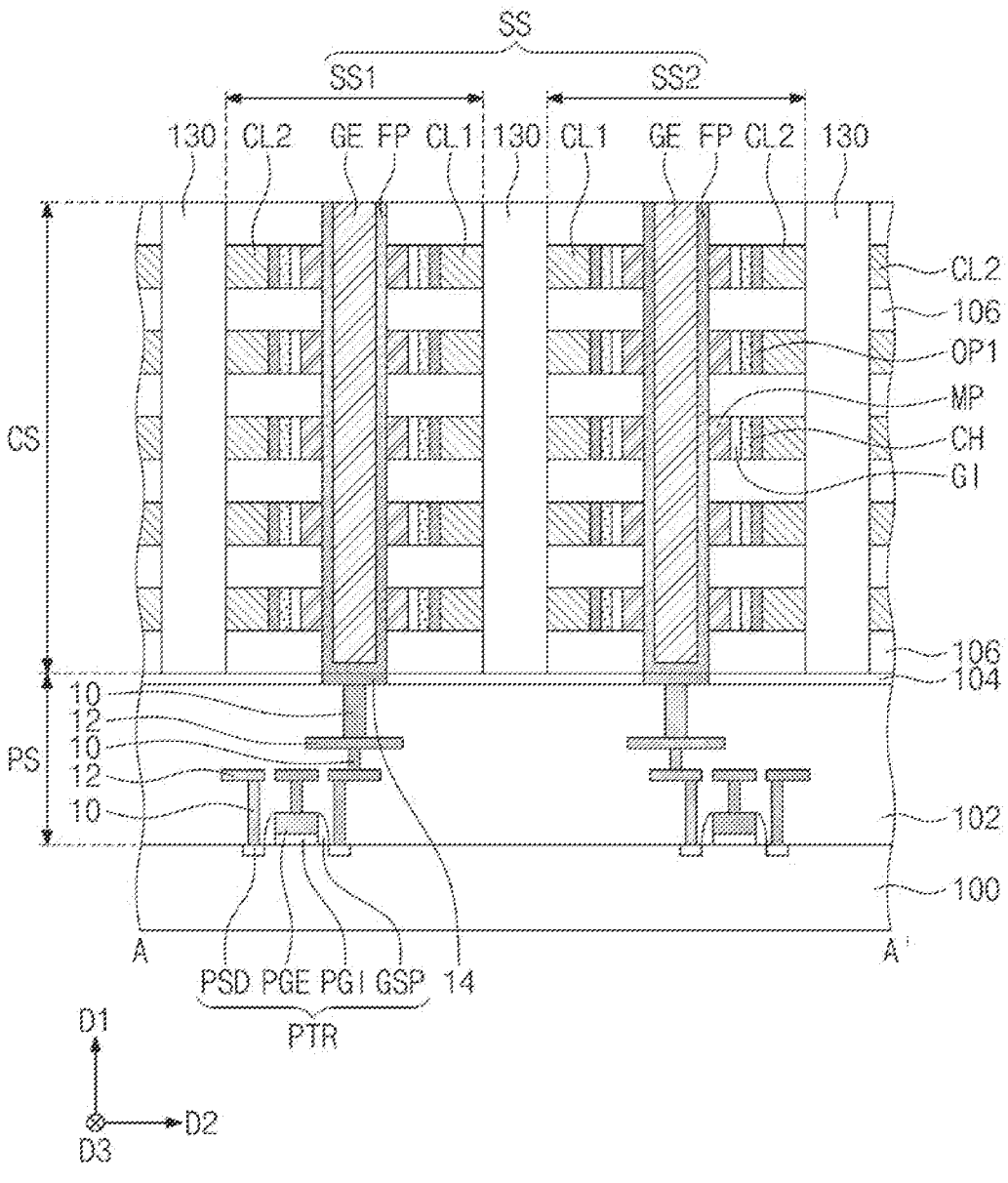

FIG. 44 is a sectional view illustrating a semiconductor device according to an example embodiment of the inventive concept. For the sake of brevity, features, which are different from the semiconductor device described with reference to FIGS. 1 to 8, will be mainly described below.

Referring to FIG. 44, a peripheral circuit structure PS and a cell structure CS may be provided on a substrate 100. The cell structure CS may include the stack SS and the sidewall insulating patterns 130 described with reference to FIGS. 1 to 8.

The peripheral circuit structure PS may include peripheral transistors PTR on the substrate 100, an interlayer insulating layer 102 covering the peripheral transistors PTR, and an etch stop layer 104 on the interlayer insulating layer 102. Each of the peripheral transistors PTR may include a peripheral gate electrode PGE on the substrate 100, a peripheral gate insulating pattern PGI between the substrate 100 and the peripheral gate electrode PGE, gate spacers GSP on opposite side surfaces of the peripheral gate electrode PGE, and peripheral source/drain regions PSD at both sides of the peripheral gate electrode PGE. The peripheral circuit structure PS may further include peripheral contacts 10 and peripheral lines 12, which are disposed in the interlayer insulating layer 102 and are connected to the peripheral source/drain regions PSD and the peripheral gate electrode PGE.

In an embodiment, the peripheral circuit structure PS may be disposed between the substrate 100 and the cell structure CS. In this case, the peripheral transistors PTR may be disposed below the stack SS of the cell structure CS and may be overlapped with the stack SS vertically (e.g., in the first direction D1). The peripheral circuit structure PS may further include peripheral pads 14, which are respectively connected to the gate electrodes GE of the stack SS. Each of the peripheral pads 14 may be provided to penetrate the etch stop layer 104 and may be connected to a corresponding one of the gate electrodes GE. The peripheral pads 14 may be electrically connected to the peripheral transistors PTR through the peripheral contacts 10 and the peripheral lines 12. The peripheral pads 14 may be formed of or include at least one of conductive materials.

Figure 45:
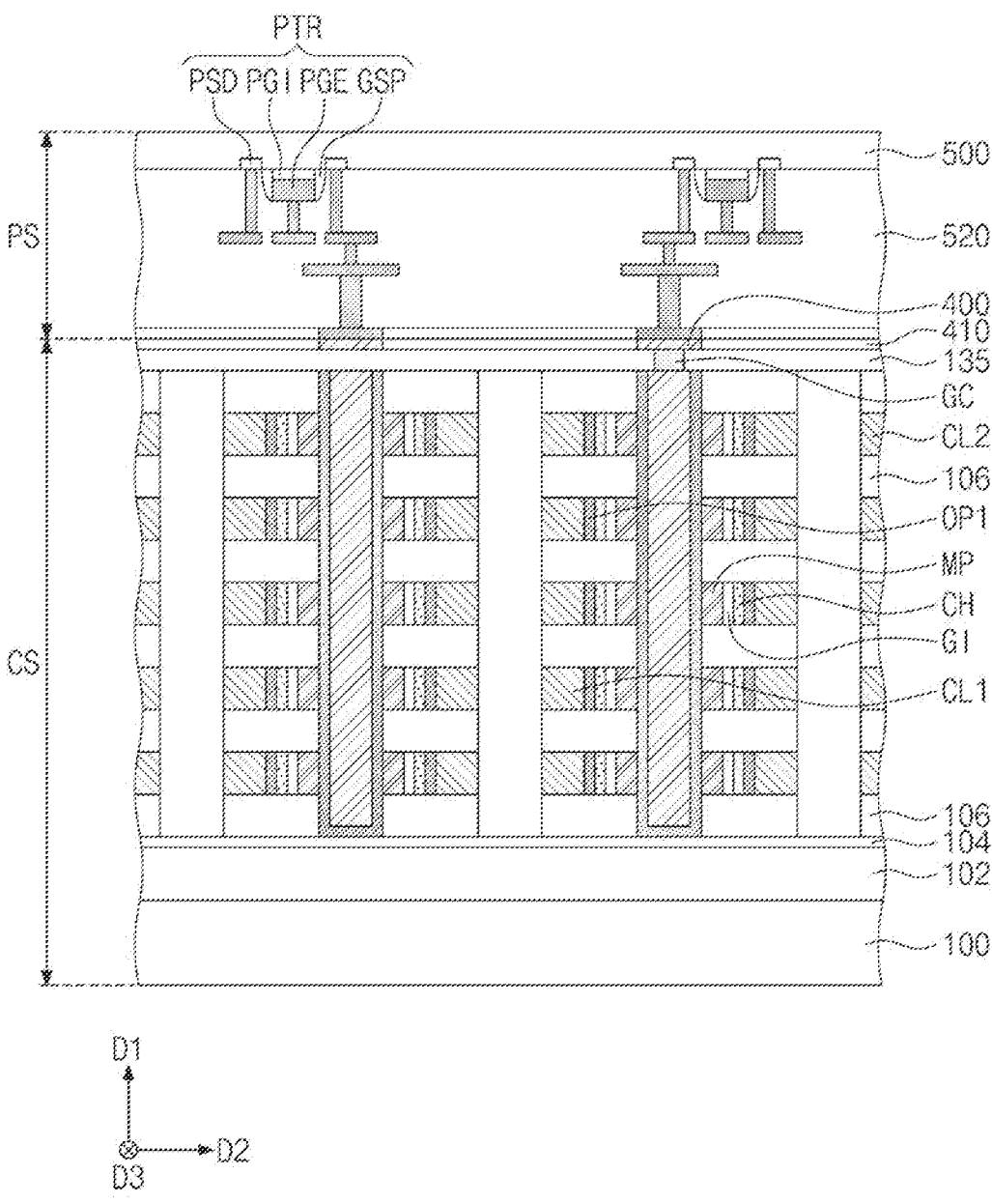

FIG. 45 is a sectional view illustrating a semiconductor device according to an example embodiment of the inventive concept. For the sake of brevity, features, which are different from the semiconductor device described with reference to FIGS. 1 to 8, will be mainly described below.

Referring to FIG. 45, the peripheral circuit structure PS may be disposed on the cell structure CS. The cell structure CS may include the substrate 100, the interlayer insulating layer 102, the etch stop layer 104, the stack SS, and the sidewall insulating patterns 130 described with reference to FIGS. 1 to 8. The substrate 100 of the cell structure CS may be referred to as a first substrate. The cell structure CS may further include the upper insulating layer 135 and a cell bonding layer 410, which are sequentially stacked on the stack SS, the gate contacts GC, which are disposed in the upper insulating layer 135, and cell pads 400, which are provided to penetrate the cell bonding layer 410. The upper insulating layer 135 and the cell bonding layer 410 may be formed of or include an insulating material, and the gate contacts GC and the cell pads 400 may be formed of or include a conductive material. The gate contacts GC may be provided to penetrate the upper insulating layer 135 and may be respectively connected to the gate electrodes GE of the stack SS. The cell pads 400 may be provided to penetrate the cell bonding layer 410 and may be connected to the gate contacts GC, respectively.

The peripheral circuit structure PS may include a second substrate 500, the peripheral transistors PTR on the second substrate 500, a peripheral insulating layer 520 covering the peripheral transistors PTR, and a peripheral bonding layer 510 on the peripheral insulating layer 520. The second substrate 500 may include a semiconductor substrate (e.g., a silicon substrate, a germanium substrate, a silicon-germanium substrate, and so forth). Each of the peripheral transistors PTR may include a peripheral gate electrode PGE on the second substrate 500, a peripheral gate insulating pattern PGI between the second substrate 500 and the peripheral gate electrode PGE, gate spacers GSP on opposite side surfaces of the peripheral gate electrode PGE, and peripheral source/drain regions PSD at both sides of the peripheral gate electrode PGE. The peripheral circuit structure PS may further include peripheral contacts 10 and peripheral lines 12, which are disposed in the peripheral insulating layer 520. The peripheral contacts 10 and the peripheral lines 12 may be connected to the peripheral source/drain regions PSD and the peripheral gate electrode PGE. The peripheral circuit structure PS may further include the peripheral pads 14 penetrating the peripheral bonding layer 510. The peripheral insulating layer 520 and the peripheral bonding layer 510 may be formed of or include an insulating material, and the peripheral contacts 10, the peripheral lines 12, and the peripheral pads 14 may be formed of or include a conductive material. The peripheral pads 14 may be electrically connected to the peripheral transistors PTR through the peripheral contacts 10 and the peripheral lines 12.

The peripheral pads 14 may be directly bonded to the cell pads 400. In an embodiment, the peripheral pads 14 and the cell pads 400 may be formed of or include copper and may be bonded to each other by a direct bonding method. The peripheral bonding layer 510 may be directly bonded to the cell bonding layer 410. The gate electrodes GE of the stack SS may be electrically connected to the peripheral transistors PTR through the gate contacts GC, the cell pads 400, the peripheral pads 14, the peripheral contacts 10, and the peripheral lines 12.

According to an embodiment of the inventive concept, first conductive lines and second conductive lines may be provided to share contact pads. Thus, it may be possible to increase an area of pads and thereby to easily form conductive contacts and to reduce the number of the conductive contacts. Accordingly, it may be possible to easily increase an integration density of a semiconductor device and improve reliability of the semiconductor device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
   first stacks and second stacks, which are alternately disposed on a substrate in a first direction parallel to a top surface of the substrate; and
   first pads and second pads connecting the first stacks to the second stacks,
   wherein each of the first and second stacks comprises:
   a gate electrode extended in a second direction perpendicular to the top surface of the substrate;

channel patterns provided to enclose a side surface of the gate electrode and spaced apart from each other in the second direction; and
   a first conductive line and a second conductive line connected to a corresponding one of the channel patterns,
   wherein the first conductive line of each of the second stacks is disposed to be adjacent to the first conductive line of each of the first stacks,
   wherein the second conductive line of each of the second stacks is disposed to be adjacent to the second conductive line of each of the first stacks,
   wherein each of the first pads is connected to the first conductive line of each of the first stacks and the first conductive line of each of the second stacks, and
   wherein each of the second pads is connected to the second conductive line of each of the first stacks and the second conductive line of each of the second stacks.

2. The semiconductor device of claim 1, wherein the first conductive line and the second conductive line are spaced apart from each other in the first direction with the corresponding one of the channel patterns interposed therebetween and are extended in a third direction, which is parallel to the top surface of the substrate and is non-parallel to the first direction.

3. The semiconductor device of claim 1, further comprising:
   a cell insulating pattern between each of the first pads and each of the second pads,
   wherein the cell insulating pattern is in contact with a side surface of a corresponding one of the first and second stacks and is extended in the second direction.

4. The semiconductor device of claim 1, further comprising:
   third conductive lines on the first and second stacks,
   wherein the gate electrode is overlapped with at least two of the third conductive lines, when viewed in a plan view.

5. The semiconductor device of claim 4,
   wherein the gate electrode of each of the first stacks is electrically connected to one of the third conductive lines, and
   wherein the gate electrode of each of the second stacks is electrically connected to another one of the third conductive lines.

6. The semiconductor device of claim 5, further comprising:
   gate contacts on the first and second stacks,
   wherein one of the gate contacts connects the gate electrode of each of the first stacks to one of the third conductive lines, and
   wherein another one of the gate contacts connects the gate electrode of each of the second stacks to another one of the third conductive lines.

7. The semiconductor device of claim 3, wherein each of the first pads and each of the second pads are in contact with at least a portion of the side surface of the corresponding one of the first and second stacks.

8. The semiconductor device of claim 1, wherein each of the first and second stacks further comprises:
   a ferroelectric pattern between each of the channel patterns and the gate electrode; and
   a gate insulating pattern between each of the channel patterns and the ferroelectric pattern.

9. The semiconductor device of claim 1, wherein each of the first and second stacks further comprises:

a first impurity pattern between the first conductive line and the corresponding one of the channel patterns; and a second impurity pattern between the second conductive line and the corresponding one of the channel patterns, wherein the first and second impurity patterns have the same conductivity type.

10. The semiconductor device of claim 1, wherein one of the first and second conductive lines is a source line, wherein the other of the first and second conductive lines is a bit line, and wherein a current flowing between the first and second conductive lines is conducted through the corresponding one of the channel patterns.

11. The semiconductor device of claim 1, further comprising conductive contacts provided on the first and second pads, respectively.

12. A semiconductor device, comprising:

a substrate including a cell array region and a pad region, which are adjacent to each other in a first direction parallel to a top surface of the substrate;

cell arrays provided on the cell array region of the substrate and spaced apart from each other in a second direction, which is parallel to a top surface of the substrate and is non-parallel to the first direction; and first pads provided on the pad region of the substrate and spaced apart from each other in a third direction perpendicular to the top surface of the substrate, wherein each of the cell arrays comprises:

a gate electrode extended in the third direction;

channel patterns, which are provided to enclose a side surface of the gate electrode and are spaced apart from each other in the third direction; and first conductive lines, which are connected to the channel patterns, respectively, and are spaced apart from each other in the third direction, wherein the first conductive lines are extended to the pad region in the first direction and are connected to the first pads, respectively, and wherein the first pads are connected in common to the first conductive lines of one of the cell arrays and the first conductive lines of another one of the cell arrays.

13. The semiconductor device of claim 12, wherein each of the cell arrays further comprises second conductive lines, which are connected to the channel patterns and are spaced apart from each other in the third direction, and wherein the second conductive lines are spaced apart from the first conductive lines in the second direction, with the channel patterns interposed therebetween.

14. The semiconductor device of claim 13, further comprising:

second pads provided on the pad region and spaced apart from each other in the third direction, wherein the second conductive lines are extended to the pad region in the first direction and are connected to the second pads, respectively, and wherein the second pads are respectively connected in common to the second conductive lines of the one of the cell arrays and the second conductive lines of the another one of the cell arrays.

15. The semiconductor device of claim 14, further comprising:

a cell insulating pattern on the pad region, wherein the cell insulating pattern is adjacent to the cell array region, and wherein the cell insulating pattern is disposed between the first pads and the second pads.

16. The semiconductor device of claim 14, wherein the first pads and the second pads are adjacent to each other in the second direction.

17. The semiconductor device of claim 12, further comprising conductive contacts disposed on the first pads, respectively.

18. The semiconductor device of claim 13, wherein one of the first and second conductive lines is a source line, and wherein the other of the first and second conductive lines is a bit line.

19. The semiconductor device of claim 12, wherein each of the cell arrays further comprises:

a ferroelectric pattern between each of the channel patterns and the gate electrode; and a gate insulating pattern between each of the channel patterns and the ferroelectric pattern.

20. A semiconductor device, comprising:

first stacks and second stacks alternately disposed on a substrate in a first direction parallel to a top surface of the substrate;

pads including first pads and second pads connecting the first stacks to the second stacks;

gate lines on the first and second stacks; and a cell insulating pattern between the first pads and the second pads, wherein each of the first and second stacks comprises:

a gate electrode extended in a second direction perpendicular to the top surface of the substrate;

channel patterns provided to enclose a side surface of the gate electrode and spaced apart from each other in the second direction;

a ferroelectric pattern between each of the channel patterns and the gate electrode;

a gate insulating pattern between each of the channel patterns and the ferroelectric pattern;

a first conductive line and a second conductive line connected to a corresponding one of the channel patterns and spaced apart from each other with the corresponding one of the channel patterns interposed therebetween; and a first insulating pattern, which is interposed between the channel patterns to enclose the side surface of the gate electrode, wherein the first conductive line of each of the second stacks is disposed to be adjacent to the first conductive line of each of the first stacks, wherein each of the first pads is connected to the first conductive line of each of the first stacks and the first conductive line of each of the second stacks, wherein each of the second pads is connected to the second conductive line of each of the first stacks and the second conductive line of each of the second stacks, wherein the cell insulating pattern is in contact with a side surface of a corresponding one of the first and second stacks and is extended in the second direction, and wherein the gate electrode is overlapped with at least two of third conductive lines, when viewed in a plan view.

* * * * *